United States Patent
Etou et al.

(10) Patent No.: US 8,497,794 B2
(45) Date of Patent: Jul. 30, 2013

(54) ANALOG-DIGITAL CONVERTER AND SIGNAL PROCESSING SYSTEM

(75) Inventors: Shinichirou Etou, Nagasaki (JP);
Yasuhide Shimizu, Nagasaki (JP);
Kouhei Kudou, Nagasaki (JP);
Yukitoshi Yamashita, Nagasaki (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 13/435,173

(22) Filed: Mar. 30, 2012

(65) Prior Publication Data

US 2012/0268302 A1    Oct. 25, 2012

(30) Foreign Application Priority Data

Apr. 20, 2011    (JP) .................. 2011-094210

(51) Int. Cl.
*H03M 1/38* (2006.01)

(52) U.S. Cl.
USPC ........... 341/161; 323/291; 323/314; 330/264; 327/534; 341/157; 341/163; 341/165; 341/169; 341/159

(58) Field of Classification Search
USPC ........... 341/118–170; 323/291, 314; 330/264; 327/534
See application file for complete search history.

(56) References Cited

U.S. PATENT DOCUMENTS

| | | | | |
|---|---|---|---|---|
| 5,677,987 A | * | 10/1997 | Seki et al. | 704/226 |
| 6,288,662 B1 | * | 9/2001 | Yoshizawa | 341/155 |
| 7,292,175 B2 | * | 11/2007 | Watanabe | 341/157 |
| 7,515,086 B2 | * | 4/2009 | Ryu | 341/161 |
| 7,649,486 B2 | * | 1/2010 | Toyomura et al. | 341/159 |
| 7,821,433 B2 | * | 10/2010 | Abe | 341/118 |
| 7,924,204 B2 | * | 4/2011 | Chang et al. | 341/161 |
| 8,390,264 B2 | * | 3/2013 | Lin | 323/314 |
| 2013/0057415 A1 | * | 3/2013 | Kim et al. | 341/20 |

FOREIGN PATENT DOCUMENTS

JP    2007-509564    4/2007

* cited by examiner

*Primary Examiner* — Lam T Mai

(74) *Attorney, Agent, or Firm* — Rader, Fishman & Grauer PLLC

(57) ABSTRACT

An AD converter includes: AD conversion stages configured to generate digital data having a value corresponding to a relationship between two analog signals being input and amplifying two analog residual signals with a first amplifier and a second amplifier with gain to be controlled to output the signals; and a gain control part configured to control gain of the first amplifier and the second amplifier on the basis of a monitoring result of the output signals of the first amplifier and the second amplifier. The first amplifier and the second amplifier are formed of open-loop amplifiers, and the gain control part takes out amplitude information of the output signals of the first amplifier and the second amplifier in at least one of the AD conversion stages and performs gain control so that amplitude of the analog signals being output from the stage converges on setting amplitude being set.

18 Claims, 30 Drawing Sheets

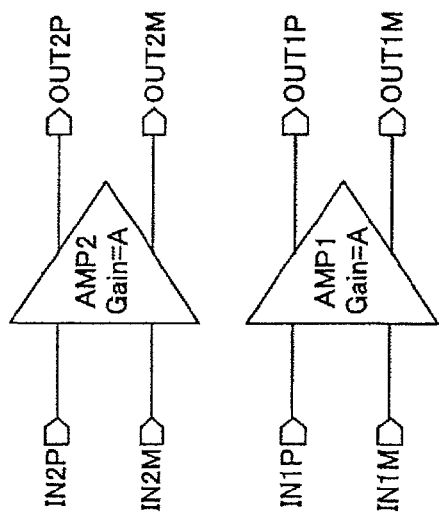
FIG.5B
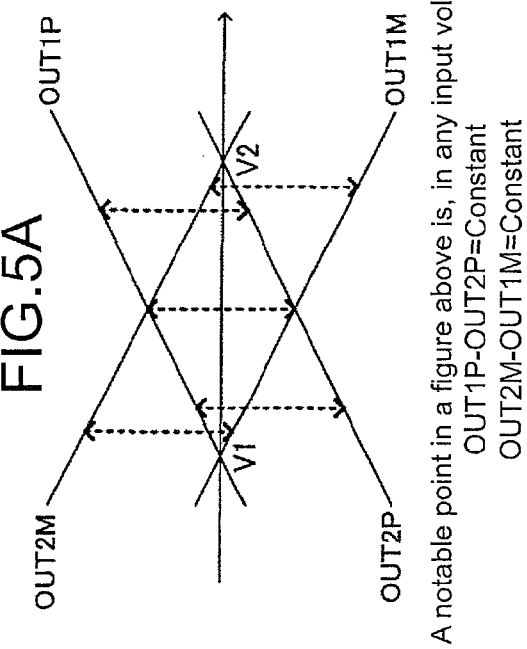
FIG.5A
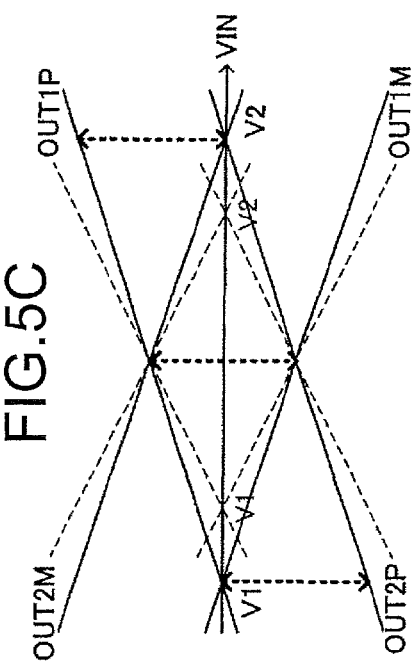
FIG.5C
FIG.5

An example of gain control in positive phase comparison

An example of gain control in differential amplitude comparison

An example of gain control in amplitude sum comparison of positive phase and reverse phase

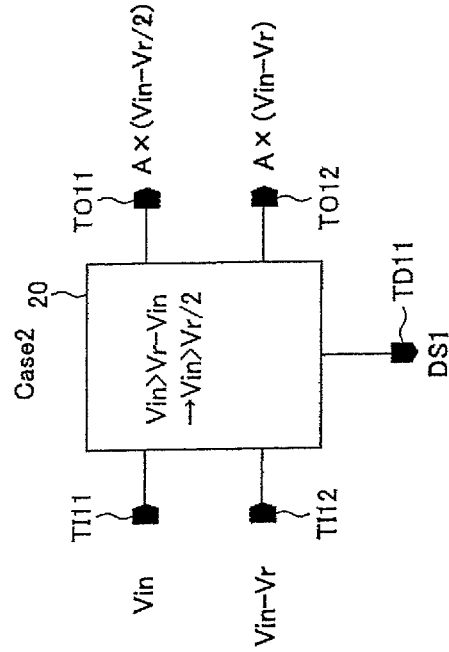
FIG. 16A
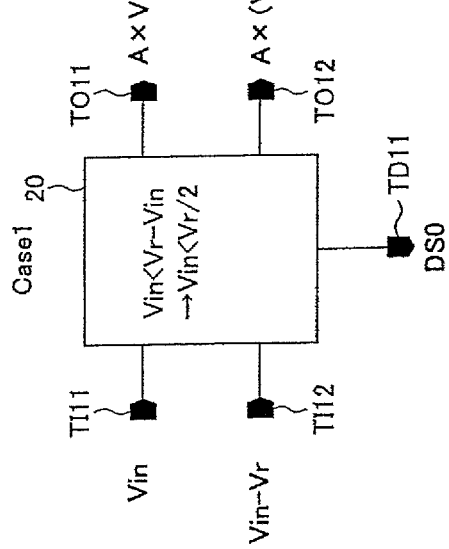
FIG. 16B
FIG. 16

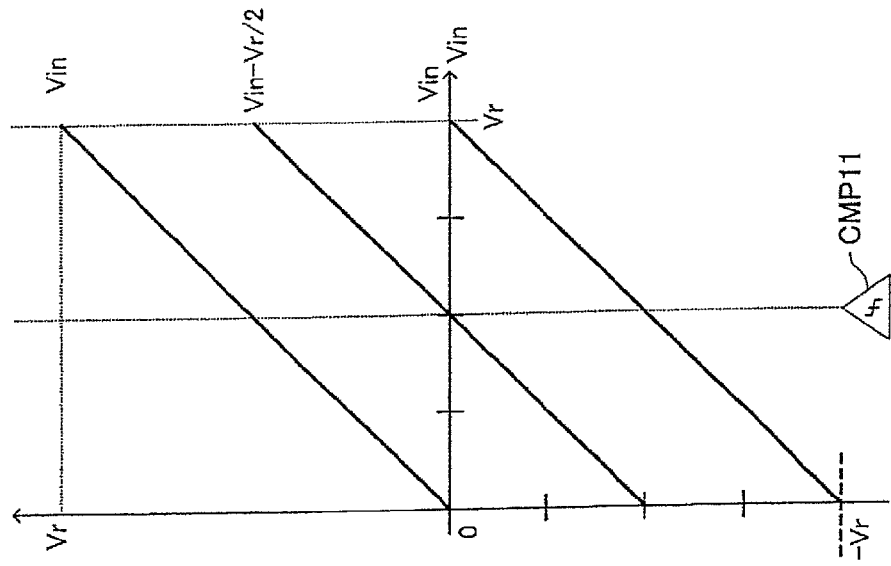
FIG.18B
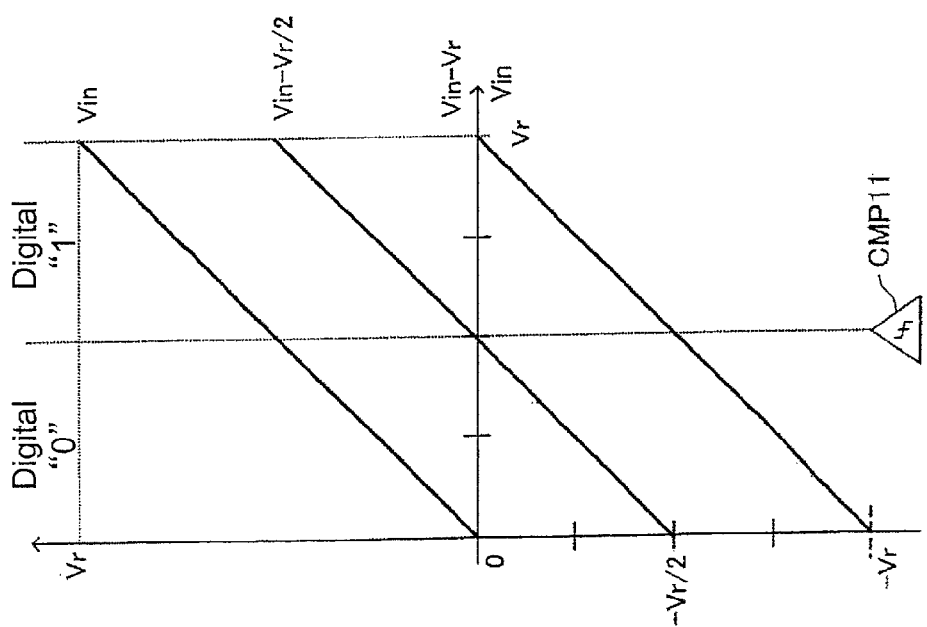
FIG.18A
FIG.18

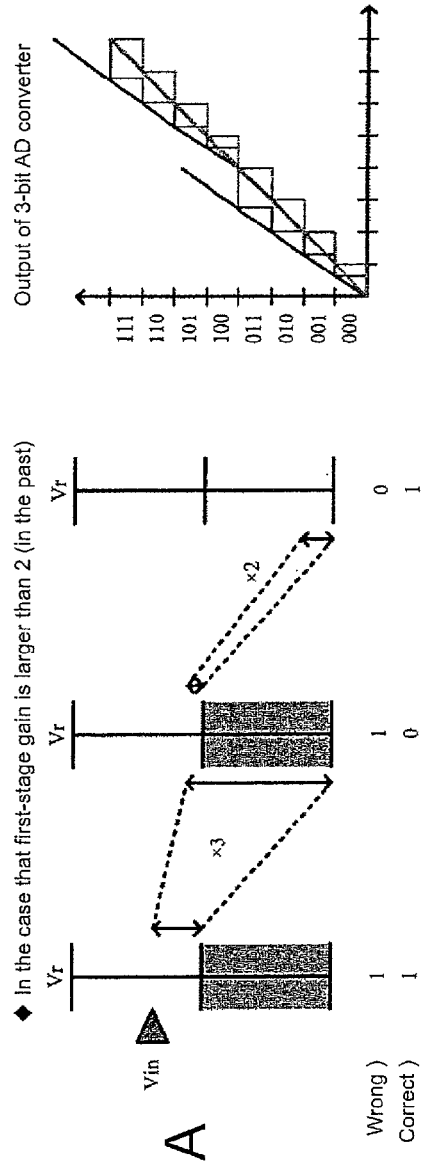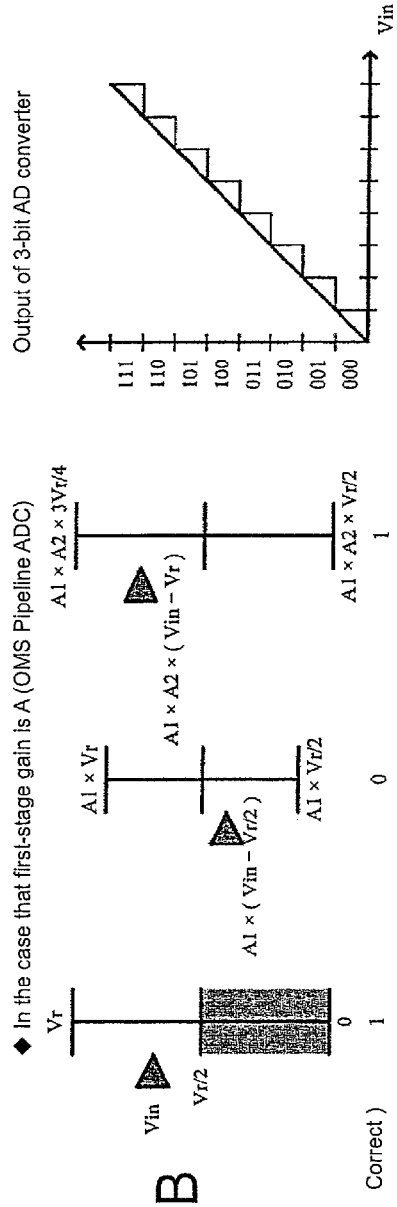
FIG.30A
FIG.30B
FIG.30

ANALOG-DIGITAL CONVERTER AND SIGNAL PROCESSING SYSTEM

BACKGROUND

The present technology relates to an analog-digital (AD) converter and a signal processing system configured to convert analog signals into digital signals.

In related art, a pipeline type has been widely used for an AD converter having sampling frequency in the vicinity of 100 MS/s and resolution being from 8 bits to 14 bits.

It is because a pipeline-type AD converter has merits described below compared to a parallel-type AD converter configured to perform N-bit processing with comparators of n-th power of 2 within 1 clock cycle at once.

That is, a pipeline-type AD converter is more widely used than a parallel-type AD converter, because of its merits such as a smaller number of comparators, no necessity of a comparator with high accuracy, and N-bit processing performed by dividing into several clock cycles.

Here, operation explanation of a pipeline AD converter will be provided with an example where a 10-bit AD converter is realized by using MDACs configured to perform 1-bit processing per one stage. An input signal is shown as Vin, and reference voltage as Vr (0<Vin<Vr).

Firstly, a first-stage MDAC samples an input signal Vin in a first clock cycle and a comparator determines whether to be Vin<Vr/2 or Vin>Vr/2.

In the case of Vin>Vr/2, subtraction is performed by the first-stage MDAC to generate a signal of (Vin−Vr/2), and an amplifier doubles the signal to output an analog residual signal (2Vin−Vr). In parallel, a digital signal 1 (MSB) is output.

In a next clock cycle, a second-stage MDAC samples the analog residual signal output (2Vin−Vr) of the first-stage MDAC and a comparator compares it with Vr/2. At this time, the first-stage MDAC samples a next analog input signal and repeats processing performed in the first clock cycle.

In the case of (2Vin−Vr>Vr/2) in the second-stage MDAC, subtraction processing of {(2Vin−Vr)−Vr/2} is performed, and an amplifier doubles it to output an analog residual signal (4Vin−3Vr). In parallel, a digital signal 1 is output.

Similar operation is repeated by serially connected MDACs to output a 10-bit digital signal in 10 clock cycles.

SUMMARY

In this system, however, operation processing should be accurately performed on analog input signals, and necessity of a closed-loop operation amplifier (operational amplifier) with high accuracy (high gain) comes up (for example, see Japanese Patent Application Publication No. 2007-509564).

With miniaturization of semiconductor process, the realization of an operational amplifier with high accuracy, which was realized in thick-film process in the past, has become difficult in submicron process, due to device characteristic deterioration of a transistor (increase in leak current, deterioration of output resistance) and the like.

Furthermore, there is a unique problem to a closed-loop amplifier, which is difficulty of high-speed operation (high sampling operation).

An open-loop operation amplifier may be applied.

A replica amplifier is generally used for gain control of an operation amplifier.

In this case, generally, gain of a replica amplifier is monitored in a method for gain control, and a control signal is fed back so as to set the gain to a setting value.

In this method, however, there is a relative variation between a replica amplifier and an operation amplifier to be controlled, and elements increase by adding a replica amplifier, which causes increase in size.

It is desirable to provide an AD converter and a signal processing system without necessity of an operation amplifier with high accuracy, being capable of low-power operation and high-speed operation, facilitating downsizing, and accurately controlling gain of an amplifier in an output stage.

An AD converter according to a first embodiment of the present technology includes a plurality of cascade-connected analog-digital (AD) conversion stages configured to generate digital data having a value corresponding to a relationship between two analog signals being input and amplify two analog residual signals with a first amplifier and a second amplifier respectively with gain to be controlled to output the signals, and a gain control part configured to monitor the output signals of the first amplifier and the second amplifier to control gain of the first amplifier and the second amplifier on the basis of a monitoring result. The first amplifier and the second amplifier are formed of open-loop amplifiers, and the gain control part takes out amplitude information of the output signals of the first amplifier and the second amplifier in at least one of the AD conversion stages and performs gain control so that amplitude of the analog signals being output from the stage converges on setting amplitude being set.

A signal processing system according to a second embodiment of the present technology includes an analog-digital (AD) converter configured to convert analog signals from an analog signal processing system into digital signals. The AD converter includes a plurality of cascade-connected analog-digital (AD) conversion stages configured to generate digital data having a value corresponding to a relationship between two analog signals being input and amplify two analog residual signals with a first amplifier and a second amplifier respectively with gain to be controlled to output the signals, and a gain control part configured to monitor the output signals of the first amplifier and the second amplifier to control gain of the first amplifier and the second amplifier on the basis of a monitoring result. The first amplifier and the second amplifier are formed of open-loop amplifiers, and the gain control part takes out amplitude information of the output signals of the first amplifier and the second amplifier in at least one of the AD conversion stages and performs gain control so that amplitude of the analog signals being output from the stage converges on setting amplitude being set.

According to the present technology, an AD converter may be realized without necessity of an operation amplifier with high accuracy, being capable of low-power operation and high-speed operation and facilitating downsizing.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 5 are diagrams explaining a principle of gain control of an amplifier according to the embodiment;

FIG. 16 are diagrams showing a residual signal and a digital signal being output on the basis of a comparison result of a comparison part in an AD conversion stage in FIG. 2 for respective cases;

FIG. 18 are diagrams explaining a basic concept of operation of a 1-bit AD conversion stage in FIG. 17;

FIG. 30 are diagrams showing an effect of the embodiment by comparison to a comparison example;

DETAILED DESCRIPTION OF EMBODIMENTS

Figure 1:
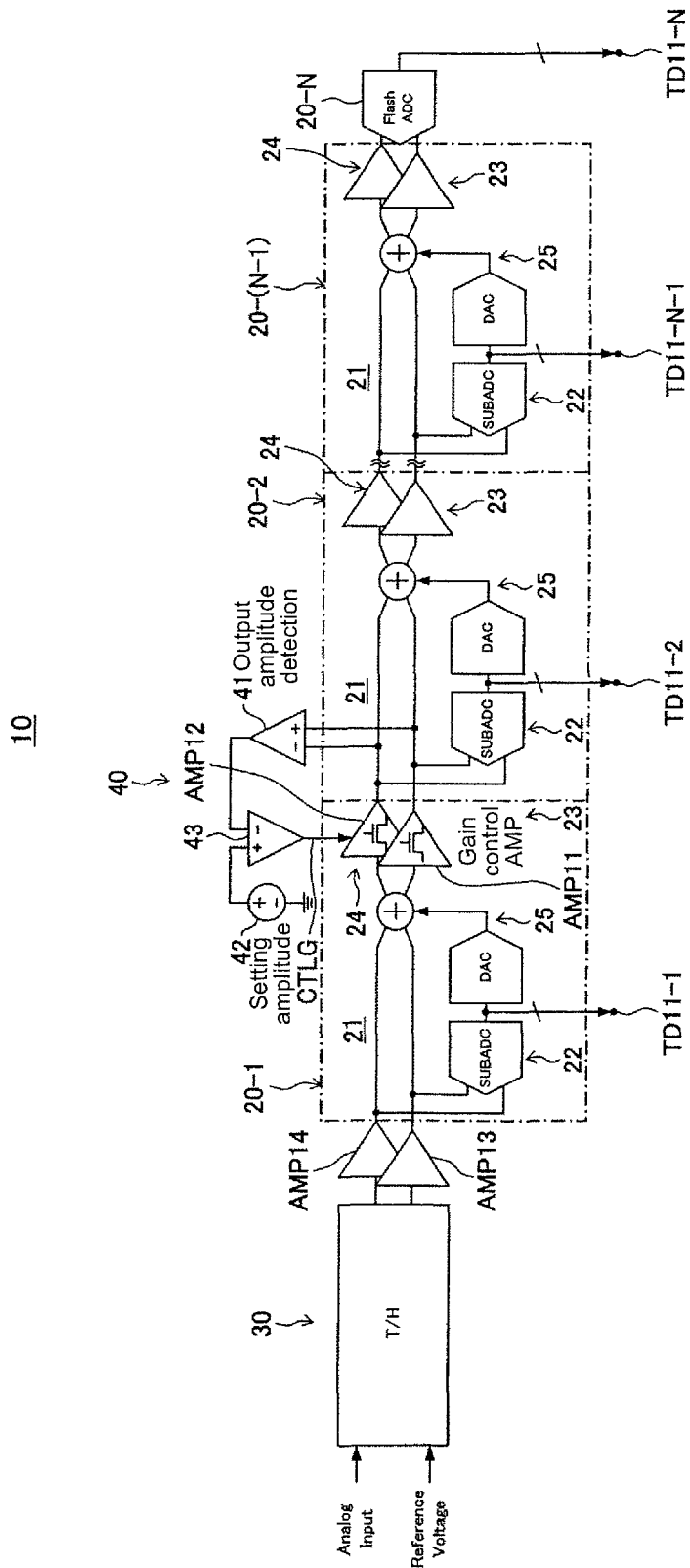
FIG. 1 is a block diagram showing a structure example of an N-bit AD converter according to a first embodiment.

Hereinafter, embodiments of the present technology will be described with reference to the drawings.

The explanation will be provided in following order.
1. A structure example of an N-bit AD converter
2. Gain control of an amplifier
2.1 A structure example of a gain control part corresponding to a first control method
2.2 A structure example of a gain control part corresponding to a second control method
2.3 A structure example of a gain control part corresponding to a third control method
3. A specific structure example of AD conversion stages
4. A structure example of a signal processing system
1. A Structure Example of an N-Bit AD Converter FIG. 1 is a block diagram showing a structure example of an N-bit AD converter according to a first embodiment.

Figure 2:
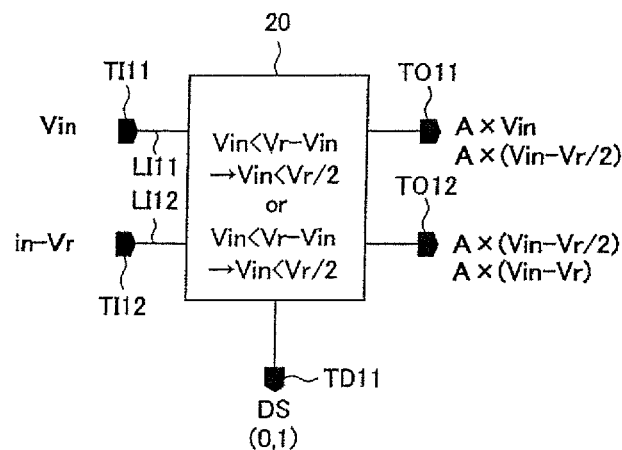
FIG. 2 is a block diagram showing a basic structure example of respective AD conversion stages in an N-bit AD converter according to the embodiment.

FIG. 2 is a block diagram showing a basic structure example of respective AD conversion stages in an N-bit AD converter according to an embodiment.

In the embodiment, an open-loop pipeline-type AD converter 10 is formed by using an open-loop amplifier and an open loop capacitor operation.

The N-bit AD converter 10 in FIG. 1 includes a plurality of (N−1) AD conversion stages 20-1 to 20-(N−1), a final-stage (N-th stage) AD conversion stage 20-N, an analog signal generation stage 30, and a gain control part 40.

The respective AD conversion stages 20 (-1 to -N) include a first analog signal input terminal TI11, a second analog signal input terminal TI12, and a digital data output terminal TD11.

The AD conversion stages 20 (-1 to -N) further include a first analog signal output terminal TO11, and a second analog signal output terminal TO12.

The respective AD conversion stages 20 (-1 to N−1) generate digital data having a value corresponding to a relationship between two analog signals being input to output two analog residual signals.

The respective AD conversion stages 20 (-1 to N−1) include a signal generation part 21, a comparison part 22, a first output part 23, a second output part 24, and a switch part 25. A detailed description will be provided on a specific structure of each of these parts after explanation of the gain control part 40.

The final-stage AD conversion stage 20-N is formed of, for example, a flash AD converter, and may be formed by arranging only the comparison part 22 to output an N-th bit.

In the respective AD conversion stages 20 (-1 to N-1), the first output part 23 includes a first amplifier (amp) AMP11, and the second output part 24 includes a second amplifier (amp) AMP12.

The first amplifier AMP11 and the second amplifier AMP12 are formed of so-called open-loop amplifiers.

In the respective AD conversion stages 20 (-1 to -N-1), main line signals of the first amplifier AMP11 and the second amplifier AMP12 perform operation for transmission to a subsequent stage by interpolation (for example, capacity interpolation) with two inputs.

The AD converter 10 in FIG. 1 is cascade-connected to the analog signal generation stage 30 and the plurality of (N) AD conversion stages 20-1 to 20-N.

The analog signal generation stage 30 generates a first analog signal Vin and a second analog signal (Vin−Vr) in an input stage of the first-stage AD conversion stage 20-1.

The analog signal generation stage 30 is formed as a comparison amplification circuit with a T/H (track and hold) function.

A description will be provided on a specific structure of the analog signal generation stage 30 afterward.

The first analog signal input terminal TI11 in the AD conversion stage 20-$m$ ($2 \leq m \leq N$) on a subsequent-stage side is connected to the first analog signal output terminal TO11 in the AD conversion stage 20-($m$−1) on a preceding-stage side. The AD conversion stage 20-$m$ on a subsequent-stage side inputs a first residual signal being output from the preceding-stage AD conversion stage 20-($m$−1) as a first analog signal.

The second analog signal input terminal TI12 in the AD conversion stage 20-$m$ on a subsequent-stage side is connected to the second analog signal output terminal TO12 in the AD conversion stage 20-($m$−1) on a preceding-stage side. The AD conversion stage 20-$m$ on a subsequent-stage side inputs a second residual signal being output from the preceding-stage AD conversion stage 20-($m$−1) as a second analog signal.

That is, the preceding-stage AD conversion stage 20-($m$−1) includes the first amplifier AMP11 and the second amplifier AMP12 in output stages of the first residual signal and the second residual signal that are analog signals to the next-stage AD conversion stage 20-$m$.

The AD conversion stage 20-($m$−1) outputs a first residual signal with predetermined gain (amplification ratio) from the first amplifier AMP11, and a second residual signal with predetermined gain (amplification ratio) from the second amplifier AMP12.

In the first-stage AD conversion stage 20-1, the first analog signal input terminal TI11 inputs a first analog signal Vin having a voltage value between reference voltage in the analog signal generation stage 30 and full range voltage.

In the first-stage AD conversion stage 20-1, the second analog signal input terminal TI12 inputs a second analog signal (Vin−Vr) having a voltage value corresponding to a difference between a voltage value of a first analog signal being input to the first analog signal input terminal and full range voltage.

That is, the AD conversion stage 20-1 inputs a first analog signal Vin having a voltage value (Vin) from the first analog signal input terminal TI11.

In parallel, the AD conversion stage 20-1 inputs a second analog signal (Vin−Vr) having a value (Vin−Vr) calculated by subtracting difference voltage Vr of reference voltage from input voltage Vin, from the second analog signal input terminal TI12.

The analog signal generation stage 30 includes a third amplifier AMP13 and a fourth amplifier AMP14 in an output stage of an analog signal to the first-stage AD conversion stage 20-1.

The analog signal generation stage 30 outputs a first analog signal Vin from the third amplifier AMP13, and a second analog signal (Vin−Vr) from the fourth amplifier AMP14.

In the respective AD conversion stages 20 (-1 to N-1), the signal generation part 21 generates at least one third analog signal having an intermediate voltage value generated by a voltage value of a first analog signal and a voltage value of a second analog signal.

The signal generation part 21 outputs a first analog signal and a second analog signal to the comparison part 22, and outputs a first analog signal, a second analog signal, and a third analog signal to the switch part 25.

The comparison part 22 inputs a first analog signal and a second analog signal, and compares the voltage value of the first analog signal with the voltage value of the second analog signal to output digital data having a value corresponding to a comparison result to the digital data output terminal TD11.

The comparison part 22 outputs first digital data, when a first comparison result is obtained where the voltage value of the first analog signal is lower than the voltage value of the second analog signal. The comparison part 22 outputs second digital data, when a second comparison result is obtained where the voltage value of the first analog signal is higher than the voltage value of the second analog signal.

The first amplifier AMP11 of the first output part 23 amplifies a first residual signal by the switch part 25 with predetermined gain (amplification ratio) to output the signal.

The second amplifier AMP12 of the second output part 24 amplifies a second residual signal by the switch part 25 with predetermined gain (amplification ratio) to output the signal.

The switch part 25 switches input of a first analog signal, a second analog signal, and a third analog signal that are output from the signal generation part 21, to the first output part 23 and the second output part 24 on the basis of a comparison result of the comparison part 22.

When a first comparison result is obtained in the comparison part, the switch part 25 inputs a first analog signal being output from the signal generation part 21 to the first output part 23 as a first residual signal, and inputs a third analog signal to the second output part 24 as a second residual signal.

When a second comparison result is obtained in the comparison part, the switch part 25 inputs a third analog signal being output from the signal generation part 21 to the first output part 23 as a first residual signal, and inputs a second analog signal to the second output part 24 as a second residual signal.

A detailed description will be provided on a specific structure and functions of the AD conversion stages 20 (-1 to N-1) after explanation of a structure and functions of a gain control part.

2. Gain Control of an Amplifier

As mentioned above, in the AD converter 10 according to the embodiment, the analog signal generation stage 30 includes the third amplifier AMP13 and the fourth amplifier AMP14 in an output stage of an analog signal to the first-stage AD conversion stage 20-1.

In the respective AD conversion stages 20 (-1 to N-1), the first amplifier AMP11 and the second amplifier AMP12 are included in output stages of a first residual signal and a second residual signal that are analog signals to the next-stage AD conversion stage 20-*m*.

In the AD converter 10 as one system, the gain control part 40 is included for controlling gain of the first amplifier AMP11 and the second amplifier AMP12, and the third amplifier AMP13 and the fourth amplifier AMP14 without a replica circuit.

It is favorable that gain control is performed by the gain control part 40 while monitoring output signal amplitude of all amplifiers.

As in the first embodiment, however, gain control of the first amplifier AMP11 and the second amplifier AMP12 may be performed while monitoring output of the first amplifier AMP11 and the second amplifier AMP12 in, for example, one AD conversion stage 20-2.

Furthermore, gain control of the third amplifier AMP13 and the fourth amplifier AMP14 may be performed while monitoring output of the first amplifier AMP11 and the second amplifier AMP12 in, for example, an AD conversion stage 20-(N−1) which is one-stage preceding a final stage.

In the first embodiment, as shown in FIG. 1, an example is provided where output of the first amplifier AMP11 and the second amplifier AMP12 is monitored in the AD conversion stage 20-2 to control gain of the first amplifier AMP11 and the second amplifier AMP12.

A Structure Example of an Amplifier

Firstly, a description will be provided on a structure example of the first amplifier AMP11 and the second amplifier AMP12 that are gain control objects.

Figure 3:
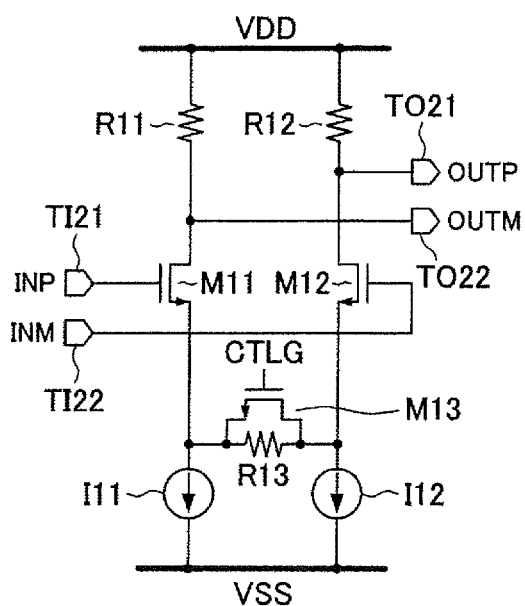
FIG. 3 is a circuit diagram showing a structure example of an amplifier that is capable of gain control and is applied to an AD converter according to the embodiment.

FIG. 3 is a circuit diagram showing a structure example of an amplifier capable of gain control applied to an AD converter according to the embodiment.

The amplifier AMP11 (12, 13, and 14) is shown as a circuit structure corresponding to a differential.

The amplifier AMP11 in FIG. 3 includes an n-channel field effect transistors (NMOS transistors) M11, M12, and M13 that form a differential pair, current sources I11 and I12, resistances R11, R12, and R13, input terminals TI21 and TI22, and output terminals TO21 and TO22.

The resistances R11 and R12 function as load resistances and are connected with power source potential VDD in drains of the NMOS transistors M11 and M12 respectively.

The current sources I11 and I12 are connected to sources of the NMOS transistors M11 and M12 respectively.

The resistance R13 is connected between sources of the NMOS transistors M11 and M12, and a source and a drain of the NMOS transistor M13 are connected to either end of the resistance R13 respectively.

A gate of the NMOS transistor M13 is connected to a supply line of a gain control signal CTLG generated by the gain control part 40.

As described above, the amplifier AMP11 performs gain control by controlling gate voltage of the NMOS transistor M13 connected between sources of the NMOS transistors M11 and M12 that form a differential pair.

In the embodiment, gain of the first amplifier AMP11 and the second amplifier AMP12 is controlled by the gain control part 40. The gain control part 40 performs gain control without a replica circuit by receiving output of the first amplifier AMP11 and the second amplifier AMP12 that are open-loop amplifiers to calculate gain of the amplifiers.

The gain control part 40 in FIG. 1 includes an output amplitude detection part 41, a reference amplitude setting part 42, and an amplitude control part 43.

The output amplitude detection part 41 detects output amplitude from output of the first amplifier AMP11 and output of the second amplifier AMP12.

The amplitude control part 43 generates a gain control signal CTLG so that output amplitude detected by the output amplitude detection part 41 converges on reference amplitude being set by the reference amplitude setting part 42.

The amplitude control part 43 outputs the generated gain control signal CTLG to the first amplifier AMP11 and the second amplifier AMP12.

As described above, in the embodiment, gain of the first amplifier AMP11 and the second amplifier AMP12 is controlled in a predetermined AD conversion stage.

Hereinafter, a description will be provided on a reason why to perform gain control and a specific control method.

A Reason why to Perform Gain Control of an Amplifier

Figure 4:
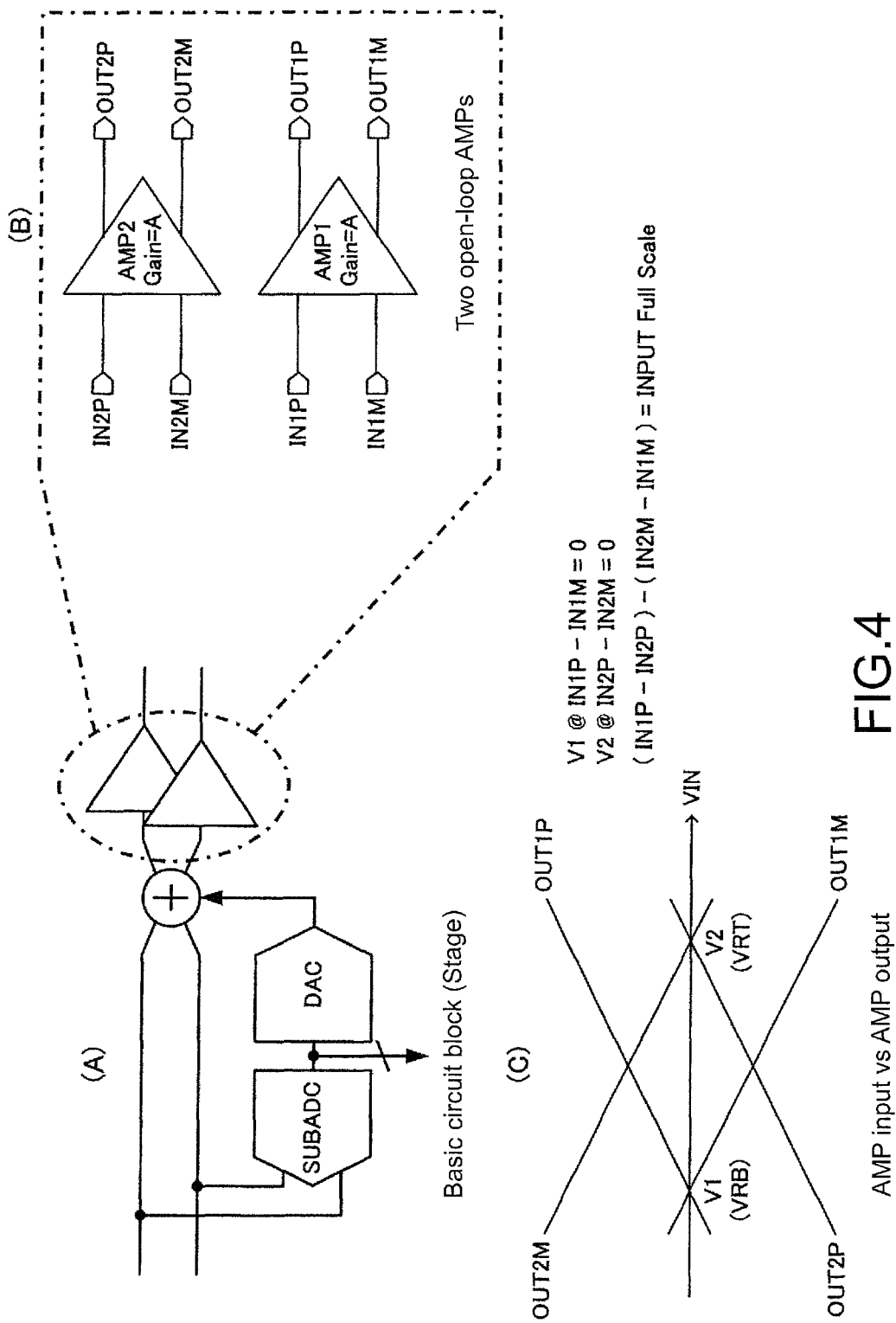
FIG. 4 is a diagram showing a relationship between an input signal and an output signal of two amplifiers.

The sections (A) to (C) in FIG. 4 are diagrams showing a relationship between an input signal and an output signal of two amplifiers (AMP11 and AMP12).

The section (A) in FIG. 4 shows a basic structure of an AD conversion stage. The section (B) in FIG. 4 shows correspondence of an input signal and an output signal of two open-loop AMPs. The section (C) in FIG. 4 shows a relationship between input and output.

In the example in FIG. 4, the input of the first amplifier AMP11 is IN1P and IN1M, and the output is OUT1P and OUT1M.

The input of the second amplifier AMP12 is IN2P and IN2M, and the output is OUT2P and OUT2M.

The voltage V1 in the section (C) in FIG. 4 is given as (IN1P−IN1M=0), and V2 is (IN2P−IN2M=0).

Therefore, input full scale IFS is given as (INPUT Full Scale)=(IN1P−IN1M=0)−(IN2P−IN2M=0).

The input full scale IFS is determined by accumulation gain accumulated until input of the first amplifier AMP11 and the second amplifier AMP12. Without control, the IFS significantly varies and an upper limit is generated in a multistage structure.

Therefore, gain of the first amplifier AMP11 and the second amplifier AMP12 is controlled in the embodiment.

A Principle of Gain Control

FIGS. 5A to 5C are diagrams explaining a principle of gain control of amplifiers (AMP11 and AMP12) according to the embodiment.

FIG. 5A shows constant output in any input voltages. FIG. 5B shows correspondence of an input signal and an output signal of two open-loop AMPs. FIG. 5C shows output range capable of being constant regardless of input full scale.

In the respective AD conversion stages 20 (-1 to −N−1) according to the embodiment, main line signals of the first amplifier AMP11 and the second amplifier AMP12 perform operation for transmission to a subsequent stage by interpolation (for example, capacity interpolation) with two inputs.

Therefore, two input/output relationships between the first amplifier AMP11 and the second amplifier AMP12 are as shown in FIGS. 5A and 5B.

As shown in FIG. 5A, an amplitude difference of a positive phase (reverse phase) of the first amplifier AMP11 and the second amplifier AMP12 becomes constant regardless of an input signal.

It means, for example, when a difference between positive phases or reverse phases of the first amplifier AMP11 and the second amplifier AMP12 is controlled to be setting amplitude, output range is capable of being constant regardless of input full scale.

As a result, as shown in the embodiment, AD conversion stages that structure an open-loop MDAC stage pipeline-type AD converter may be formed as a multi-stage structure, and also high resolution may be provided.

In the open-loop MDAC stage pipeline-type AD converter 10, as a control method of taking out amplitude information not depending on input from signals of two inputs and controlling the amplitude to be constant, mainly three methods below are illustrated.

Figure 6:
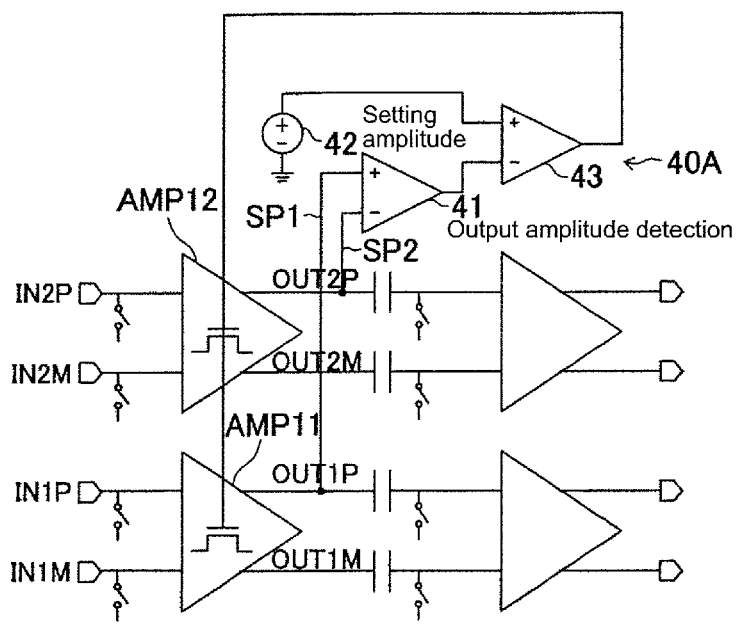
FIG. 6 is a diagram showing a structure example of a gain control part that applies a first control method of taking out a difference between positive phase signals (reverse phase signals) and comparing it with desired amplitude information to control gain of two amplifiers.

In a first control method, a difference between positive phase signals (reverse phase signals) is taken out and compared with desired amplitude information to control gain of the AMP (FIG. 6).

Figure 7:
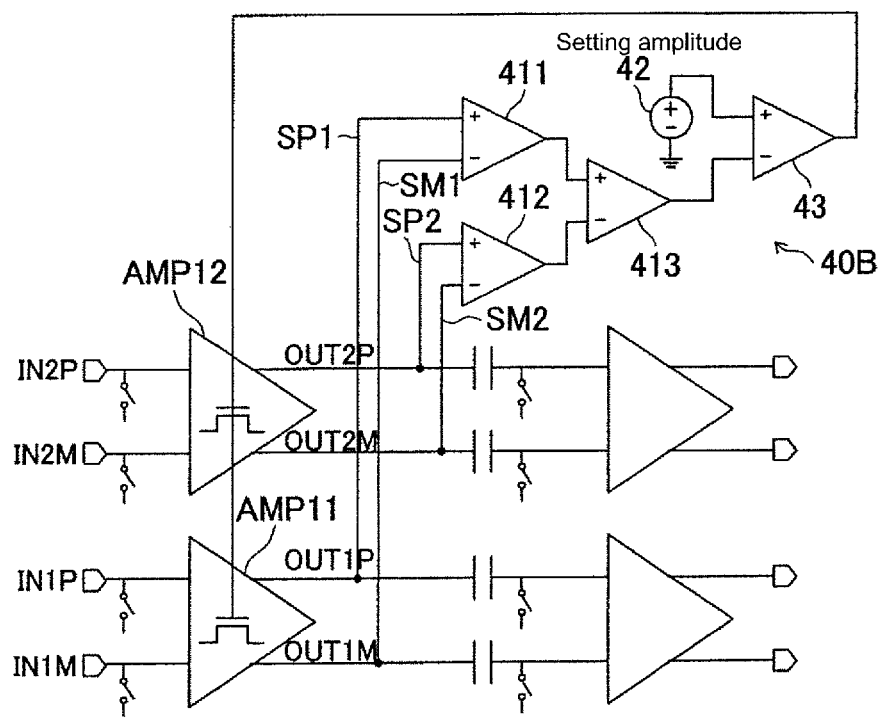
FIG. 7 is a diagram showing a structure example of a gain control part that applies a second control method of taking out differential signal components of two amplifiers and comparing a sum of differential amplitude being taken out with desired amplitude information to control gain of two amplifiers.

In a second control method, differential signal components of the respective amplifiers AMP11 and AMP12 are taken out, and a sum of the taken differential amplitude is compared with desired amplitude information to control gain of the amplifiers AMP11 and AMP12 (FIG. 7).

Figure 8:
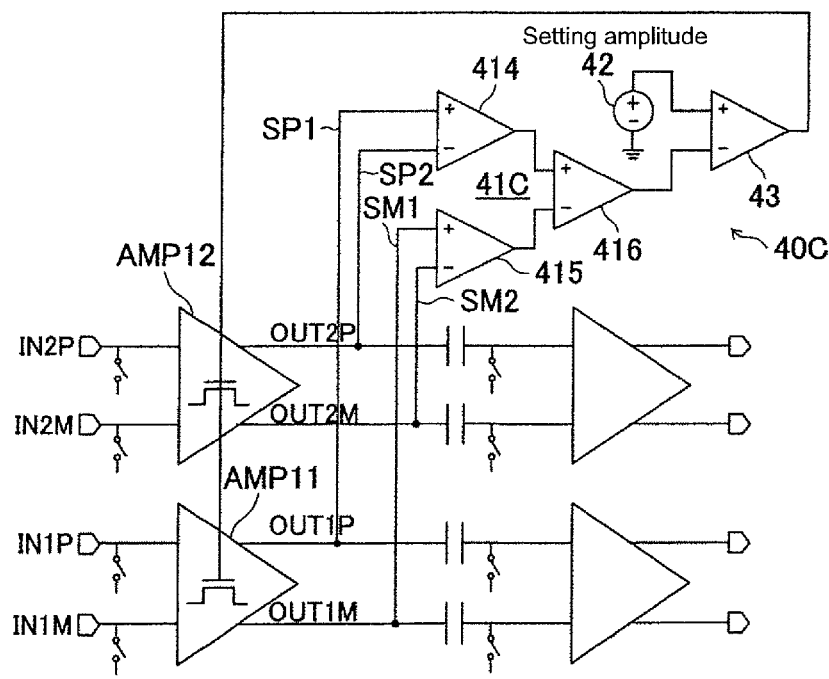
FIG. 8 is a diagram showing a structure example of a gain control part that applies a third control method of taking out a difference between positive phase signals and a difference between reverse phase signals and comparing an average thereof with desired amplitude information to control gain of two amplifiers.

In a third control method, a difference between positive phase signals and a difference between reverse phase signals are taken out, and an average thereof is compared with desired amplitude information to control gain of two amplifiers AMP11 and AMP12 (FIG. 8).

2.1 A Structure Example of a Gain Control Part Corresponding to a First Control Method FIG. 6 is a diagram showing a structure example of a gain control part applying a first control method of taking out a difference between positive phase signals (reverse phase signals) and comparing it with desired amplitude information to control gain of two amplifiers (AMP11 and AMP12).

A gain control part 40A in FIG. 6 basically has a structure similar to that shown in FIG. 1.

In an example in FIG. 6, a difference between a positive phase signal SP1 of the first amplifier AMP11 and a positive phase signal SP2 of the second amplifier AMP12 is taken out by the output amplitude detection part 41 as amplitude information.

Then, in the amplitude control part 43, a gain control signal CTLG is generated so that output amplitude detected by the output amplitude detection part 41 converges on reference amplitude being set by the reference amplitude setting part 42 to control gain of the first amplifier AMP11 and the second amplifier AMP12.

Also, the amplitude may be controlled by taking out a difference between reverse phases as amplitude information.

2.2 A Structure Example of a Gain Control Part Corresponding to a Second Control Method FIG. 7 is a diagram showing a structure example of a gain control part applying a second control method of taking out differential signal components of two amplifiers (AMP11 and AMP12) and comparing a sum of differential amplitude being taken out with desired amplitude information to control gain of two amplifiers.

In a gain control part 40B in FIG. 7, an output amplitude detection part 41B includes an operational amplifier 411 configured to detect differential amplitude between a positive phase signal SP1 and a reverse phase signal SM1 of the first amplifier AMP11.

The output amplitude detection part 41B includes an operational amplifier 412 configured to detect differential amplitude between a positive phase signal SP2 and a reverse phase signal SM2 of the second amplifier AMP12.

Also, the output amplitude detection part 41B includes an operational amplifier 413 configured to take out a sum of differential amplitude information of the operational amplifier 411 and differential amplitude information of the operational amplifier 412 as amplitude information.

In the amplitude control part 43, a gain control signal CTLG is generated so that output amplitude detected by the output amplitude detection part 41B converges on reference amplitude being set by the reference amplitude setting part 42 to control gain of the first amplifier AMP11 and the second amplifier AMP12.

2.3 A Structure Example of a Gain Control Part Corresponding to a Third Control Method FIG. 8 is a diagram showing a structure example of a gain control part applying a third control method of taking out a difference between positive phase signals and a difference between reverse phase signals and comparing an average thereof with desired amplitude information to control gain of two amplifiers AMP11 and AMP12.

In a gain control part 40C in FIG. 8, an output amplitude detection part 41C includes an operational amplifier 414 configured to detect differential amplitude between a positive phase signal SP1 of the first amplifier AMP11 and a positive phase signal SP2 of the second amplifier AMP12.

The output amplitude detection part 41C includes an operational amplifier 415 configured to detect differential amplitude between a reverse phase signal SM1 of the first amplifier AMP11 and a reverse phase signal SM2 of the second amplifier AMP12.

Also, the output amplitude detection part 41C includes an operational amplifier 416 configured to take out a sum of differential amplitude information of the operational amplifier 414 and differential amplitude information of the operational amplifier 415 as amplitude information.

In the amplitude control part 43, a gain control signal CTLG is generated so that output amplitude detected by the output amplitude detection part 41C converges on reference amplitude being set by the reference amplitude setting part 42 to control gain of the first amplifier AMP11 and the second amplifier AMP12.

In the AD converter 10 according to the embodiment, amplitude information not depending on input is taken out from signals of two inputs to control gain of two amplifiers so that the amplitude is constant. It provides the effects described below.

According to the embodiment, an amplifier AMP becomes distorted with gain becoming larger, while S/N deteriorates with gain becoming smaller. Controlling gain reduces the distortion and S/N deterioration.

Currently, both a replica circuit and a control circuit are necessary, but this system may be structured with only a control circuit because main line signals are monitored, and it helps an area to be reduced.

Furthermore, since no replica circuit is used, a relative error does not occur between a replica circuit and a main line amplifier AMP, and accurate control may be performed.

In the embodiment described above, output of the first amplifier AMP11 and the second amplifier AMP12 is monitored in one AD-conversion stage 20-2 to perform gain control of the first amplifier AMP11 and the second amplifier AMP12.

The embodiment is not limited to the structure in FIG. 1.

Figure 9:
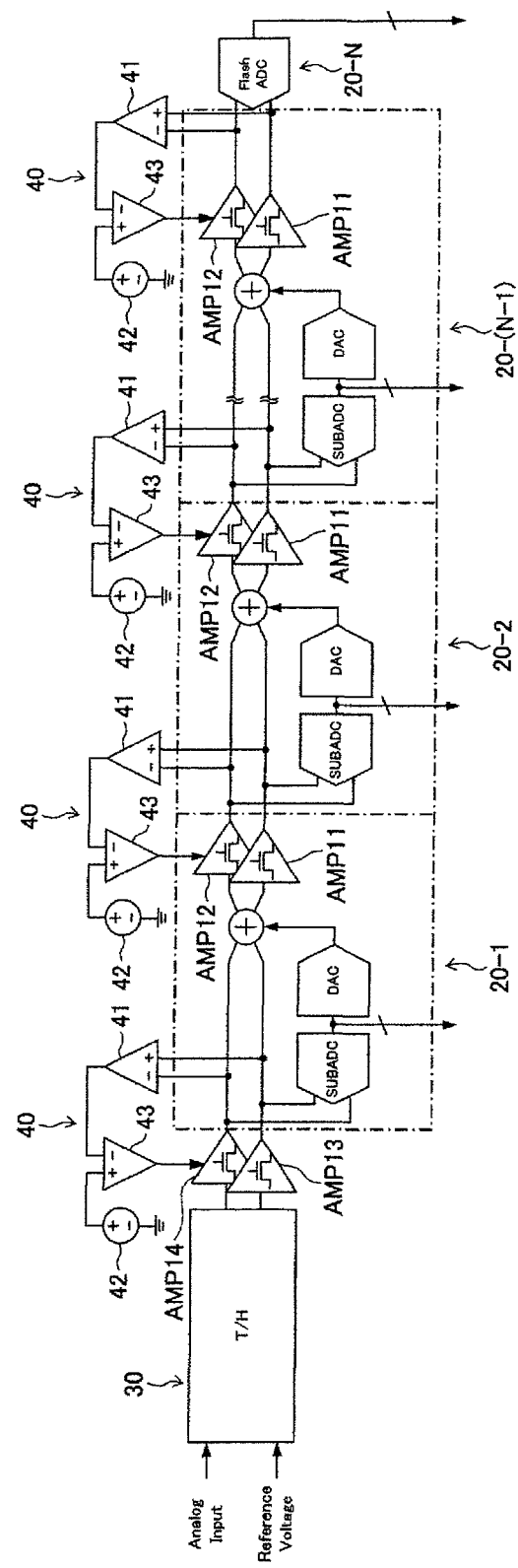
FIG. 9 is a diagram showing a structure example where output of two amplifiers is monitored in all AD conversion stages to perform gain control.

As shown in FIG. 9, for example, output of the first amplifier AMP11 and the second amplifier AMP12 may be monitored in all AD conversion stages 20-2 to perform gain control of the first and second amplifiers AMP11 and AMP12.

Figure 10:
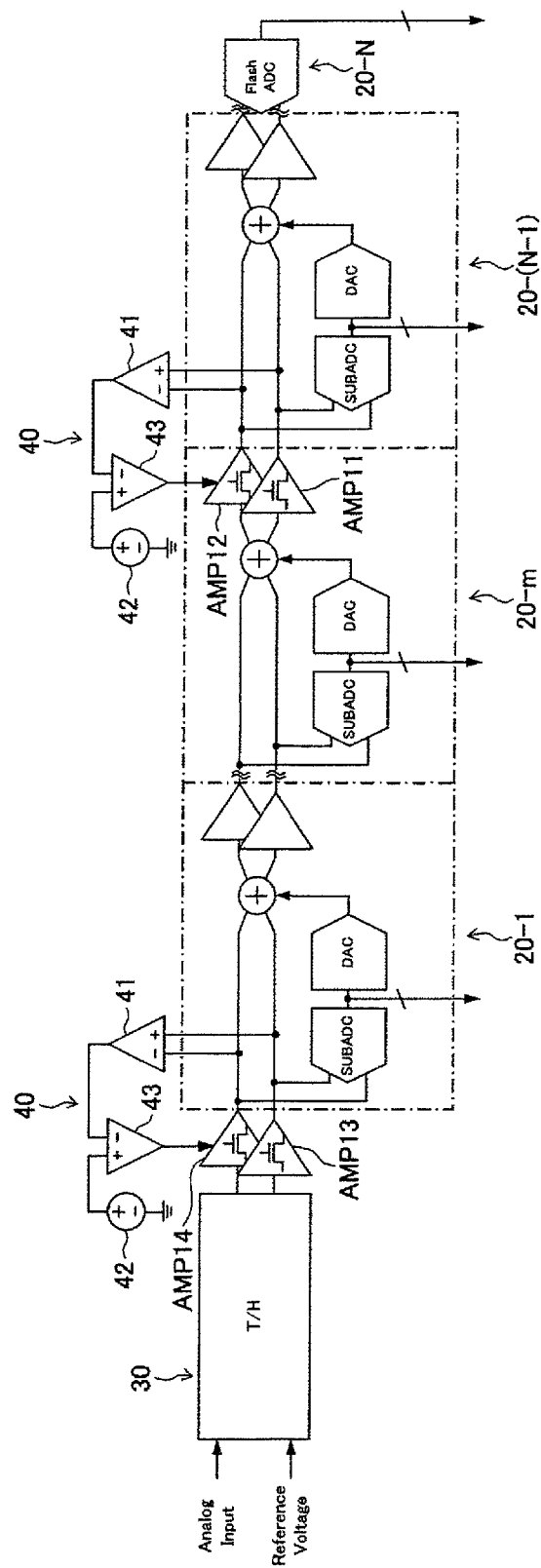
FIG. 10 is a diagram showing a structure example where output of two amplifiers is monitored at intervals of a plurality of stages to perform gain control.

Also, as shown in FIG. 10, output of the first amplifier AMP11 and the second amplifier AMP12 may be monitored at, for example, intervals of two or three stages to perform gain control of the first and second amplifiers AMP11 and AMP12.

Figure 11:
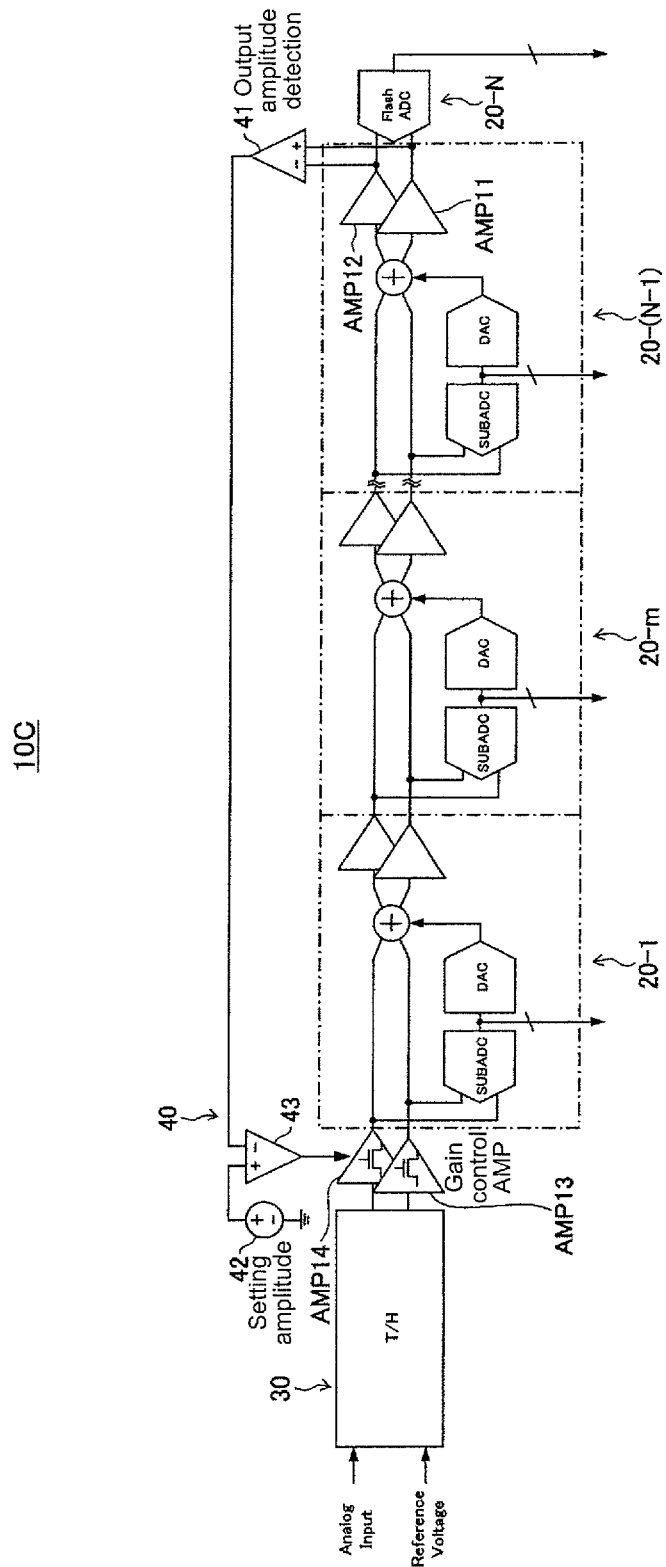
FIG. 11 is a diagram showing a structure example where output of two amplifiers is monitored in an AD conversion stage which is one-stage preceding a final stage to perform gain control of two amplifiers in an analog signal generation stage.

Furthermore, as shown in FIG. 11, output of the first amplifier AMP11 and the second amplifier AMP12 may be monitored in a preceding stage of a final-stage AD conversion stage 20-(N−1) to perform gain control of the third amplifier AMP13 and the fourth amplifier AMP14.

Figure 12:
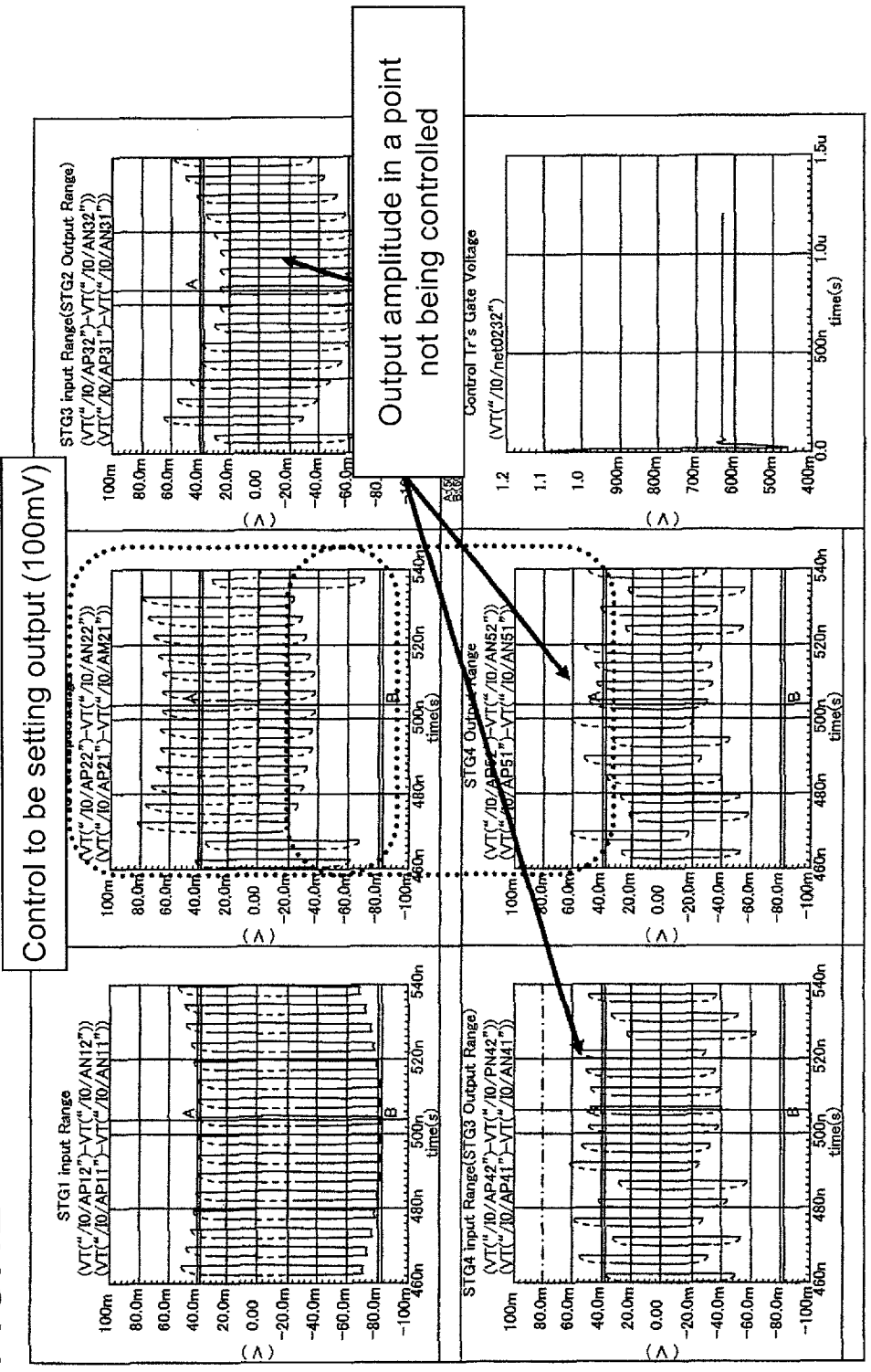
FIG. 12 is a diagram showing a simulation result of a structure where output of two amplifiers is monitored in an initial-stage AD conversion stage in the case of N=5 to perform gain control of two amplifiers.

FIG. 12 is a diagram showing a simulation result in a structure where output of the first amplifier AMP11 and the second amplifier AMP12 is monitored in an initial-stage AD conversion stage 20-1 in the case of N=5 to perform gain control of two amplifiers AMP11 and AMP12.

As shown in FIG. 12, output range of second and subsequent stages tends to be smaller by performing gain control of the first amplifier AMP11 and the second amplifier AMP12 only in an initial-stage AD conversion stage 20-1, but output amplitude of all stages may be held in a certain level.

Figure 13:
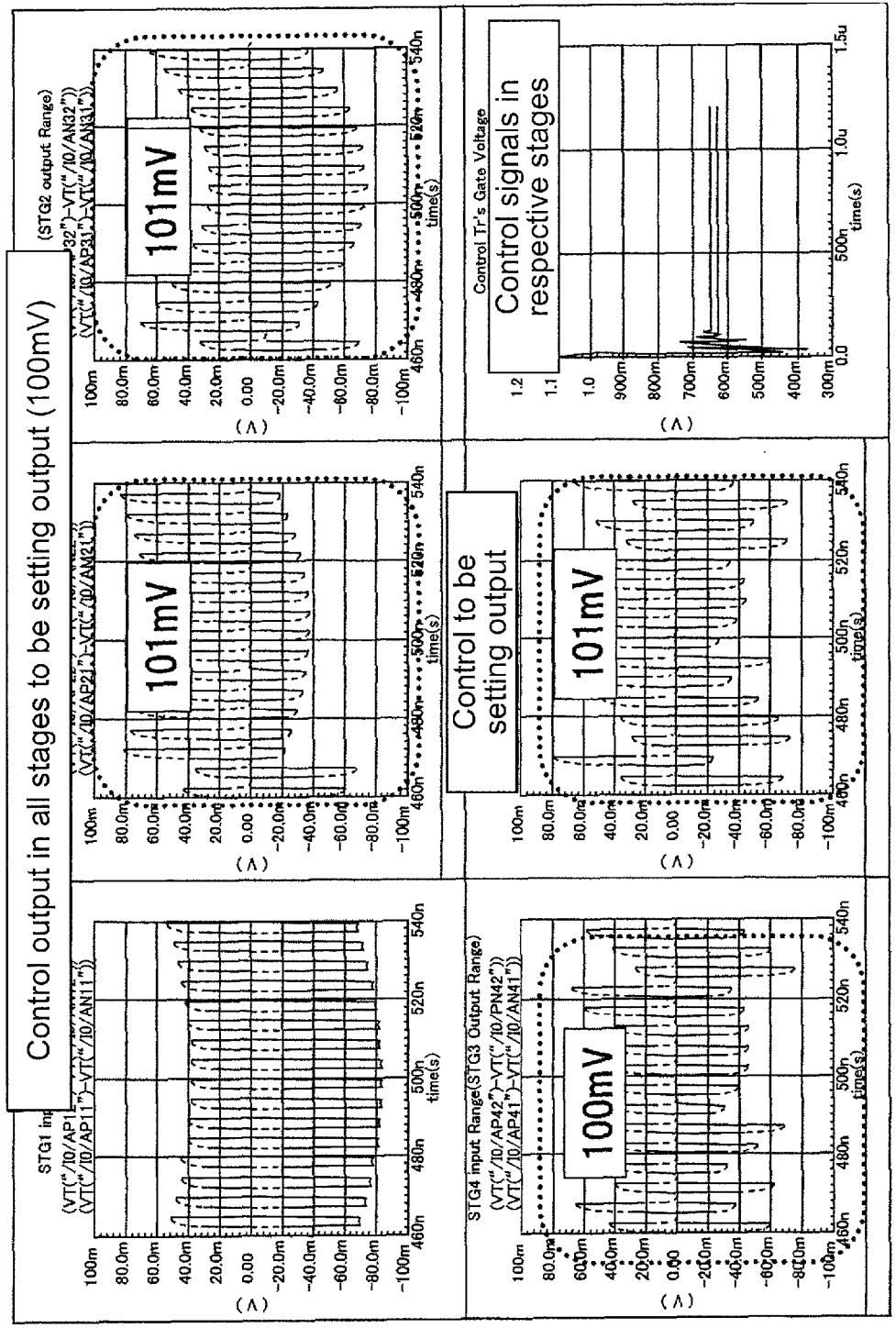
FIG. 13 is a diagram showing a simulation result of a structure where output of two amplifiers is monitored in all AD conversion stages in the case of N=5 to perform gain control of two amplifiers.

FIG. 13 is a diagram showing a simulation result where output of the first amplifier AMP11 and the second amplifier AMP12 is monitored in all AD conversion stages 20 (-1 to 4) in the case of N=5 to perform gain control of two amplifiers AMP11 and AMP12.

As can be seen from FIG. 13, output amplitude of all AD conversion stages may be more constant with control performed on all AD conversion stages than with control of one AD conversion stage in FIG. 12.

Figure 14:
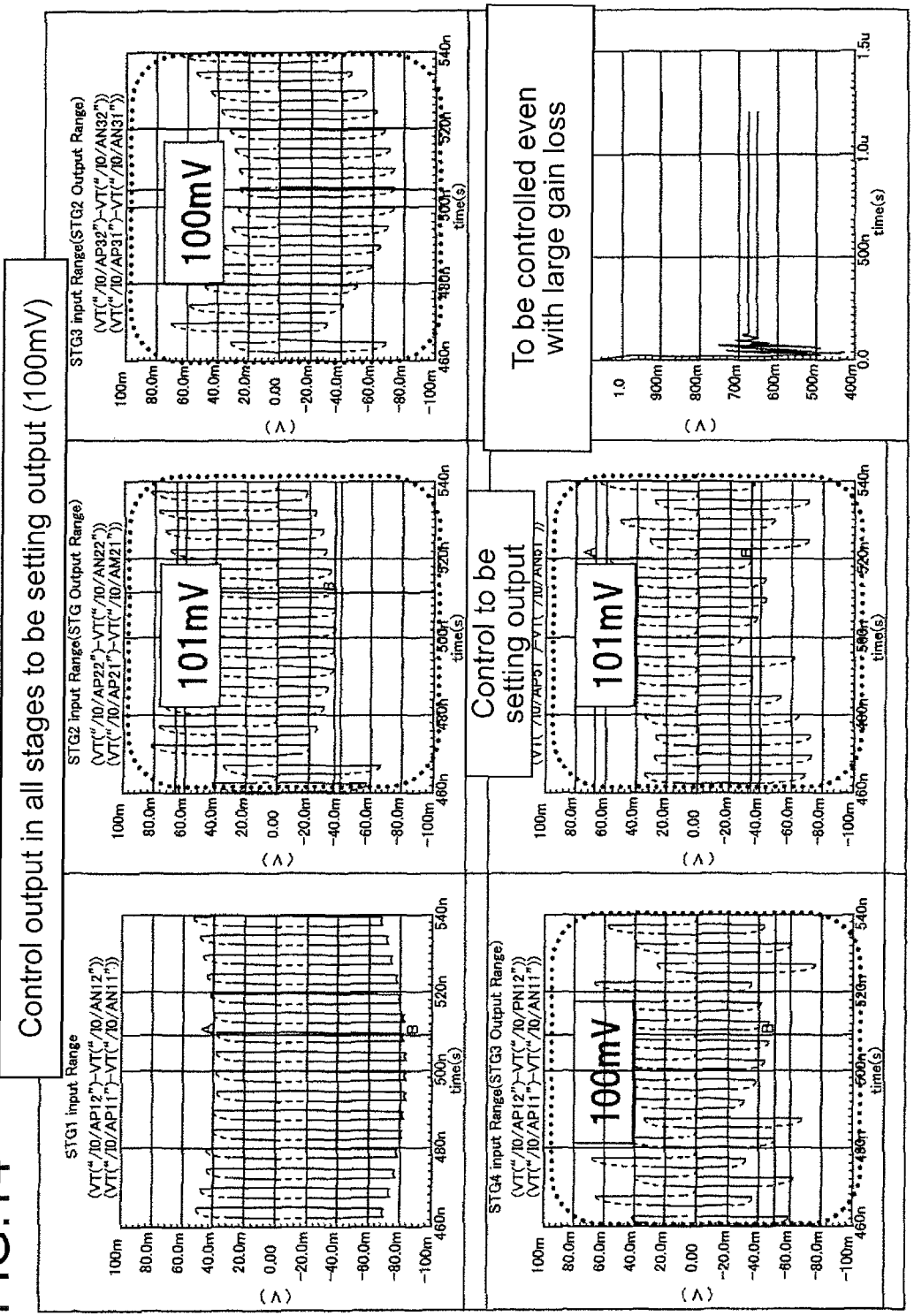
FIG. 14 is a diagram showing a simulation result of a structure where output of two amplifiers is monitored in all AD conversion stages in the case of N=5 after reducing gain to perform gain control of two amplifiers.

FIG. 14 is a diagram showing a simulation result where output of the first amplifier AMP11 and the second amplifier AMP12 is monitored in all AD conversion stages 20 (-1 to 4) in the case of N=5 after reducing gain to perform gain control of two amplifiers.

Reducing gain causes larger gain loss. As shown in FIG. 14, however, output amplitude may be constant in all AD conversion stages even with large gain loss.

Figure 15:
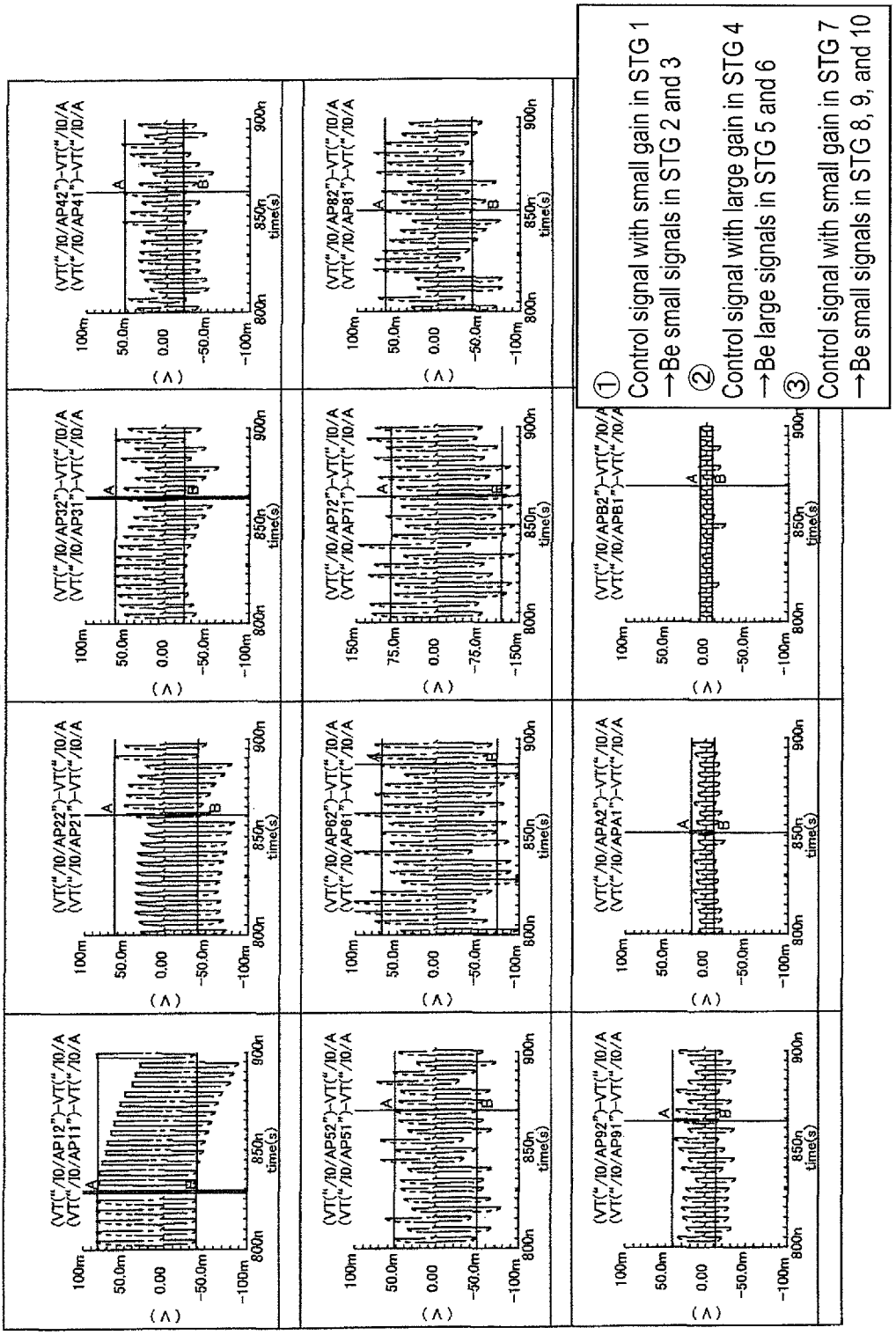
FIG. 15 is a diagram showing a simulation result of a structure where output of two amplifiers is monitored in AD conversion stages at intervals of three stages from an initial stage in the case of N=11 to perform gain control of two amplifiers.

FIG. 15 is a diagram showing a simulation result where output of the first amplifier AMP11 and the second amplifier AMP12 is monitored in AD conversion stages 20 (-1, -4, and -7) at intervals of three stages from an initial stage in the case of N=11 to perform gain control of two amplifiers.

In this case, a control signal is used so that gain becomes smaller in the initial-stage AD conversion stage 20-1, which helps signals in the second-stage and third-stage AD conversion stages 20-2 and 20-3 to be small.

A control signal is used so that gain becomes larger in the fourth-stage AD conversion stage 20-4, which helps signals in the fifth-stage and sixth-stage AD conversion stages 20-5 and 20-6 to be large.

A control signal is used so that gain becomes smaller in the seventh-stage AD conversion stage 20-7, which helps signals in the eighth-stage, ninth-stage, and tenth-stage AD conversion stages 20-8, 20-9, and 20-10 to be small.

In the open-loop MDAC stage pipeline-type AD converter 10, the description has been provided on the structure where amplitude information not depending on input is taken out from signals of two inputs to control amplitude to be constant.

Hereinafter, a description will be provided on a one-bit AD conversion stages 20 (-1 to N−1) to realize an AD converter without necessity of an operational amplifier with high accuracy, being capable of low-power operation and high-speed operation and facilitating downsizing, and a specific structure and functions of analog signal generation stages.

3. A Specific Structure Example of AD Conversion Stages

Firstly, a description will be provided, though some parts are overlapped with explanation above, on a specific structure and functions of one basic AD conversion stage that is applicable also as a 1-bit AD converter.

In order to facilitate understanding, the initial-stage AD conversion stage 20-1 is used in a description as an example. In the subsequent-stage AD conversion stages 20-2 to 20-(N−1), a first residual signal and a second residual signal being output from the preceding-stage AD conversion stages 20-1 to 20-(N−2) are input as a first analog signal and a second analog signal.

Input range (voltage) of the AD converter 10 according to the embodiment is from 0 to Vr. In the embodiment, first reference voltage Vrt corresponds to voltage Vr, and second reference voltage Vrb corresponds to voltage 0V.

As mentioned above, a first analog signal and a second analog signal are input to the AD conversion stage 20.

A first analog signal being input to the initial-stage AD conversion stage 20-1 is input as a signal having a voltage value (Vin−Vrb) corresponding to a difference between a voltage value (Vin) between two voltages, first reference voltage Vrt and second reference voltage Vrb, and the second reference voltage Vrb.

In the embodiment, a first analog signal is Vin, because of Vrb=0 as described above.

A second analog signal is input as a signal having a voltage value (Vin−Vrb−(Vrt−Vrb))=(Vin−Vrt) corresponding to a difference between a voltage value (Vin−Vrb) of a first analog signal and difference voltage (Vrt−Vrb) between first reference voltage Vrt and second reference voltage Vrb.

In the embodiment, as mentioned above, an input analog signal Vin has a voltage value between 0 (Vrb) and Vr (Vrt) (0<Vin<Vr), and is supplied to the first analog signal input terminal TI11 as a first analog signal (voltage) Vin.

The first analog signal input terminal TI11 inputs a first analog signal Vin to the AD conversion stage 20-1 through a signal input line LI11.

The second analog signal input terminal TI12 inputs a second analog signal having a voltage value (Vin−Vr) corresponding to a difference between a voltage value (Vin) of a first analog signal Vin and difference voltage Vr of reference voltage to the AD conversion stage 20-1 through a signal input line LI12.

The AD conversion stage 20-1 inputs a first analog signal Vin having a voltage value (Vin) from the first analog signal input terminal TI11.

In parallel, the AD conversion stage 20-1 inputs a second analog signal (Vin−Vr) having a value (Vin−Vr) calculated by subtracting difference voltage Vr of reference voltage from input voltage Vin, from the second analog signal input terminal TI12.

The AD conversion stage 20-1 includes the signal generation part 21 configured to generate a third analog signal (Vin−Vr/2) that is a residual signal from two signals, the first and second analog signals. It means the AD conversion stage 20-1 generates a third analog signal (Vin−Vr/2) having a voltage value calculated by adding a voltage value Vin of the first analog signal to a voltage value (Vin−Vr) of the second analog signal and dividing it by 2.

The AD conversion stage 20 performs high and low (large and small) comparison between voltages Vin and (Vin−Vr) of two signals, the first and second analog signals, in the inner comparison part 22.

The AD conversion stage 20-1 outputs a first residual signal A*Vin or A*(Vin−Vr/2) that is amplified by A times, from the first analog signal output terminal TO11 on the basis of a comparison result of the comparison part 22.

Similarly, the AD conversion stage 20-1 outputs a second residual signal A*(Vin−Vr/2) or A*(Vin−Vr) that is amplified by A times, from the second analog signal output terminal 1012 on the basis of a comparison result of the comparison part 22. A is a constant number showing amplification ratio.

In parallel, the AD conversion stage 20-1 outputs digital data DS having a digital value (data) 0 or 1 from the digital data output terminal TD11 on the basis of a comparison result of the comparison part 22.

In the embodiment, a digital value (data) 0 corresponds to first digital data, and a digital value (data) 1 corresponds to second digital data.

FIGS. 16A and 16B are diagrams showing a residual signal and a digital signal being output on the basis of a comparison result of the comparison part in an AD conversion stage in FIG. 2 for respective cases.

The AD conversion stage 20-1 determines whether signal voltage (2Vin−Vr) calculated by adding first analog signal voltage Vin to second analog signal voltage (Vin−Vr) is higher or lower than 0 in the comparison part 22.

The AD conversion stage 20-1 performs processing described below, when a first comparison result is obtained where signal voltage (2Vin−Vr) is lower than 0 (2Vin−Vr<0), which means (Vin<Vr/2).

It is equivalent to a situation where two analog input voltages |Vin| and |Vin−Vr| are compared to each other and the result shows first analog signal voltage |Vin| is lower than second analog signal voltage |Vin−Vr|(|Vin|<|Vin−Vr|).

The AD conversion stage 20-1 outputs, as shown in FIG. 16A, A*Vin from the first analog signal output terminal TO11 as a first residual signal, when a first comparison result (Vin<Vr/2) is obtained.

The AD conversion stage 20-1 outputs A*(Vin−Vr/2) from the second analog signal output terminal TO12 as a second residual signal.

In parallel, the AD conversion stage 20-1 outputs digital data DS having a digital value (data) 0 from the digital data output terminal TD11.

The AD conversion stage 20-1 performs processing described below, when a second comparison result is obtained where signal voltage (2Vin−Vr) is higher than 0 (2Vin−Vr)>0, which means (Vin>Vr/2).

It is equivalent to a situation where two analog input voltages |Vin| and |Vin−Vr| are compared to each other and the result shows first analog signal voltage |Vin| is higher than second analog signal voltage |Vin−Vr|(|Vin|>|Vin−Vr|).

The AD conversion stage 20-1 outputs, as shown in FIG. 16B, A*(Vin−Vr/2) from the first analog signal output terminal TO11 as a first residual signal, when a second comparison result (Vin>Vr/2) is obtained.

The AD conversion stage 20-1 outputs A*(Vin−Vr) from the second analog signal output terminal TO12 as a second residual signal.

In parallel, the AD conversion stage 20-1 outputs digital data DS having a digital value (data) 1 from the digital data output terminal TD11.

As mentioned above, the AD conversion stage 20-1 of the AD converter 10 according to the embodiment outputs first digital data 0 when a first comparison result (Vin<Vr/2) is obtained, and outputs second digital data 1 when a second comparison result (Vin>Vr/2) is obtained.

The AD conversion stage 20-1 amplifies analog residual signals (Vin and Vin−Vr/2, or Vin−Vr/2 and Vin−Vr) by A times with the first amplifier AMP11 and the second amplifier AMP12 to output the signals, according to a comparison result.

A Specific Structure Example of 1-Bit AD Conversion Stages

Figure 17:
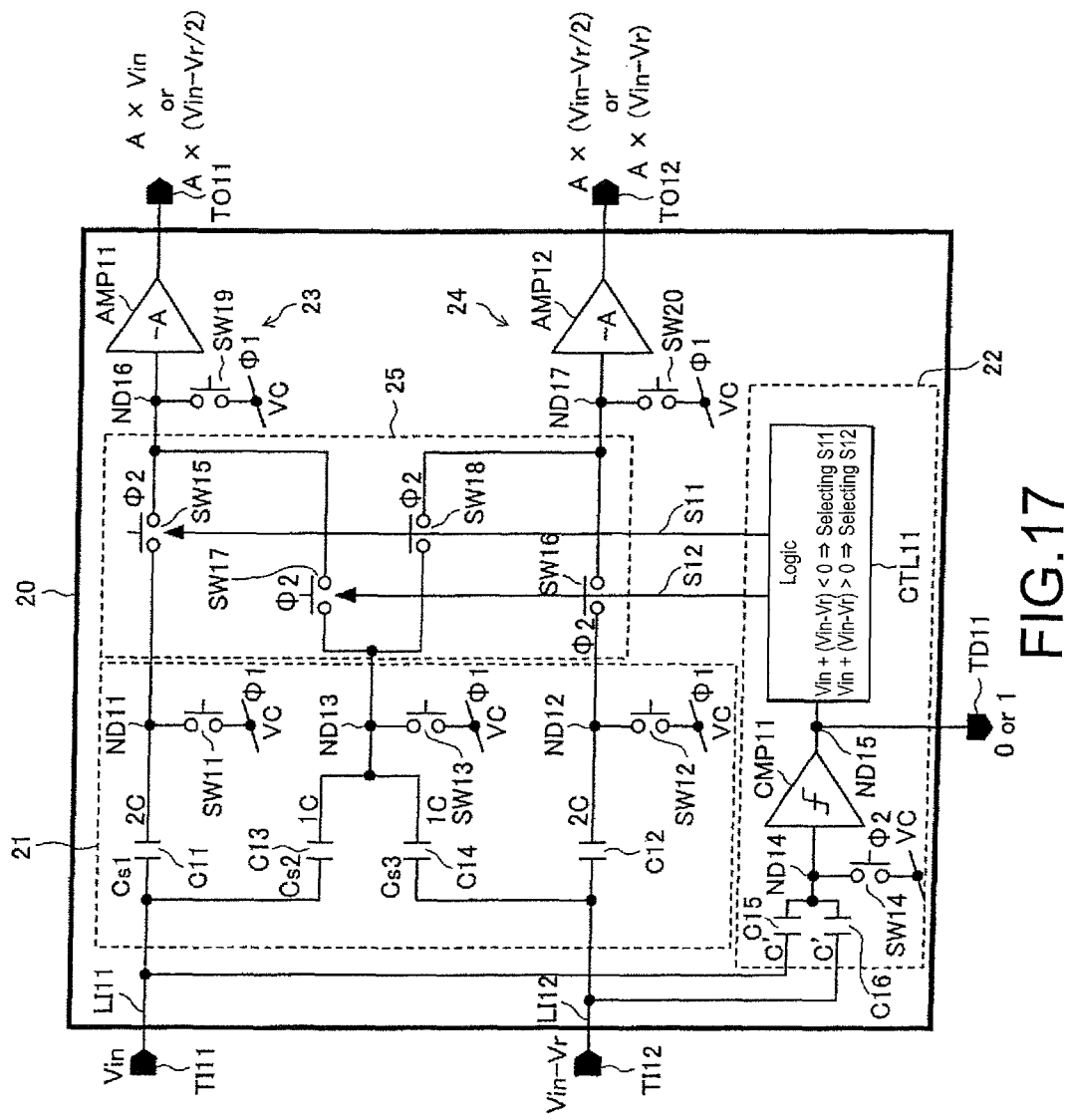
FIG. 17 is a circuit diagram showing a specific structure example of a 1-bit AD conversion stage according to the embodiment.
Figure 19:
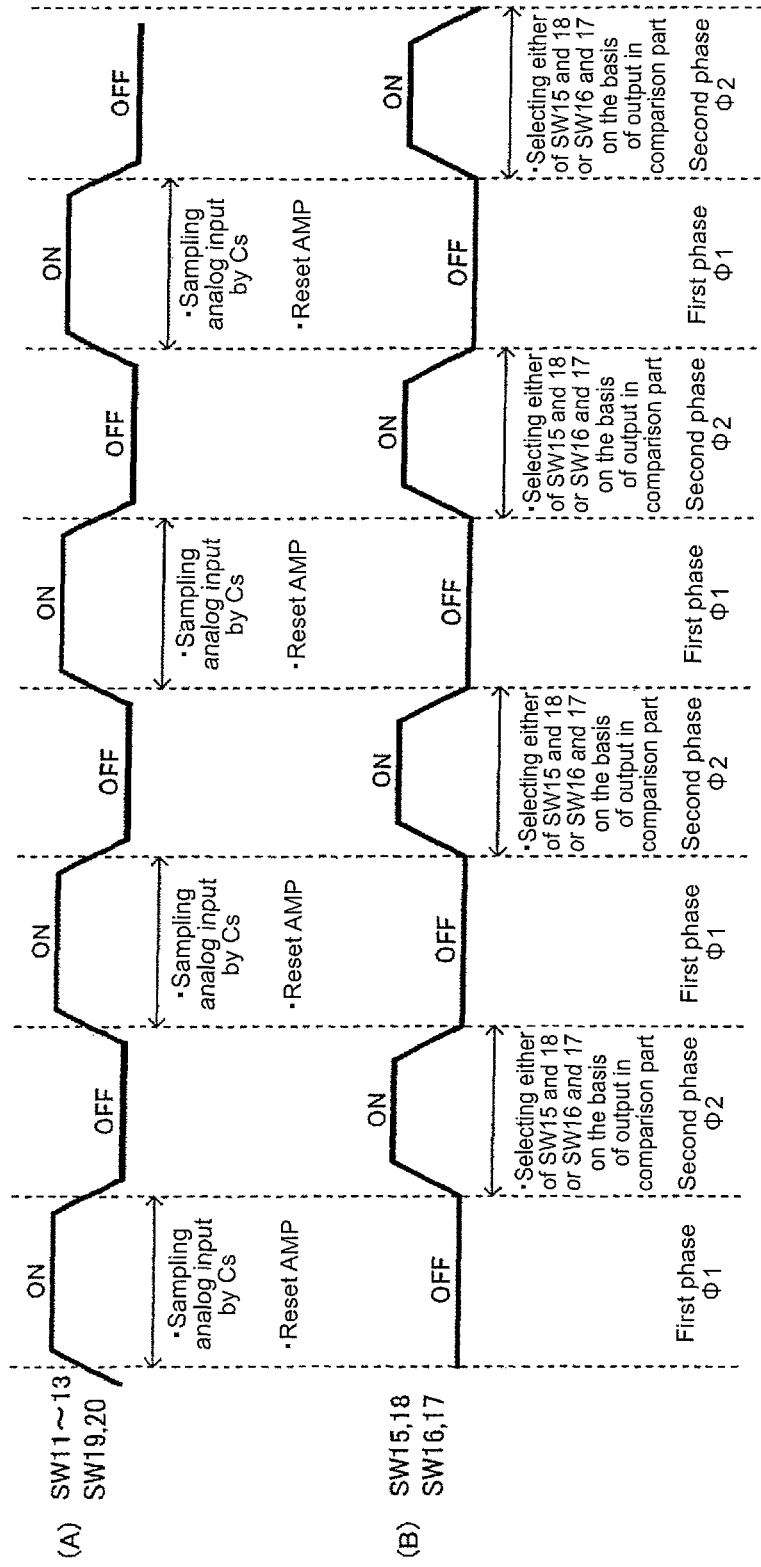
FIG. 19 is a diagram explaining operation of a 1-bit AD conversion stage in FIG. 17 and showing an operation outline in respective phases.

FIG. 17 is a circuit diagram showing a specific structure example of 1-bit AD conversion stages according to the embodiment.

In order to facilitate understanding, as mentioned above, the initial-stage AD conversion stage 20-1 is used as an example. In the subsequent-stage AD conversion stages 20-2 to 20-(N−1), a first residual signal and a second residual signal being output from the preceding-stage AD conversion stage 20-1 to 20-(N−2) are input as a first analog signal and a second analog signal.

Therefore, AD conversion stages 20-1 to 20-(N−1) have the same structure as that of the AD conversion stage 20.

The 1-bit AD conversion stage 20 in FIG. 17 may be applied as a 1-bit AD converter 10D by itself.

The AD conversion stage 20 in FIG. 17 includes, as mentioned above, the signal generation part 21, the comparison part 22, the first output part 23, the second output part 24, and the switch part 25.

The signal generation part 21 inputs a first analog signal Vin and a second analog signal (Vin−Vr) through the signal input lines LI11 and LI12.

The signal generation part 21 generates a third analog signal (Vin−Vr/2) having a voltage value calculated by adding a voltage value Vin of the first analog signal to a voltage value (Vin−Vr) of the second analog signal and dividing by 2.

The signal generation part 21 outputs sampled analog signals, a first analog signal Vin, a second analog signal (Vin−Vr), and a third analog signal (Vin−Vr/2), to the switch part 25.

The signal generation part 21 in FIG. 17 generates a third analog signal (Vin−Vr/2) by capacity interpolation.

The signal generation part 21 in FIG. 17 includes a first capacitor C11, a second capacitor C12, a third capacitor C13, and a fourth capacitor C14.

The signal generation part 21 includes a first switch SW11, a second switch SW12, a third switch SW13, a first output node ND11, a second output node ND12, and a third output node ND13.

In the embodiment, for example, capacity values of the first capacitor C11 and the second capacitor C12 are set to be 2C, and capacity values of the third capacitor C13 and the fourth capacitor C14 are 1C.

It means the ratio between capacitor values of the first capacitor C11 and the second capacitor C12 and capacitor values of the third capacitor C13 and the fourth capacitor C14 is set to be 2:1.

One end of the first capacitor C11 is connected to the input line LI11 of a first analog signal Vin, and the other end is connected to the first output node ND11 for outputting the first analog signal Vin.

One end of the second capacitor C12 is connected to the input line LI12 of a second analog signal (Vin−Vr), and the other end is connected to the second output node ND12 for outputting the second analog signal (Vin−Vr).

One end of the third capacitor C13 is connected to an input line of a first analog signal Vin, and the other end is connected to the third output node ND13 for outputting the third analog signal (Vin−Vr/2).

One end of the fourth capacitor C14 is connected to the input line LI12 of a second analog signal (Vin−Vr), and the other end is connected to the third output node ND13 for outputting the third analog signal (Vin−Vr/2).

The first switch SW11 is connected between the first output node ND11 and fixed potential VC. The fixed potential VC is, for example, ground potential GND.

The second switch SW12 is connected between the second output node ND12 and fixed potential VC.

The third switch SW13 is connected between the third output node ND13 and fixed potential VC.

The first switch SW11, the second switch SW12, and the third switch SW13 are held in a conductive state (short-circuit state) during a high level period of a first phase signal Φ1, and are held in a non-conductive state (open state) during a low level period.

The first capacitor C11 samples a first analog signal Vin that is an input signal during a conductive state of the first switch SW11, and sampled voltage Vin is generated on the first output node ND11 side in a non-conductive state so as to output a voltage signal thereof.

The second capacitor C12 samples a second analog signal (Vin−Vr) that is an input signal during a conductive state of the second switch SW12, and sampled voltage is generated on the second output node ND12 side in a non-conductive state so as to output a voltage signal thereof.

The third capacitor C13 samples a first analog signal Vin that is an input signal during a conductive state of the third switch SW13, and sampled voltage Vin is generated on the third output node ND13 side in a non-conductive state.

The fourth capacitor C14 samples a second analog signal (Vin−Vr) that is an input signal during a conductive state of the third switch SW13, and sampled voltage is generated on the third output node ND13 side in a non-conductive state.

As described above, the third capacitor C13 and the fourth capacitor C14 sample an input signal during a conductive state of the third switch SW13, and each of the sampled voltage is generated on the third output node ND13 side in a non-conductive state. Then, voltages are synthesized and output from the third output node ND13.

The comparison part 22 inputs a first analog signal Vin and a second analog signal (Vin−Vr) through the signal input lines LI11 and LI12.

The comparison part 22 adds a voltage value Vin of a first analog signal to a voltage value (Vin−Vr) of a second analog signal, and compares whether the signal (2Vin−Vr) is higher or lower than 0.

Substantially, the comparison part 22 compares a voltage value (Vin−Vr/2) calculated by subtracting an intermediate voltage value Vr/2 of a second analog signal from a voltage value Vin of a first analog signal with 0V (reference voltage value).

The comparison part 22 outputs digital data DS having a value corresponding to the comparison result from the digital data output terminal TD11.

The comparison part 22 performs switch control of a supply route and signals on output parts for a first analog signal Vin, a second analog signal (Vin−Vr), and a third analog signal (Vin−Vr/2) that are output from the signal generation part 21 in the switch part 25 on the basis of a comparison result.

That is, the comparison part 22 performs switch control of a supply route and signals on the first output part 23 and the second output part 24 for a first analog signal Vin, a second analog signal (Vin−Vr), and a third analog signal (Vin−Vr/2) on the basis of a comparison result.

The comparison part 22 outputs digital data DS having a value (data) 0 from the digital data output terminal TD11, when a first comparison result is obtained where a voltage value (2Vin−Vr) calculated by adding a voltage value Vin of a first analog signal to a voltage value (Vin−Vr) of a second analog signal is lower than 0.

The comparison part 22 outputs digital data DS having a value (data) 1 from the digital data output terminal TD11, when a second comparison result is obtained where a voltage value (2Vin−Vr) is higher than 0.

The comparison part 22 performs switch control of the switch part 25 as described below, when a first comparison result is obtained.

The comparison part 22 controls the switch part 25 so that a first analog signal Vin being output from the signal generation part 21 is input to the first output part 23 as a first residual signal, and a third analog signal (Vin−Vr/2) is input to the second output part 24 as a second residual signal.

The comparison part 22 performs switch control of the switch part 25 as described below, when a second comparison result is obtained.

The comparison part 22 controls the switch part 25 so that a third analog signal (Vin−Vr/2) being output from the signal generation part 21 is input to the first output part 23 as a first residual signal, and a second analog signal (Vin−Vr) is input to the second output part 24 as a second residual signal.

The comparison part 22 in FIG. 17 includes a comparator CMP11, a control part CTL11, a fifth capacitor C15, a sixth capacitor C16, a fourth switch SW14, and an input node ND14 and an output node ND15 of the comparator CMP11.

In the embodiment, capacity values of the fifth capacitor C15 and the sixth capacitor C16 are set to be 1C'.

One end of the fifth capacitor C15 is connected to the input line LI11 of a first analog signal Vin, and the other end is connected to the input node ND14 of the comparator CMP11.

One end of the sixth capacitor C16 is connected to the input line LI12 of a second analog signal (Vin−Vr), and the other end is connected to the input node ND14 of the capacitor CMP11.

The fourth switch SW14 is connected between the input node ND14 of the comparator CMP11 and fixed potential VC.

The fourth switch SW14 is held in a conductive state (short-circuit state) during a high level period of a second phase signal Φ2, which is a reverse phase of a first phase signal Φ1, and is held in a non-conductive state (open state) during a low level period.

The fourth switch SW14 is held in a conductive state (short-circuit state) during a high level period of a second phase signal Φ2, and is held in a non-conductive state (open state) during a low level period.

A reverse phase represents a relationship in which phases are deviated by 180 degrees. That is, when a first phase signal Φ1 is in a high level, a second phase signal Φ2 is in a low level, and when a first phase signal Φ1 is in a low level, a second phase signal Φ2 is in a high level.

The fifth capacitor C15 samples a first analog signal Vin that is an input signal during a conductive state of the fourth switch SW14, and sampled voltage Vin is generated on the input node ND14 side of the comparator CMP11 in predetermined timing.

The sixth capacitor C16 samples a second analog signal (Vin−Vr) that is an input signal during a conductive state of the fourth switch SW14, and sampled voltage is generated on the input node ND14 side of the comparator CMP11 in predetermined timing.

As mentioned above, the fifth capacitor C15 and the sixth capacitor C16 sample input signals during a conductive state of the fourth switch SW14, and respective sampled voltages are generated on the input node ND14 side of the comparator CMP11 in predetermined timing. Then, the voltages are synthesized and supplied to the comparator CMP11.

The comparator CMP11 compares composite signal voltage (Vin+Vin−Vr) being input with 0.

The comparator CMP11 outputs first digital data 0 to the digital data output terminal TD11 and the control part CTL11 through the output node ND15, when a first comparison result (Vin+Vin−Vr)<0 is obtained.

The comparator CMP11 outputs second digital data 1 to the digital data output terminal TD11 and the control part CTL11 through the output node ND15, when a second comparison result (Vin+Vin−Vr)>0 is obtained.

In the first embodiment, the comparator CMP11 performs comparison operation in timing when a first phase signal Φ1 is switched from a high level to a low level.

When first digital data 0 is received from the comparator CMP11, the control part CTL11 determines that the first comparison result (Vin+Vin−Vr)<0 is obtained as a result of comparison and controls the switch part 25 with a first control signal S11 and a second control signal S12 as mentioned below.

The control part CTL11 controls the switch part 25 so that a first analog signal Vin being output from the signal generation part 21 is input to the first output part 23, and a third analog signal (Vin−Vr/2) is input to the second output part 24.

In the first embodiment, the control part CTL11 determines to output which signal, a first control signal S11 or a second control signal S12, in an active high level, when a second phase signal Φ2 is switched from a low level to a high level. The control part CTL11 outputs signals to the switch part 25 so that a second phase signal Φ2 is in a high-level zone and a first control signal S11 and a second control signal S12 have a high level and a low level in a complementary manner.

When second digital data 1 is received from the comparator CMP11, the control part CTL11 determines a second comparison result (Vin+Vin−Vr)>0 is obtained as a result of comparison, and controls the switch part 25 with a first control signal S11 and a second control signal S12 as mentioned below.

The control part CTL11 controls the switch part 25 so that a third analog signal (Vin−Vr/2) being output from the signal generation part 21 is input to the first output part 23 and a second analog signal (Vin−Vr) is input to the second output part 24.

The control part CTL11 determines to output which signal, a first control signal S11 or a second control signal S12, in an active high level, when a second phase signal Φ2 is switched from a low level to a high level.

The first output part 23 amplifies a first residual signal Vin or (Vin−Vr/2) supplied through the switch part 25 with the first amplifier AMP11 with predetermined amplification ratio to output the signal from the first analog signal output terminal TO11.

The first output part 23 in FIG. 17 includes a first amplifier (amp) AMP11, a first input node ND16, and a ninth switch SW19.

The first amplifier AMP11 amplifies a first residual signal Vin or (Vin−Vr/2) supplied to the first input node ND16 through the switch part 25 with predetermined amplification ratio (gain) A to output the signal from the first analog signal output terminal TO11.

The ninth switch SW19 is connected between the first input node ND16 and fixed potential VC.

The ninth switch SW19 is held in a conductive state (short circuit state) during a high level period of a first phase signal Φ1, and is held in a non-conductive state (open state) during a low level.

When the ninth switch SW19 is in a conductive state, the first input node ND16 is in a non-connection state to the first output node ND11 and the third output node ND13 of the signal generation part 21, being reset to a state in which the first amplifier AMP11 has no input signal.

The second output part 24 amplifies a second residual signal (Vin−Vr/2) or (Vin−Vr) supplied through the switch part 25 with the first amplifier AMP12 with predetermined amplification ratio A to output the signal from the second analog signal output terminal 1012.

The second output part 24 in FIG. 17 includes a second amplifier (amp) AMP12, a second input node ND17, and a tenth switch SW20.

The second amplifier AMP12 amplifies a second residual signal (Vin−Vr/2) or (Vin−Vr) supplied to the second input node ND17 through the switch part 25 with predetermined amplification ratio (gain) A to output the signal from the second analog signal output terminal T012.

The tenth switch SW20 is connected between the second input node ND17 and fixed potential VC.

The tenth switch SW20 is held in a conductive state (short-circuit state) during a high level of a first phase signal Φ1, and is held in a non-conductive state (open state) during a low level.

When the tenth switch SW20 is in a conductive state, the second input node ND17 is in a non-connection state to the second output node ND12 and the third output node ND13 of the signal generation part 21, being reset to a state in which the second amplifier AMP12 has no input signal.

The switch part 25 switches input of a first analog signal Vin, a second analog signal (Vin−Vr), and a third analog signal (Vin−Vr/2) to the first output part 23 and the second output part 24 by the signal generation part 21 on the basis of a comparison result of the comparison part 22.

The switch part 25 performs switching as mentioned below in response to control signals S11 and S12 of the comparison part 22.

The switch part 25 instructs the first output part 23 to input a first analog signal Vin by the signal generation part 21 as a first residual signal, when a first comparison result is obtained in the comparison part 22. Then, the switch part 25 instructs the second output part 24 to input a third analog signal (Vin−Vr/2) as a second residual signal.

The switch part 25 instructs the first output part 23 to input a third analog signal (Vin−Vr/2) by the signal generation part 21 as a first residual signal, when a second comparison result is obtained in the comparison part 22. Then the switch part 25 instructs the second output part 24 to input a second analog signal (Vin−Vr) as a second residual signal.

The switch part 25 in FIG. 17 includes a fifth switch SW15, a sixth switch SW16, a seventh switch SW17, and an eighth switch SW18.

The fifth switch SW15 is connected between the first output node ND11 of the signal generation part 21 and the first input node ND 16 configured to input a first residual signal to the first output part 23.

The sixth switch SW16 is connected between the second output node ND12 of the signal generation part 21 and the second input node ND17 configured to input a second residual signal to the second output part 24.

The seventh switch SW17 is connected between the third output node ND13 of the signal generation part 21 and the first input node ND16 configured to input a first residual signal to the first output part 23.

The eighth switch SW18 is connected between the third output node ND13 of the signal generation part 21 and the second input node ND17 configured to input a second residual signal to the second output part 24.

The fifth switch SW15 and the eighth switch SW18 are switched between a conductive state and a non-conductive state on the basis of a control signal S11 being output by the comparison part 22.

The sixth switch SW16 and the seventh switch SW17 are switched between a conductive state and a non-conductive state on the basis of a control signal S12 being output by the comparison part 22.

When a first comparison result is obtained in the comparison part 22, the fifth switch SW15 and the eighth switch SW18 are held in a conductive state by a control signal S11, and the sixth switch SW16 and the seventh switch SW17 are held in a non-conductive state by a control signal S12.

When a second comparison result is obtained in the comparison part 22, the fifth switch SW15 and the eighth switch SW18 are held in a non-conductive state by a control signal S11, and the sixth switch SW16 and the seventh switch SW17 are held in a conductive state by a control signal S12.

The control signals S11 and S12 by the comparison part 22 are supplied as signals having the same phase as a second phase signal $\Phi 2$.

Therefore, in the comparison part 22, two switches of the switch part 25 are held in a conductive state during the same period as a period in which the fourth switch SW14 is in a conductive state and samples a first analog signal Vin and a second analog signal (Vin−Vr) to perform comparison and determination.

At this time, in the signal generation part 21, the first switch SW11, the second switch SW12, and the third switch SW13 are held in a non-conductive state, and sampled voltage is held in an output state.

And the ninth switch SW19 of the first output part 23 and the tenth switch SW10 of the second output part 24 are held in a non-conductive state by a first phase signal $\Phi 1$, and in a state of waiting for signal input to the first amplifier AMP11 and the second amplifier AMP12.

FIGS. 18A and 18B are diagrams explaining a basic concept of operation of 1-bit AD conversion stages in FIG. 17.

The AD conversion stage 20 outputs digital data corresponding to a comparison result in the comparison part 22 as shown in FIG. 18A.

That is, the AD conversion stage 20 compares sizes |Vin| and |Vin−Vr| of two analog signals, a first analog signal Vin and a second analog signal (Vin−Vr), with each other and outputs digital data 0 or 1 on the basis of the comparison result.

In the embodiment, as a method therefor, a signal (Vin+(Vin−Vr)=2Vin−Vr) is obtained by adding a first analog signal Vin to a second analog signal (Vin−Vr).

Then, the comparator CMP11 compares and determines whether the signal (2Vin−Vr) is larger (higher) or smaller (lower) than 0 to output digital data 0 or 1.

The AD conversion stages 20 also applies a comparison result of the comparison part 22 to two analog signal outputs.

That is, when a first comparison result is obtained where first digital data 0 is output in the AD conversion stage 20, as shown in FIG. 18B, analog signal output is performed so that a first analog signal Vin and a third analog signal (Vin−Vr/2) are selected and output depending on an area.

When a second comparison result is obtained where second digital data 1 is output in the AD conversion stage 20, as shown in FIG. 18B, analog signal output is performed so that a third analog signal (Vin−Vr/2) and a second analog signal (Vin−Vr) are selected and output depending on an area.

Next, operation of 1-bit AD conversion stages in FIG. 17 will be described with reference to FIG. 19 to FIG. 22.

Basically, first phase operation and second phase operation are performed. In the first phase operation, a first phase signal $\Phi 1$ is active and a second phase signal $\Phi 2$ is non-active, while a second phase signal $\Phi 2$ is active and a first phase signal $\Phi 1$ is non-active in the second phase operation.

When a first phase signal $\Phi 1$ or a second phase signal $\Phi 2$ is active, for example, the signal is set to a high level. Similarly, when it is in a non-active, it is set to a low level.

FIGS. 19A and 19B are diagrams explaining operation of 1-bit AD conversion stages in FIG. 17 and showing an operation outline in respective phases.

FIG. 19A shows states of the first to third switches SW11 to SW13 of the signal generation part 21 and the ninth switch SW19 and the tenth switch SW20 of the first and second output parts 23 and 24 that are phase-driven to a conductive state and a non-conductive state in the same phase.

FIG. 19B shows states of the fifth to eighth switches SW15 to SW18 of the switch part 25 that are phase-driven in reverse phases of respective switches SW11 to SW13 of the signal generation part 21 and respective switches SW19 and SW20 of the first and second output parts.

In FIGS. 19A and 19B, a conductive state is shown as "ON", and a non-conductive state is shown as "OFF".

In FIG. 19A, Cs shows capacitors for sampling, which are the first to fourth capacitors C11 to C14 of the signal generation part 21.

Figure 20:
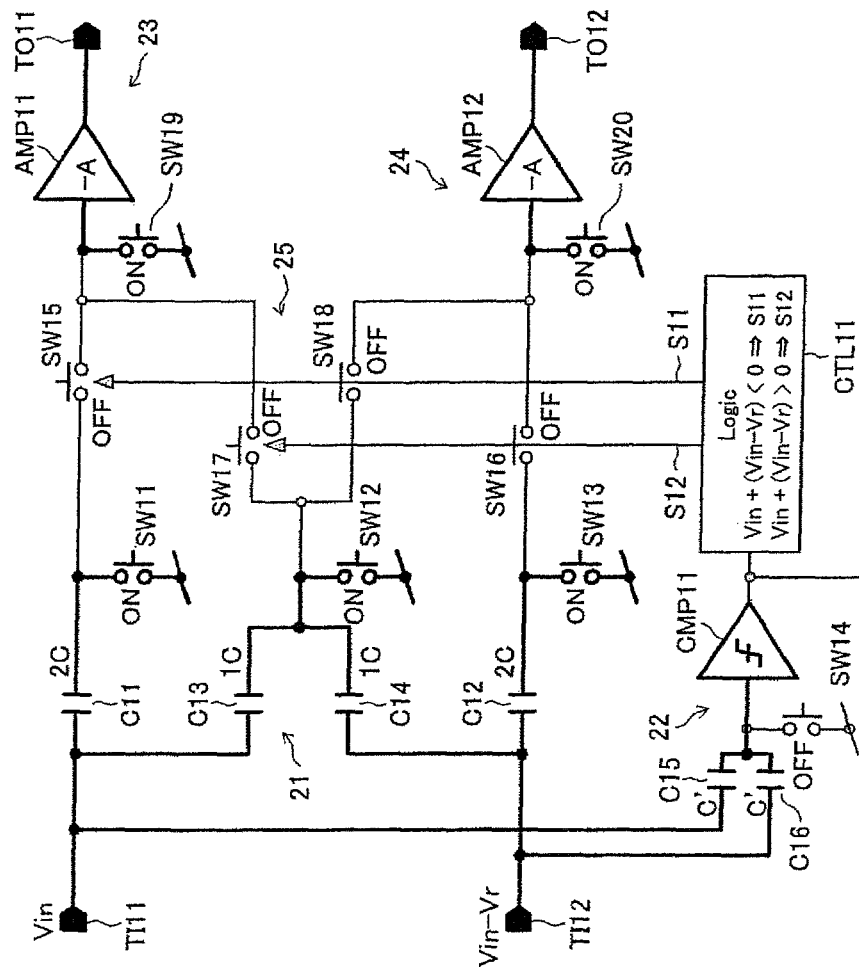
FIG. 20 is a diagram explaining operation of a first phase in a 1-bit AD conversion stage in FIG. 17.

FIG. 20 is a diagram explaining operation of a first phase of the 1-bit AD conversion stages in FIG. 17.

Figure 21:
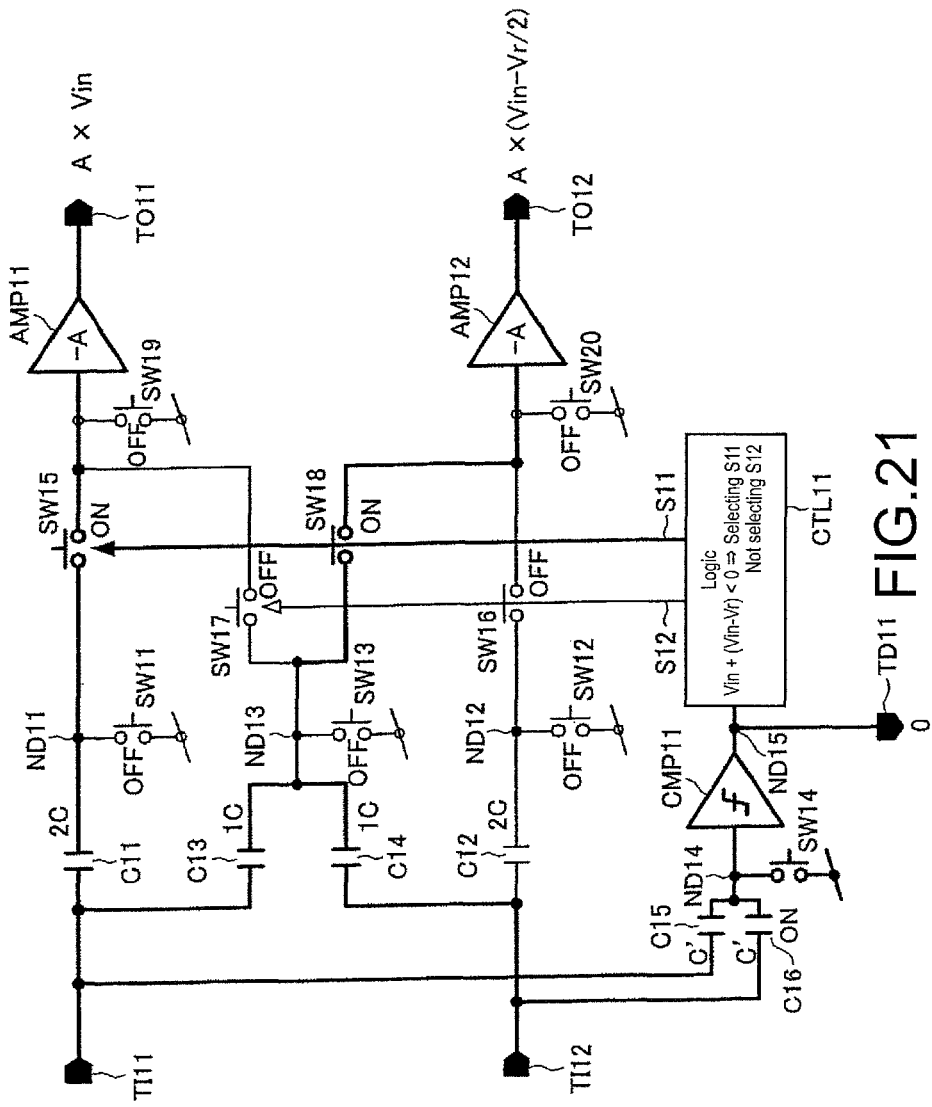
FIG. 21 is a diagram explaining operation of a second phase in a 1-bit AD conversion stage in FIG. 17 and explaining operation with a first comparison result obtained.

FIG. 21 is a diagram explaining operation of a second phase of the 1-bit AD conversion stages in FIG. 17 and explaining operation with a first comparison result obtained.

Figure 22:
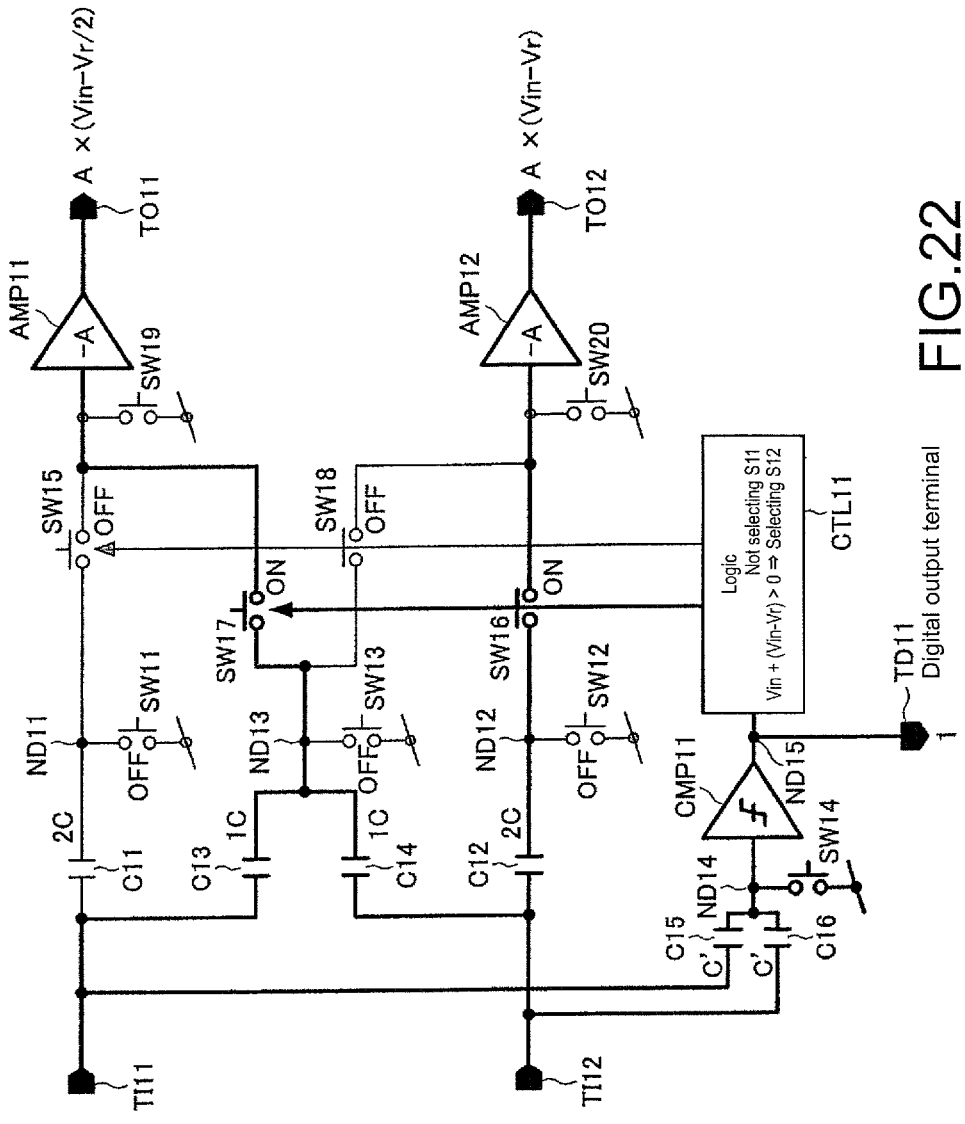
FIG. 22 is a diagram explaining operation of a second phase in a 1-bit AD conversion stage in FIG. 17 and explaining operation with a second comparison result obtained.

FIG. 22 is a diagram explaining operation of a second phase of the 1-bit AD conversion stage in FIG. 17 and explaining operation with a second comparison result obtained.

Operation of a First Phase

In a first phase, a first phase signal $\Phi 1$ is supplied to the signal generation part 21, the first output part 23, and the second output part 24 in an active high level.

At this time, a second phase signal $\Phi 2$ is supplied to the comparison part 22 in a non-active low level.

With the situation, the first switch SW11, the second switch SW12, the third switch SW13 of the signal generation part 21, the ninth switch SW19 of the first output part 23, and the tenth switch SW20 of the second output part 24 are to be in a conductive state (ON).

On the other hand, the fourth switch SW14 of the comparison part 22 is to be in a non-conductive state (OFF).

In the signal generation part 21, with the first to third switches SW11 to SW13 being in a conductive state, a first analog signal Vin and a second analog signal (Vin−Vr) being input are sampled by sampling capacity Cs.

Specifically, a first analog signal Vin is sampled by the first and third capacitors C11 and C13 that are sampling capacity Cs, and a second analog signal (Vin−Vr) is sampled by the second and fourth capacitors C12 and C14.

With the ninth and tenth switches SW19 and SW20 of the first and second output parts 23 and 24 being in a conductive state, the first amplifier AMP11 and the second amplifier AMP12 are reset.

Operation of a Second Phase

In a second phase, a second phase signal $\Phi 2$ is supplied to the comparison part 22 in an active high level.

At this time, a first phase signal $\Phi 1$ is supplied to the signal generation part 21, the first output part 23, and the second output part 24 in a non-active low level.

With the situation, the fourth switch SW14 of the comparison part 22 is in a conductive state (ON).

On the other hand, the first switch SW11, the second switch SW12, and the third switch SW13 of the signal generation part 21, the ninth switch SW19 of the first output part 23, and the tenth switch SW20 of the second output part 24 are in a non-conductive state (OFF).

In the comparison part 22, with the fourth switch SW14 being in a conductive state, a first analog signal Vin and a second analog signal (Vin−Vr) are sampled by the fifth capacitor C15 and the sixth capacitor C16. Then, respective sampled voltages are generated on the input node ND14 side of the comparator CMP11 in predetermined timing.

With the first switch SW11, the second switch SW12, and the third switch SW13 being in a non-conductive state, sampled voltage V is generated on the first to third output nodes ND11 to ND13 sides, and the signal generation part 21 is in a state of waiting for voltage signal output.

In the comparison part 22, voltages are synthesized and supplied to the comparator CM11.

The comparator CMP11 performs comparison operation in timing where a first phase signal Φ1 is switched from a high level to a low level.

In the comparison operation, the comparator CMP11 compares composite signal voltage (Vin+Vin−Vr) being input with 0V.

The comparator CMP11 outputs first digital data 0 to the digital data output terminal TD11 and the control part CTL11 through the output node ND15, when a first comparison result (Vin+Vin−Vr)<0 is obtained.

The comparator CMP11 outputs digital data 1 to the digital data output terminal TD11 and the control part CTL11 through the output node ND15, when a second comparison result (Vin+Vin−Vr)>0 is obtained.

Then, the control part CTL11 determines to output which signal, a first control signal S11 or a second control signal S12, in an active high level, when a second phase signal Φ2 is switched from a low level to a high level.

When first digital data 0 is received from the comparator CMP11, the control part CTL11 determines a first comparison result (Vin+Vin−Vr)<0 is obtained as a result of comparison and controls the switch part 25 by the first control signal S11 and the second control signal S12 as described below.

The control part CTL11 sets the first control signal S11 to an active high level, and the second control signal S12 to a non-active low level.

Consequently, as shown in FIG. 21, the fifth switch SW15 and the eighth switch are held in a conductive state (ON), and the sixth switch SW16 and the seventh switch SW17 are held in a non-conductive state (OFF) in the switch part 25.

Then, the first analog signal Vin being output from the signal generation part 21 is input to the first amplifier AMP11 of the first output part 23, and the third analog signal (Vin−Vr/2) is input to the second amplifier AMP12 of the second output part 24.

The first amplifier AMP11 amplifies a first residual signal Vin supplied through the switch part 25 with predetermined amplification ratio A and outputs a signal A*Vin from the first analog signal output terminal TO11.

The second amplifier AMP12 amplifies a second residual signal (Vin−Vr/2) supplied through the switch part 25 with predetermined amplification ratio A and outputs a signal A*(Vin−Vr/2) from the second analog signal output terminal TO12.

When second digital data 1 is received from the comparator CMP11, the control part CTL11 determines a second comparison result (Vin+Vin−Vr)>0 is obtained as a result of comparison, and controls the switch part 25 by the first control signal S11 and the second control signal S12 as described below.

The control part CTL11 sets the second control signal S12 to an active high level, and the first control signal S11 to a non-active low level.

Consequently, as shown in FIG. 22, the sixth switch SW16 and the seventh switch SW17 are held in a conductive state (ON), and the fifth switch SW15 and the eighth switch SW18 are held in a non-conductive state (OFF).

With this situation, the third analog signal (Vin−Vr/2) being output from the signal generation part 21 is input to the first amplifier AMP11 of the first output part 23, and the second analog signal (Vin−Vr) is input to the second amplifier AMP12 of the second output part 24.

The first amplifier AMP11 amplifies a first residual signal (Vin−Vr/2) supplied through the switch part 25 with predetermined amplification ratio A and outputs a signal A*(Vin−Vr/2) from the first analog signal output terminal TO11.

The second amplifier AMP12 amplifies a second residual signal (Vin−Vr) supplied through the switch part 25 with predetermined amplification ratio A and outputs a signal A*(Vin−Vr) from the second analog signal output terminal TO12.

As described above, the AD conversion stages 20 in FIG. 17 perform comparison on the basis of a comparison object value (threshold value) generated from two analog input voltages Vin and (Vin−Vr) themselves. Similarly, an analog residual signal is generated from two analog input voltages themselves.

Therefore, there is no part in the AD converter 10D where an accurate absolute value is necessary.

Though amplification ratio (gain) of the amplifiers AMP11 and AMP12 is controlled by the gain control part 40, amplifiers may be structured with simple differential amplifiers, because capacitor operation is also performed by open loop (closed loop is not used).

The description has been already provided on the example of the specific structure and functions of the 1-bit AD conversion stage 20.

Hereinafter, a description will be provided on a structure and operation of a 2-bit AD converter cascade-connected to a plurality of (2 in the description) AD conversion stages 20.

In order to facilitate understanding, an example is provided where a 2-bit AD converter is structured by cascade-connecting the first-stage and second-stage AD conversion stages 20-1 and 20-2 to each other.

Figure 23:
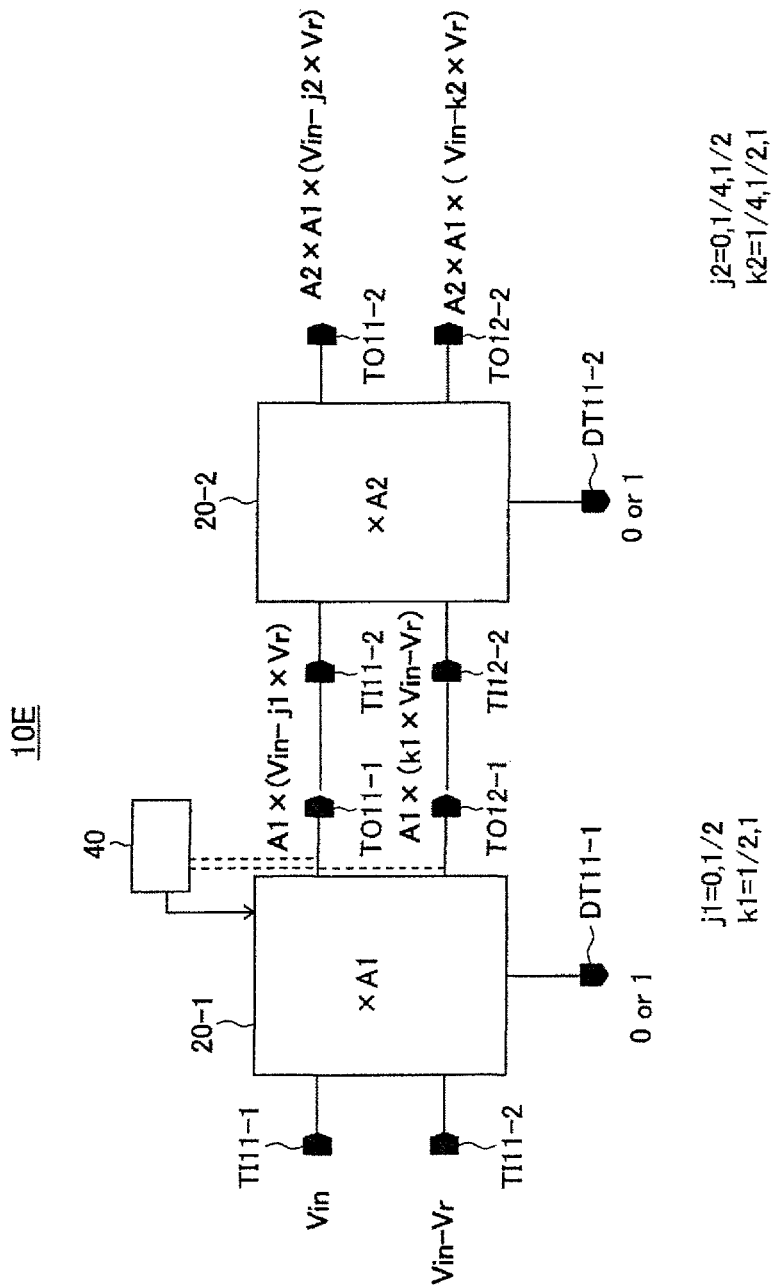
FIG. 23 is a block diagram showing a structure example of a 2-bit AD converter formed by cascade-connecting two AD conversion stages in FIG. 17.

FIG. 23 is a block diagram showing a structure example of a 2-bit AD converter formed by cascade-connecting two AD conversion stages in FIG. 17.

Figure 24:
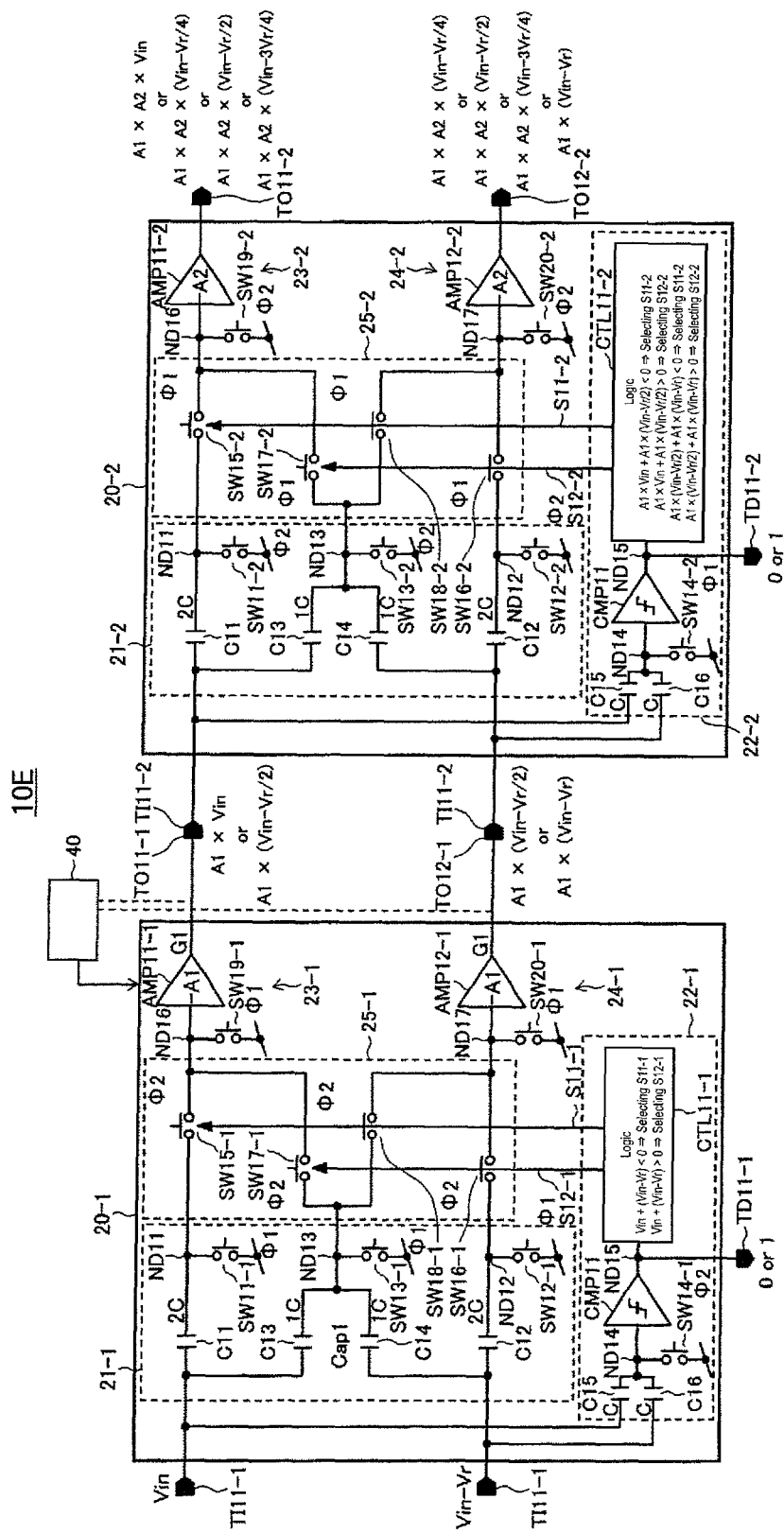
FIG. 24 is a circuit diagram showing a structure example of a 2-bit AD converter formed by cascade-connecting two AD conversion stages in FIG. 17.

FIG. 24 is a circuit diagram showing a structure example of a 2-bit AD converter formed by cascade-connecting two AD conversion stages in FIG. 17.

A 2-bit AD converter 10E is formed by cascade-connecting two 1-bit AD conversion stages in FIG. 17 as a 2-bit AD converter.

In an example, an open-loop pipeline-type AD converter is formed using an open-loop amplifier and open-loop capacitor operation.

In the AD converter 10E, the first-stage AD conversion stage 20-1 has the same structure as the 1-bit AD conversion stages in FIG. 17, and has the same operation effect.

The second-stage AD conversion stage 20-2 has a similar structure to that of the first-stage AD conversion stage 20-1.

Amplification ratio of amplifiers AMP11-1 and AMP12-1 of first and second output parts 23-1 and 24-1 is set to A1 in the first-stage AD conversion stage 20-1. And amplification ratio of amplifiers AMP11-2 and AMP12-2 of first and second output parts 23-2 and 24-2 is set to A2 in the second-stage AD conversion stage 20-2.

In the AD converter 10E, a first analog signal output terminal TO11-1 of the first-stage AD conversion stage 20-1 is connected to a first analog signal input terminal TI11-2 of the second-stage AD conversion stage 20-2.

Similarly, in the AD converter 10E, a second analog signal output terminal TO12-1 of the first-stage AD conversion stage 20-1 is connected to a second analog signal input terminal TI12-2 of the second-stage AD conversion stage 20-2.

Therefore, (A1*Vin) or {A1*(Vin−Vr/2)} is input from the first analog signal input terminal TI11-2 to the second-stage AD conversion stage 20-2 as a first analog signal.

Similarly, {A1*(Vin−Vr/2)} or {A1*(Vin−Vr)} is input from the second analog signal input terminal TI12-2 to the second-stage AD conversion stage 20-2 as a second analog signal.

A description is omitted here on operation of the first-stage AD conversion stage 20-1, because it has been already provided in the first embodiment. A basic change is amplification ratio being from A1 to A2.

As mentioned above, operation of the second-stage AD conversion stage 20-2 is basically similar to that in the first embodiment, but an input analog signal and analog signal output are changed.

Therefore, a description will be provided on operation of the second-stage AD conversion stage 20-2 focusing on a comparison part 22-2 and two analog signal outputs.

In the comparison part 22-2 in the second-stage AD conversion stage 20-2, the fifth capacitor C15 samples a first analog signal (A1*Vin) or {A1*(Vin−Vr/2)} that is an input signal during a conductive state of the fourth switch SW14. Then, voltage (A1*Vin) or {A1*(Vin−Vr/2)} sampled in predetermined timing is generated on the input node ND14 side of the comparator CMP11.

The sixth capacitor C16 samples a second analog signal {A1*(Vin−Vr/2)} or {A1*(Vin−Vr)} that is an input signal during a conductive state of the fourth switch SW14. Then, voltage {A1*(Vin−Vr/2)} or {A1*(Vin−Vr)} sampled in predetermined timing is generated on the input node ND14 side of the comparator CMP11.

As described above, the fifth capacitor C15 and the sixth capacitor C16 sample an input signal during a conductive state of the fourth switch SW14, and respective voltages sampled in predetermined timing are generated on the input node ND14 side of the comparator CMP11. Then, the voltages are synthesized and supplied to the comparator CMP11.

In this case, composite signal voltage is either {(A1*Vin)+A1*(Vin−Vr/2)} or {A1*(Vin−Vr/2)+A1*(Vin−Vr)}.

In the comparison part 22-2, the comparator CMP11 compares composite signal voltage {(A1*Vin)+A1*(Vin−Vr/2)} being input with 0V.

When a first comparison result {(A1*Vin)+A1*(Vin−Vr/2)}<0 is obtained, the comparator CMP11 outputs digital data 0 to a digital data output terminal TD11-2 and a control part CTL11-2 through the output node ND15.

When a second comparison result {(A1*Vin)+A1*(Vin−Vr/2)}>0 is obtained, the comparator CMP11 outputs digital data 1 to the digital data output terminal TD11-2 and the control part CTL11-2 through the output node ND15.

In the AD converter 10E, the comparator CMP11 of the second-stage AD conversion stage 20-2 performs comparison operation in timing where a second phase signal Φ2 is switched from a high level to a low level.

In the AD converter 10E, the comparator CMP11 of the first-stage AD conversion stage 20-1 performs comparison operation in timing where a first phase signal Φ1 is switched from a high level to a low level.

In the AD converter 10E, a first phase and a second phase are controlled so that the first-stage AD conversion stage 20-1 and the second-stage AD conversion stage 20-2 operate in reverse phases, because pipeline processing is applied.

When digital data 0 is received from the comparator CMP11, the control part CTL11-2 determines a first comparison result {(A1*Vin)+A1*(Vin−Vr/2)}<0 is obtained as a result of comparison. Then, the control part CTL11-2 controls the switch part 25-2 by a first control signal S11-2 and a second control signal S12-2 as described below.

The control part CTL11-2 controls the switch part 25-2 so that a first analog signal A1*Vin being output from the signal generation part 21-2 is input to the first output part 23-2, and a third analog signal A1*(Vin−Vr/4) is input to the second output part 24-2.

When digital data 1 is received from the comparator CMP11, the control part CTL11-2 determines a second comparison result {(A1*Vin)+A1*(Vin−Vr/2)}>0 is obtained as a result of comparison. Then, the control part CTL11-2 controls the switch part 25-2 by the first control signal S11-2 and the second control signal S12-2 as described below.

The control part CTL11-2 controls the switch part 25-2 so that a third analog signal A1*(Vin−Vr/4) from the signal generation part 21-2 is input to the first output part 23-2, and another third analog signal A1*(Vin−Vr/2) is input to the second output part 24-2.

The control part CTL11-2 determines to output which signal, the first control signal S11-2 or the second control signal S12-2, in an active high level, when a first phase signal Φ1 is switched from a low level to a high level.

On the other hand, the control part CTL11-1 determines to output which signal, the first control signal S11-1 or the second control signal S12-1, in an active high level, when a second phase signal Φ2 is switched from a low level to a high level.

The first output part 23-2 amplifies a first residual signal A1*Vin or A1*(Vin−Vr/4) supplied through the switch part 25-2 with predetermined amplification ratio A2 and outputs the signal from the first analog signal output terminal TO11-2.

That is, the first output part 23-2 outputs a first residual signal A1*A2*Vin or A1*A2*(Vin−Vr/4) from the first analog signal output terminal TO11-2.

The second output part 24-2 amplifies a second residual signal A1*(Vin−Vr/4) or A1*(Vin−Vr/2) supplied through the switch part 25-2 with predetermined amplification ratio A2 and outputs the signal from the second analog signal output terminal TO12.

That is, the second output part 24-2 outputs a second residual signal A1*A2*(Vin−Vr/4) or A1*A2*(vin−Vr/2) from the second analog signal output terminal TO12-2.

In the comparison part 22-2, the comparator CMP11 compares composite signal voltage {A1*(Vin−Vr/2)+A1*(Vin−Vr)} being input with 0V.

When a first comparison result {A1*(Vin−Vr/2)+A1*(Vin−Vr)}<0 is obtained, the comparator CMP11 outputs digital data 0 to the digital data output terminal TD11-2 and the control part CTL11-2 through the output node ND15.

When a second comparison result {A1*(Vin−Vr/2)+A1*(Vin−Vr)}>0 is obtained, the comparator CMP11 outputs digital data 1 to the digital data output terminal TD11-2 and the control part CTL11-2 through the output node ND15.

When digital data 0 is received from the comparator CMP11, the control part CTL11-2 determines a first comparison result {A1*(Vin−Vr/2)+A1*(Vin−Vr)}<0 is obtained as a result of comparison. Then, the control part CTL11-2 controls the switch part 25-2 by the first control signal S11-2 and the second control signal S12-2.

The control part CTL11-2 controls the switch part 25-2 so that a first analog signal A1*(Vin−Vr/2) being output from the signal generation part 21-2 is input to the first output part 23-2, and a third analog signal A1*(Vin−3Vr/4) is input to the second output part 24-2.

When digital data 1 is received from the comparator CMP11, the control part CTL11-2 determines a second comparison result $\{A1^*(Vin-Vr/2)+A1^*(Vin-Vr)\}>0$ is obtained as a result of comparison. Then, the control part CTL11-2 controls the switch part 25-2 by the first control signal S11-2 and the second control signal S12-2 as described below.

The control part CTL11-2 controls the switch part 25-2 so that a third analog signal $A1^*(Vin-3Vr/4)$ from the signal generation part 21-2 is input to the first output part 23-2, and a second analog signal $A1^*(Vin-Vr)$ is input to the second output part 24-2.

The first output part 23-2 amplifies a first residual signal $A1^*(Vin-Vr/2)$ or $A1^*(Vin-3Vr/4)$ supplied through the switch part 25-2 with predetermined amplification ratio A2 and outputs the signal from the first analog signal output terminal TO11-2.

That is, the first output part 23-2 outputs a first residual signal $A1^*A2^*(Vin-Vr/2)$ or $A1^*A2^*(Vin-3Vr/4)$ from the first analog signal output terminal TO11-2.

The second output part 24-2 amplifies a second residual signal $A1^*(Vin-3Vr/4)$ or $A1^*(Vin-Vr)$ supplied through the switch part 25-2 with predetermined amplification ratio A2 and outputs the signal from the second analog signal output terminal TO12.

That is, the second output part 24-2 outputs a second residual signal $A1^*A2^*(Vin-3Vr/4)$ or $A1^*A2^*(Vin-Vr)$ from the second analog signal output terminal TO12-2.

The 2-bit AD converter 10E basically performs 2-bit digital data output and two analog signal outputs with a condition of a large-small (high-low) relationship between a first analog signal Vin and full range voltage Vr corresponding to first reference voltage Vrt as described below.

In the case of Vin<Vr/4, digital data 00 is output from two digital data output terminals TD11-1 and TD11-2.

In the case of Vr/4<Vin<Vr/2, digital data Φ1 is output from two digital data output terminals TD11-1 and TD11-2.

In the case of Vr/2<Vin<3Vr/4, digital data 10 is output from two digital data output terminals TD11-1 and TD11-2.

In the case of 3Vr/4<Vin<Vr, digital data 11 is output from two digital data output terminals TD11-1 and TD11-2.

Also, a residual signal is output from two analog signal output terminals TO11-2 and TO12-2 on the basis of a comparison result.

Residual signals $A1^*Vin$ and $A1^*(Vin-Vr/4)$ are amplified by A2 times and output.

In another case, residual signals $A1^*(Vin-Vr/4)$ and $A1^*(Vin-Vr/2)$ are amplified by A2 times and output.

In another case, residual signals $A1^*(Vin-Vr/2)$ and $A1^*(Vin-3Vr/4)$ are amplified by A2 times and output.

In another case, residual signals $A1^*(Vin-3Vr/4)$ and $A1^*(Vin-Vr)$ are amplified by A2 times and output.

For example, when analog signal input Vin is 0<Vin<Vr/2 in the first-stage AD conversion stage 20-1, digital data 0 is output from the digital data output terminal TD11-1. Then, the AD conversion stage 20-1 outputs residual signals $A1^*Vin$ and $A1^*(Vin-Vr/2)$ from two analog signal output terminals TO11-1 and TO12-1.

In the case of $A1^*Vin > A1^*(Vin-Vr/2)$, which means Vr/4<Vin<Vr/2, the second-stage AD conversion stage 20-2 outputs digital data 1 from the digital data output terminal TD11-2. Then, the AD conversion stage 20-2 outputs residual signals $A2^*A1^*(Vin-Vr/4)$ and $A2^*A1^*(Vin-Vr/2)$ from two analog signal output terminals TO11-1 and TO12-1.

That is, the AD converter 10E having two-stage structure outputs 2-bit digital data 01 from two digital output signal terminals TD11-1 and TD11-2.

As mentioned above, in the 2-bit AD converter 10E, a first phase and a second phase are controlled so that the first-stage AD conversion stage 20-1 and the second-stage AD conversion stage 20-2 operate in reverse phases, because pipeline processing is applied.

Hereinafter, a description will be provided on the pipeline operation.

In the AD converter 10E in FIG. 24, the signal generation part 21-1, the first output part 23-1, and the second output part 24-1 in the first-stage AD conversion stage 20-1 perform sampling and reset operation with switches being conductive in a first phase. In the first-stage AD conversion stage 20-1, the signal generation part 21-1, the first output part 23-1, and the second output part 24-1 perform output and input of sampling voltage in a second phase.

Then, in the first-stage AD conversion stage 20-1, the comparison part 22-1 and the switch part 25-1 perform comparison determination and supply control of residual signals to the first output part 23-1 and the second output part 24-1 in a second phase.

On the contrary, in the second-stage AD conversion stage 20-2, the signal generation part 21-2, the first output part 23-2, and the second output part 24-2 perform sampling and reset operation with switches being conductive in a second phase. In the second-stage AD conversion stage 20-2, the signal generation part 21-2, the first output part 23-2, and the second output part 24-2 perform output and input of sampling voltage in a first phase.

Then, in the second-stage AD conversion stage 20-2, the comparison part 22-2 and the switch part 25-2 perform comparison determination and supply control of residual signals to the first output part 23-2 and the second output part 24-2 in a first phase.

Figure 25:
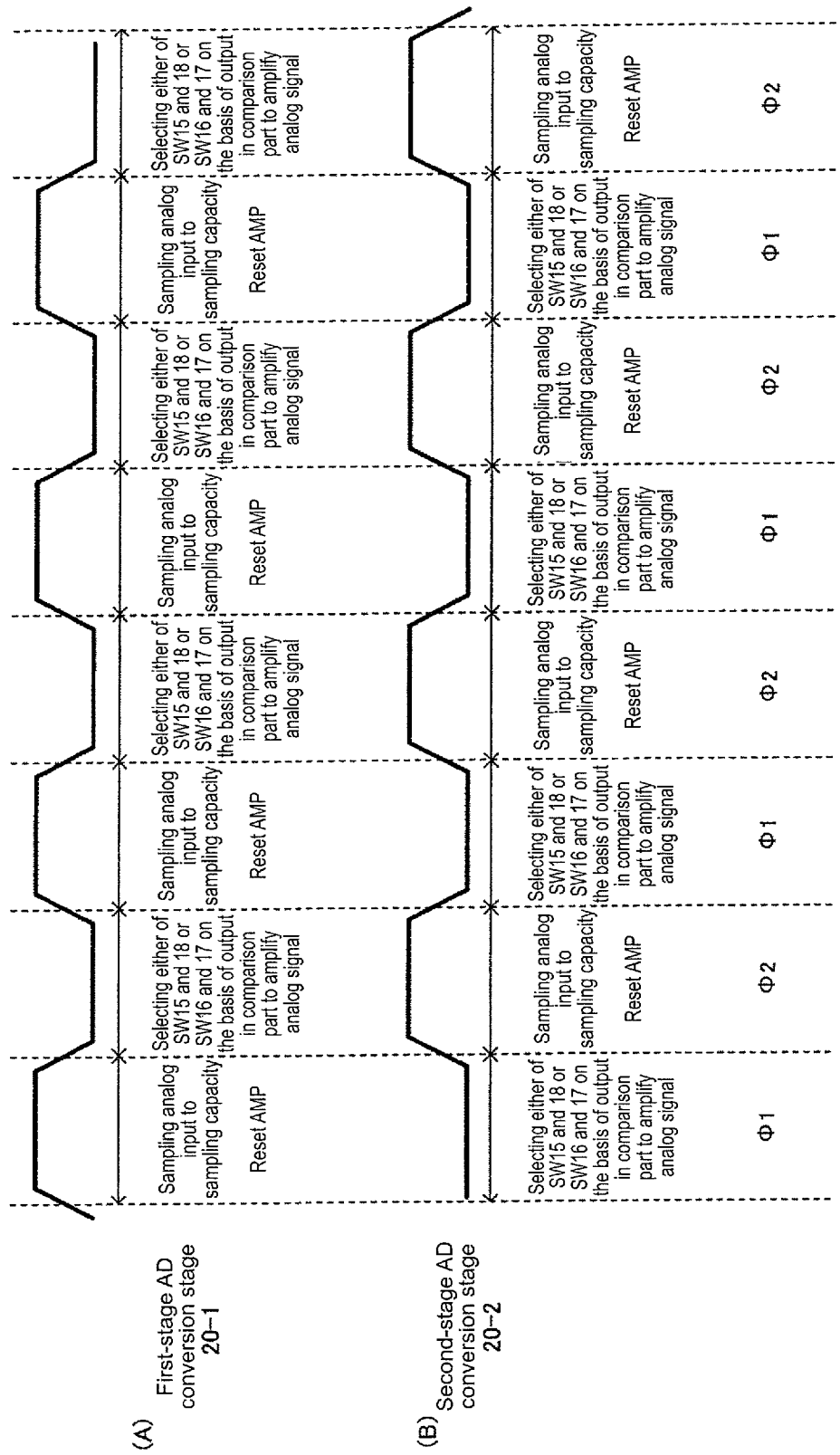
FIG. 25 is a diagram explaining pipeline operation of a 2-bit AD converter in FIG. 24 and showing an operation outline in respective phases.

The sections (A) and (B) in FIG. 25 are diagrams explaining pipeline operation of a 2-bit AD converter in FIG. 24 and showing an operation outline in respective phases.

The section (A) in FIG. 25 shows an operation outline of a first phase and a second phase of the first-stage AD conversion stage 20-1.

The section (B) in FIG. 25 shows an operation outline of a first phase and a second phase of the second-stage AD conversion stage 20-2.

A description will be provided on pipeline operation of the 2-bit AD converter 10E in FIG. 24 with reference to FIG. 25.

When a first phase signal Φ1 is in a high level, a first switch SW11-1, a second switch SW12-1, and a third switch SW13-1 of the signal generation part 21-1 are ON in the first-stage 1-bit AD conversion stage 20-1. Therefore, a first analog signal Vin and a second analog signal (Vin–Vr) are sampled by the first to fourth capacitors C11 to C14 that are sampling capacity.

At this time, the first amplifier AMP11-1 and the second amplifier AMP12-1 are reset, because a ninth switch SW19-1 of the first output part 23-1 and a tenth switch SW20-1 of the second output part 24-1 are ON.

The comparator CMP11 of the comparison part 22-1 performs comparison operation in timing where a first phase signal Φ1 is switched from a high level to a low level. Then, the control part CTL11-1 determines to set which one of the control signals S11-1 and S12-1 that control the switch part 25-1 to an active high level, when a second phase signal Φ2 is switched to a high level.

When a first phase signal Φ1 is in a low level, an analog signal is reset and a signal sampled by sampling capacity is transmitted to the first amplifier AMP11-1 and the second amplifier AMP12-1 through the switch part 25-1.

At this time, fifth and eighth switches SW15-1 and SW18-1 or sixth and seventh switches SW16-1 and SW17-1 selected by the control part CTL11-1 of the comparison part 22-1 are in a conductive state (ON).

Therefore, residual signals A1\*Vin and A1\*(Vin−Vr/2) or A1\*(Vin−Vr/2) and A1\*(Vin−Vr) are input to a second-stage 1-bit AD conversion stage 20-2 as first and second analog signals.

Furthermore, digital data 0 or 1 is output from the first-stage AD conversion stage 20-1.

The second-stage 1-bit AD conversion stage 20-2 performs switching operation in timing where phases are deviated by 180 degrees from switching operation in the first-stage 1-bit AD conversion stage 20-1, which means an operation phase described above becomes contrary.

That is, when a second phase signal Φ2 is in a high level, the first switch SW11-2, the second switch SW12-2, and the third switch SW13-2 of the signal generation part 21-2 are ON in the second-stage 1-bit AD conversion stage 20-2.

Therefore, a first analog signal A1\*Vin or A1\*(Vin−Vr/2) and a second analog signal A1\*(Vin−Vr/2) or A1\*(Vin−Vr) are sampled by the first to fourth capacitors C11 to C14 that are sampling capacity.

At this time, the first amplifier AMP11-2 and the second amplifier AMP12-2 are reset, because the ninth switch SW19-2 of the first output part 23-2 and the tenth switch SW20-2 of the second output part 24-2 are ON.

The comparator CMP11 of the comparison part 22-2 performs comparison operation in timing where a second phase signal Φ2 is switched from a high level to a low level. Then, when a first phase signal Φ1 is switched to a high level, the control part CTL11-2 determines to set which one of the control signals S11-2 and S12-2 that control the switch part 25-2, to an active high level.

When a second phase signal Φ2 is in a low level, an analog signal is reset and a signal sampled by sampling capacity is transmitted to the first amplifier AMP11-2 and the second amplifier AMP12-2 through the switch part 25-2.

At this time, the fifth and eighth switches SW15-2 and SW18-2 or the sixth and seventh switches SW16-2 and SW17-2 selected by the control part CTL11-2 of the comparison part 22-2 are in a conductive state (ON).

Therefore, residual signals A2\*A1\*Vin and A2\*A1\*(Vin−Vr/4) or residual signals A2\*A1\*(Vin−Vr/4) and A2\*A1\*(Vin−Vr/2) are output from the second-stage AD conversion stage 20-2.

In another case, residual signals A2\*A1\*(Vin−Vr/2) and A2\*A1\*(Vin−3Vr/4) or residual signals A2\*A1\*(Vin−3Vr/4) and A2\*A1\*(Vin−Vr) are output from the second-stage AD conversion stage 20-2.

Furthermore, digital data 0 or 1 is output from the second-stage AD conversion stage 20-2.

As described above, also in the AD conversion stages 20-1 and 20-2 of the AD converter 10E in FIG. 24, comparison is performed on the basis of a comparison object value (threshold value) generated from two analog input voltages themselves. Similarly, an analog residual signal is generated from two analog input voltages themselves.

Therefore, there is no part in the AD converter 10E where an accurate absolute value is necessary.

Though amplification ratio (gain) of the amplifiers AMP11 and AMP12 is controlled by the gain control part 40, amplifiers may be structured with simple differential amplifiers, because capacitor operation is also performed by open loop (closed loop is not used).

Figure 26:
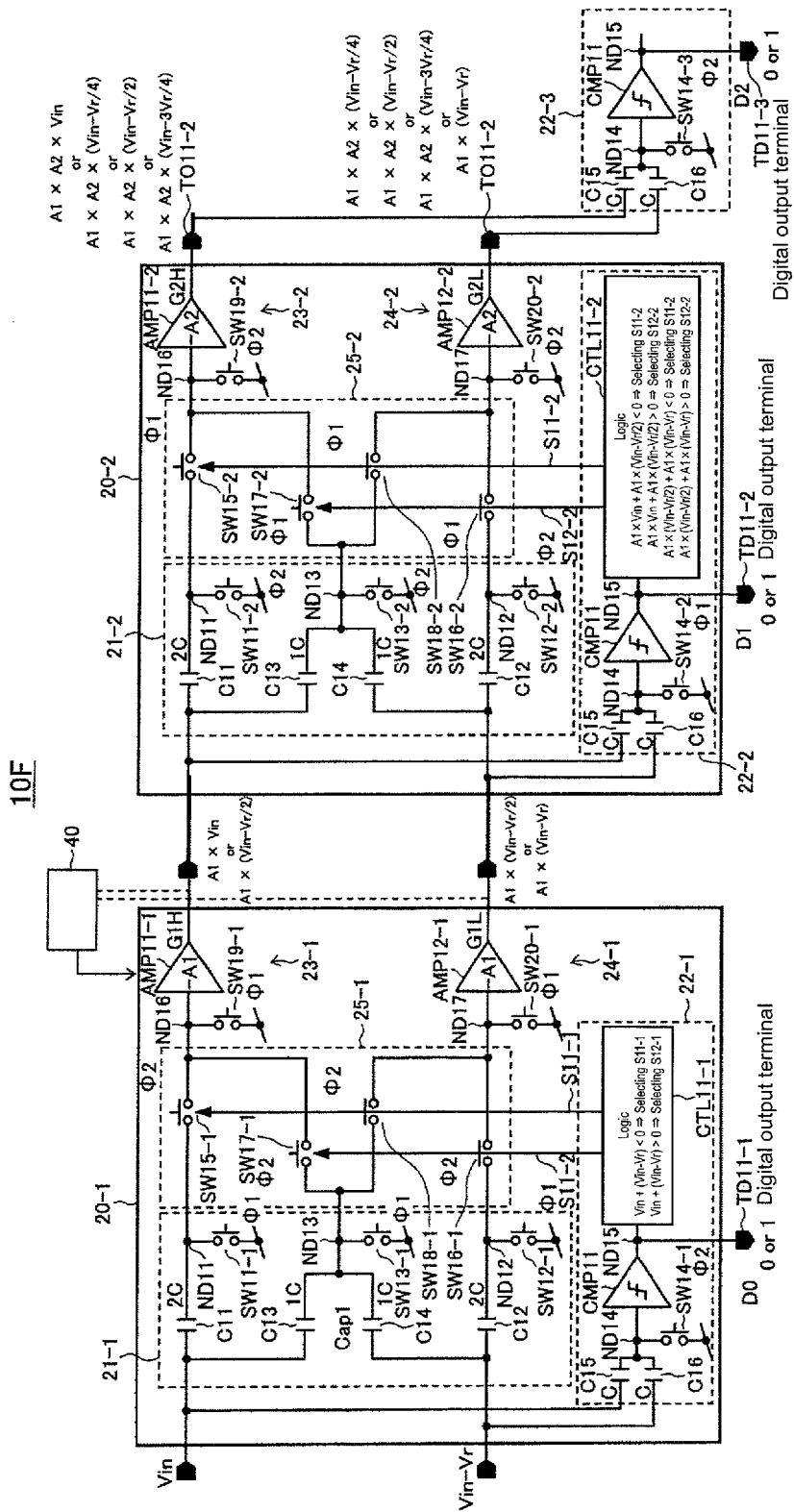
FIG. 26 is a circuit diagram showing a structure example of a 3-bit AD converter formed by cascade-connecting two AD conversion stages in FIG. 17.

FIG. 26 is a circuit diagram showing a structure example of a 3-bit AD converter formed by cascade-connecting two AD conversion stages in FIG. 17.

An AD converter 10F is formed as a 3-bit AD converter by arranging only a comparison part 22-3 of an AD conversion stage on an output side of the second-stage AD conversion stage of the 2-bit AD converter 10E in FIG. 24.

The structure corresponds to a case of N=3 in the AD converters 10 and 10A to 10C in FIG. 1 and FIG. 9 to FIG. 11.

The comparison part 22-3 does not include a control part, and output of the comparator CMP11 is connected to a digital data output terminal TD11-3.

The comparison part 22-3 operates in the same phase as a phase of the comparison part 22-1 of the first-stage AD conversion stage 20-1, and operates in a reverse phase which is deviated by 180 degrees from a phase of the comparison part 22-2 of the second-stage AD conversion stage 20-2.

In the comparison part 22-3 on an output side of the second-stage AD conversion stage 20-2, the fifth capacitor C15 samples a first analog signal that is an input signal during a conductive state of the fourth switch SW14.

Specifically, the fifth capacitor C15 samples a first analog signal (A1\*A2\*Vin), or {A1\*A2\*(Vin−Vr/4)} or {A1\*A2\*(Vin−Vr/2)} or {A1\*A2\*(Vin−3Vr/4).

Then, voltage (A1\*A2\*Vin), {A1\*A2\*(Vin−Vr/4)}, {A1\*A2\*(Vin−Vr/2)} or {A1\*A2\*(Vin−3Vr/4)} sampled in predetermined timing is generated on the input node ND14 side of the comparator CMP11.

The sixth capacitor C16 samples a second analog signal that is an input signal during a conductive state of the fourth switch SW14.

Specifically, the sixth capacitor C16 samples a second analog signal {(A1\*A2\*(Vin−Vr/4)), {A1\*A2\*(Vin−Vr/2)}, {A1\*A2\*(Vin−3Vr/4)}, or {A1\*A2\*(Vin−Vr)}.

Then, sampled voltage {A1\*A2\*(Vin−Vr/4)}, {A1\*A2\*(Vin−Vr/2)}, {A1\*A2\*(Vin−3Vr/4)}, or {A1\*A2\*(Vin−Vr)} is generated on the input node ND14 side of the comparator CMP11.

As described above, the fifth capacitor C15 and the sixth capacitor C16 sample an input signal during a conductive state of the fourth switch SW14, and respective voltages sampled in predetermined timing is generated on the input node ND14 side of the comparator CMP11. Then, the voltages are synthesized and supplied to the comparator CMP11.

In this case, four composite signal voltages exist as described below.

The first composite signal voltage is {(A1\*A2\*Vin)+A1\*A2\*(Vin−Vr/4)}.

The second composite signal voltage is {A1\*A2\*(Vin−Vr/4)+A1\*A2\*(Vin−Vr/2)}.

The third composite signal voltage is {A1\*A2\*(Vin−Vr/2)+A1\*A2\*(Vin−3Vr/4)}.

The fourth composite signal voltage is {A1\*A2\*(Vin−3Vr/4)+A1\*A2\*(Vin−Vr)}.

In the comparison part 22-3, the comparator CMP11 compares first composite signal voltage {(A1\*A2\*Vin)+A1\*A2\*(Vin−Vr/4)} being input with 0V.

When a first comparison result {(A1\*A2\*Vin)+A1\*A2\*(Vin−Vr/4)}<0 is obtained, the comparator CMP11 outputs digital data 0 to the digital data output terminal TD11-3 through the output node ND15.

When a second comparison result {(A1\*A2\*Vin)+A1\*A2\*(Vin−Vr/4)}>0 is obtained, the comparator CMP11 outputs digital data 1 to the digital data output terminal TD11-3 through the output node ND15.

In the comparison part 22-3, the comparator CMP11 compares second composite signal voltage {A1*A2*(Vin−Vr/4)+A1*A2*(Vin−Vr/2)} being input with 0V.

When a first comparison result {A1*A2*(Vin−Vr/4)+A1*A2*(Vin−Vr/2)}<0 is obtained, the comparator CMP11 outputs digital data 0 to the digital data output terminal TD11-3 through the output node ND15.

When a second comparison result {A1*A2*(Vin−Vr/4)+A1*A2*(Vin−Vr/2)}>0 is obtained, the comparator CMP11 outputs digital data 1 to the digital data output terminal TD11-3 through the output node ND15.

In the comparison part 22-3, the comparator CMP11 compares third composite signal voltage {A1*A2*(Vin−Vr/2)+A1*A2*(Vin−3Vr/4)} being input with 0V.

When a first comparison result {A1*A2*(Vin−Vr/2)+A1*A2*(Vin−3Vr/4)}<0 is obtained, the comparator CMP11 outputs digital data 0 to the digital data output terminal TD11-3 through the output node ND15.

When a second comparison result {A1*A2*(Vin−Vr/2)+A1*A2*(Vin−3Vr/4)}>0 is obtained, the comparator CMP11 outputs digital data 1 to the digital data output terminal TD11-3 through the output node ND15.

In the comparison part 22-3, the comparator CMP11 compares fourth composite signal voltage {A1*A2*(Vin−3Vr/4)+A1*A2*(Vin−Vr)} being input with 0V.

When a first comparison result {A1*A2*(Vin−3Vr/4)+A1*A2*(Vin−Vr)}<0 is obtained, the comparator CMP11 outputs digital data 0 to the digital data output terminal TD11-3 through the output node ND15.

When a second comparison result {A1*A2*(Vin−3Vr/4)+A1*A2*(Vin−Vr)}>0 is obtained, the comparator CMP11 outputs digital data 1 to the digital data output terminal TD11-3 through the output node ND15.

Therefore, a 3-bit AD converter may be structured by arranging only the third-stage comparator 22-3.

Figure 27:
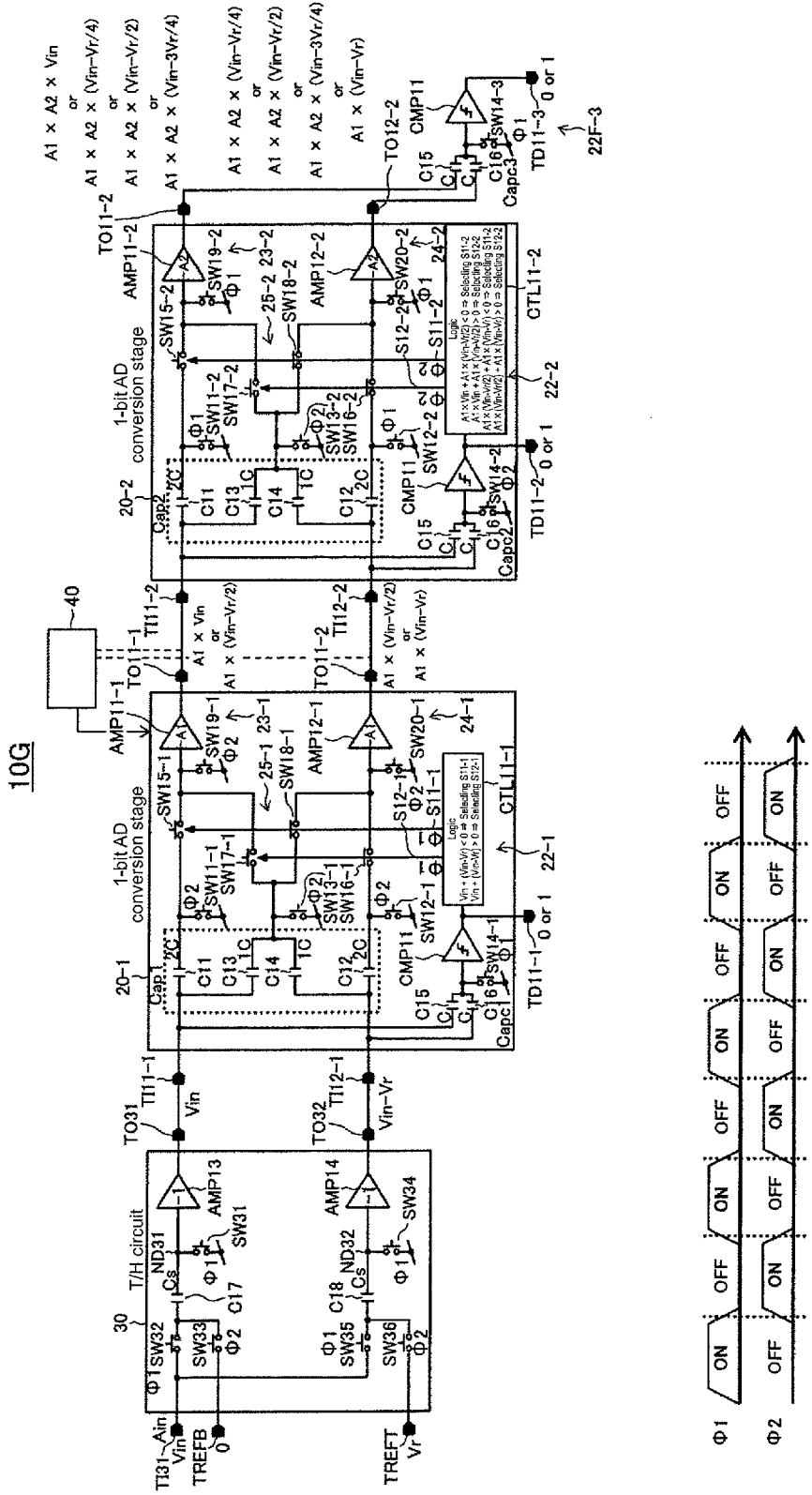
FIG. 27 is a circuit diagram showing a structure example of a 3-bit AD converter formed by cascade-connecting two AD conversion stages in FIG. 17.

FIG. 27 is a circuit diagram showing a structure example of a 3-bit AD converter formed by cascade-connecting two AD conversion stages in FIG. 17.

A 3-bit AD converter 10G is different from the AD converter 10F in FIG. 26 in following points.

In the 3-bit AD converter 10G, the analog signal generation stage 30 configured to generate a first analog signal Vin and a second analog signal (Vin−Vr) is arranged in an input stage of the first-stage AD conversion stage 20-1.

The analog signal generation stage 30 is formed as a comparison amplification circuit with a T/H (track and hold) function.

The structure corresponds to N-bit AD converters 10 and 10A to 10C in FIG. 1 and FIG. 9 to FIG. 11 in the case of N=3.

The analog signal generation stage 30 includes a third amplifier AMP13, a fourth amplifier AMP14, a seventh capacitor C17, and an eighth capacitor C18.

The analog signal generation stage 30 includes an eleventh switch SW31, a twelfth switch SW32, a thirteenth switch SW33, a fourteenth switch SW34, a fifteenth switch SW35, and a sixteenth switch SW36.

The analog signal generation stage 30 includes a third analog signal input terminal T131, a second reference voltage supply terminal TREFB, a first reference voltage supply terminal TREFT, a third analog signal output terminal TO31, and a fourth analog signal output terminal TO32.

The analog signal generation stage 30 includes an input node ND31 of the third amplifier AMP13, and an input node ND32 of the fourth amplifier AMP14.

An input terminal of the third amplifier AMP13 is connected to the input node ND31, and an output terminal is connected to the third analog signal output terminal 1031.

The eleventh switch SW31 is connected between the input node ND31 and fixed potential VC.

One end of the seventh capacitor C17 is connected to the third analog signal input terminal TI31 through the fifteen twelfth switch SW32, and is connected to the second reference voltage supply terminal TREFB through the thirteenth switch SW33. The other end of the seventh capacitor C17 is connected to the input node ND31 of the third amplifier AMP13.

An input terminal of the fourth amplifier AMP14 is connected to the input node ND32, and an output terminal is connected to the fourth analog signal output terminal TO32. The fourteenth switch SW34 is connected between the input node ND32 and fixed potential VC.

One end of the eighth capacitor C18 is connected to the third analog signal input terminal T131 through the switch SW35, and is connected to the first reference voltage supply terminal TREFT through the sixteenth switch SW36. The other end of the eighth capacitor C18 is connected to the input node ND32 of the fourth amplifier AMP14.

In the analog signal generation stage 30, the eleventh switch SW31, the twelfth switch SW32, the fourteenth switch SW34, and the fifteenth switch SW35 are in a conductive state (ON state), when a first phase signal Φ1 is in an active high level.

At this time, the signal generation part 21-1 of the first-stage AD conversion stage 20-1, and the first and second output parts 23-1 and 24-1 operate in a second phase, while the comparison part 22-1 and the switch part 25-1 operate in a first phase.

The signal generation part 21-2 of the second-stage AD conversion stage 20-2, and the first and second output parts 23-2 and 24-2 operate in a first phase, while the comparison part 22-2 and the switch part 25-2 operate in a second phase.

And the third-stage comparison part 22-3 operates in a first phase.

In the analog signal generation stage 30, the thirteenth switch SW33 and the sixteenth switch SW36 are in a conductive state, when a second phase signal Φ2 is in an active high level.

The AD converter 10G in FIG. 27 is also formed as an open-loop pipeline-type AD converter using an open-loop amp and open-loop capacitor operation.

As mentioned above, the AD converter 10G has an input range (voltage) being from 0 to Vr, and includes the analog signal generation stage 30 that is a T/H circuit configured to sample an input signal Vin and generate Vin (a value calculated by subtracting 0 from Vin) and (Vin−Vr).

Also, two AD conversion stages 20-1 and 20-2 configured to perform 1-bit conversion per one stage and output digital data and residual analog signals on the basis of a comparison result are serially connected (cascade-connected).

Furthermore, the AD converter 10G in FIG. 27 is an open-loop pipeline-type AD converter with 3-bit resolution structured by connecting a 1-bit comparator 22-3 for output in the second-stage AD conversion stage 20-2.

Figure 28:
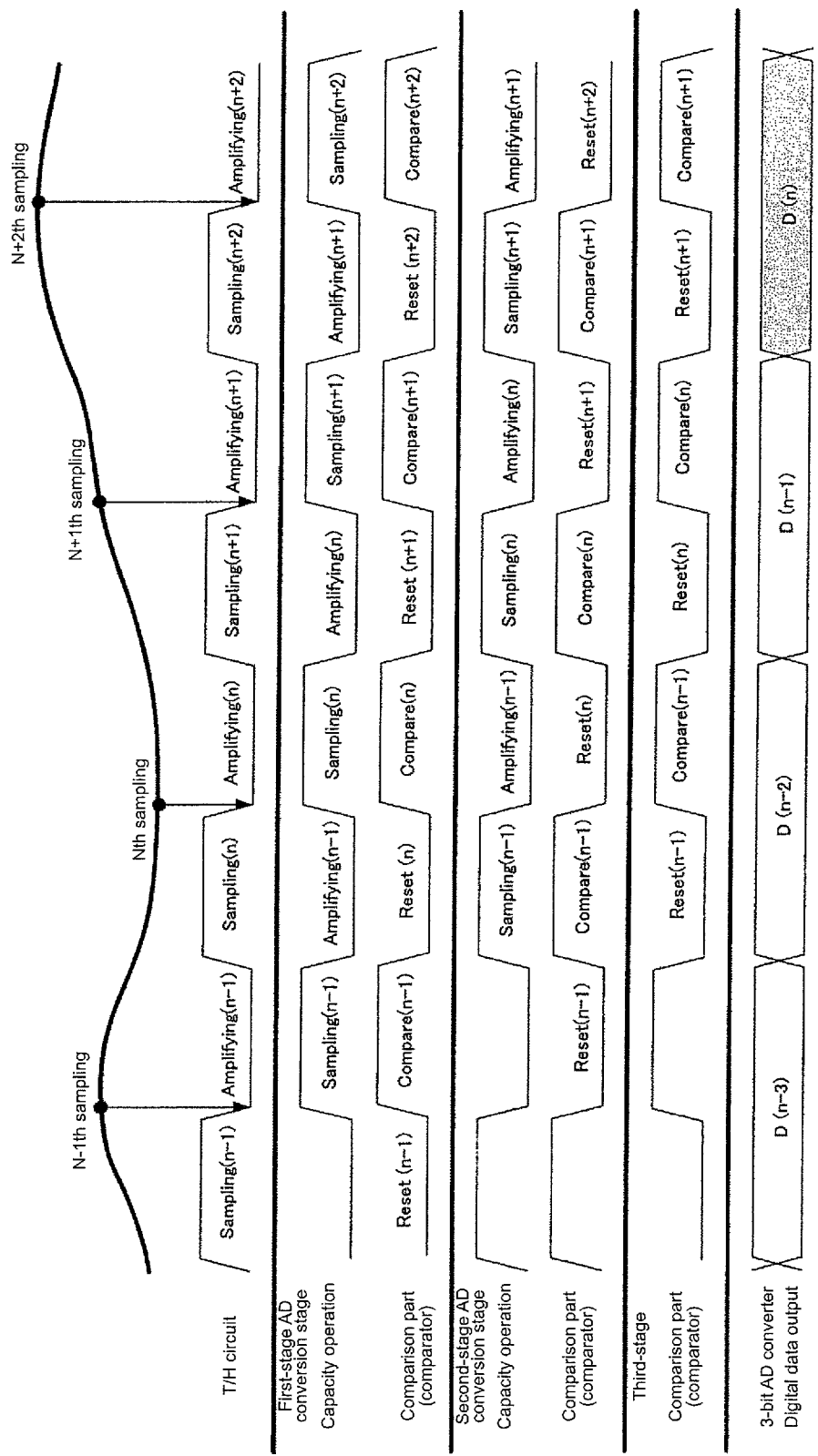
FIG. 28 is a timing chart showing an operation outline of a 3-bit AD converter.

FIG. 28 is a timing chart showing an operation outline of a 3-bit AD converter.

A description will be provided on operation of a 3-bit AD converter.

When a first phase signal (clock) Φ1 is in a high level, the eleventh, twelfth, fourteenth, and fifteenth switches SW31, SW32, SW33, SW34, and SW35 are in a conductive state (ON) in the signal generation stage (T/H circuit) 30.

Therefore, in the analog signal generation stage 30, an n-th analog input signal Vin(n) is sampled by the seventh and eighth capacitors C17 and C18 (Cs).

When a first phase signal (clock) Φ1 is in a low level, the eleventh, twelfth, fourteenth, and fifteenth switches SW31, SW32, SW34, and SW35 are in a non-conductive state (OFF), and the thirteenth and sixteenth switches SW33 and SW36 are in a conductive state (ON).

Therefore, the analog signal generation stage 30 outputs an n-th residual analog signal (Vin(n)-0)=Vin(n) and (Vin−Vr(n)) from the third analog signal output terminal 1031 and the fourth analog signal output terminal 1032 respectively.

At this time, the first to third switches SW11-1 to SW13-1 of the signal generation part 21-1 are ON in the first-stage 1-bit AD conversion stage. Therefore, output signals Vin(n) and (Vin−Vr(n)) from the analog signal generation stage 30 are sampled by the first to fourth capacitors C11 to C14.

In parallel, the fourth switch SW14-1 of the comparison part 22-1 is in a non-conductive state (OFF).

Consequently, in the comparison part 22-1, operation of n-th residual analog signals Vin(n) and Vin−Vr(n) is performed through the fifth and sixth capacitors C15 and C16, and the comparator CMP11 compares sizes of residual analog signals Vin(n) and (Vin−Vr(n)) with each other.

When the first phase signal (clock) Φ1 is in a high level again, the analog signal generation stage (T/H circuit) samples an (n+1)-th analog signal.

At this time, the first to third switches SW11-1 to SW13-1 are OFF in the first-stage 1-bit AD conversion stage 20-1. And selection of control signals S11-1 and S11-2 is determined on the basis of a comparison result of the comparator CMP11 of the comparison part 22-1.

That is, in the case of |Vin(n)|<|Vin(n)−Vr|, a control signal S11-1 is selected in the AD conversion stage 20-1, and signals A1*Vin and A1*(Vin−Vr/2) are output from the first amplifier AMP11-1 and the second amplifier AMP12-1 respectively.

Also, digital data 0 is output from the digital data output terminal TD11-1.

In the case of |Vin|>|Vin−Vr|, a control signal S12-1 is selected by the comparison part 22-1 in the AD conversion stage 20-1. Consequently, a signal A1*(Vin−Vr/2) is output from the first amplifier AMP11-1, and a signal A1*(Vin−Vr) is output from the second amplifier AMP12-1. Also, digital data 1 is output from the digital data output terminal TD11-1.

Two analog residual signals being output from the first and second analog signal output terminals TO11-1 and TO12-1 are sampled by the first to fourth capacitors C11 to C14 of the signal generation part 21-2 in the second-stage 1-bit AD conversion stage 20-2.

Then, the second-stage AD conversion stage 20-2 also outputs digital data and analog residual signals by repeating the same operation as in the first stage.

Finally, the two analog residual signals are compared to each other by the comparison part 22-3, and 3-bit data is output from the digital data output terminals TD11-1, TD11-2, and TD11-3.

The AD converter 10G has significant features described below.

The each-stage AD conversion stages perform comparison on the basis of a threshold value generated from two analog input voltages themselves. Similarly, analog residual signals are also generated from two analog input signal voltages themselves.

Therefore, there is no part in the AD conversion stages or between AD conversion stages being serially connected where an accurate absolute value is necessary.

The structure reduces the necessity of accurately controlling gain of the amplifiers AMP11 and AMP12, and capacitor operation is performed by open loop (closed loop is not used).

Therefore, the amplifiers AMP11 and AMP12 in respective stages may be structured with simple differential amplifiers as shown in FIG. 3.

Figure 29:
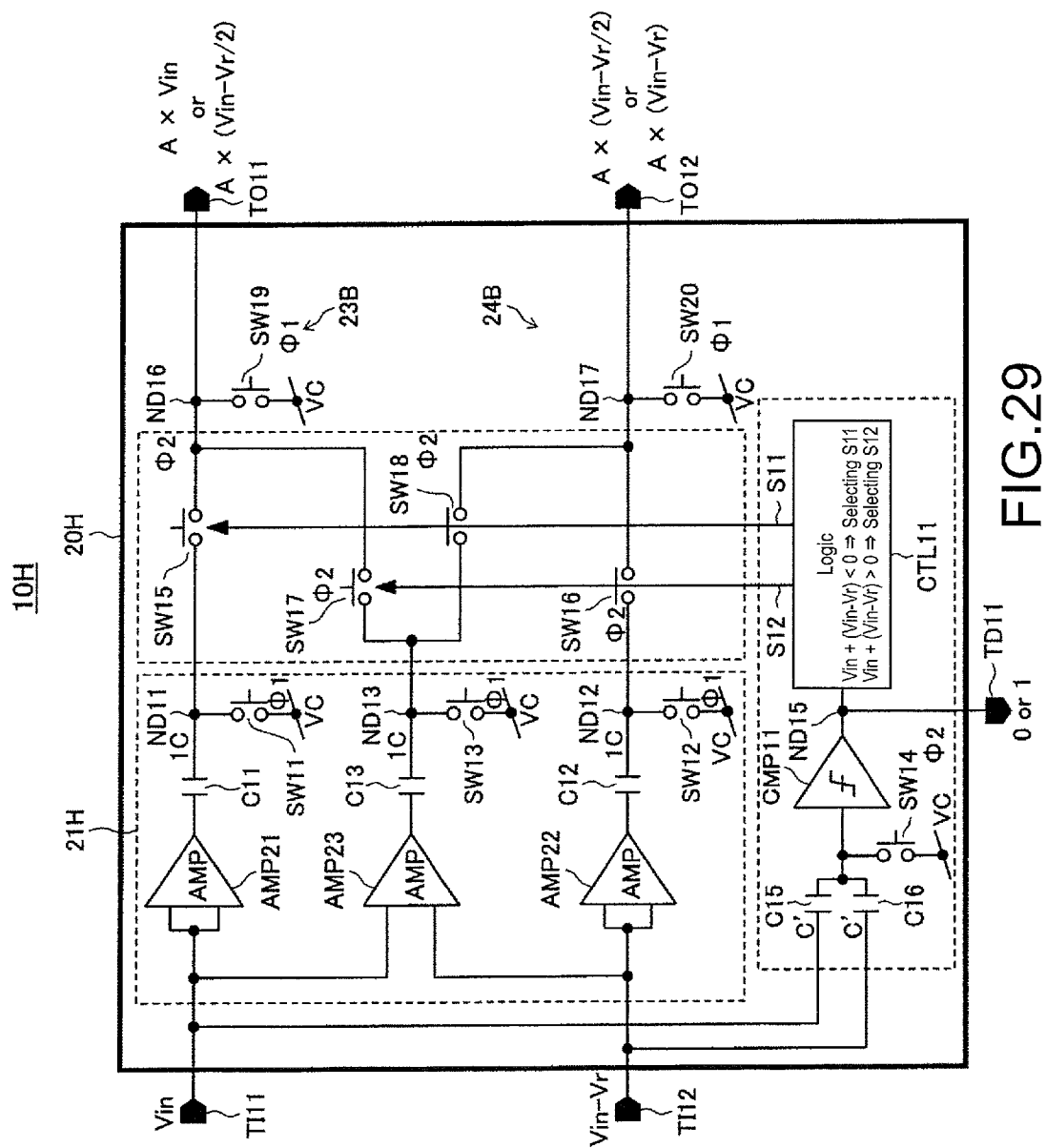
FIG. 29 is a circuit diagram showing another structure example of a 1-bit AD conversion stage according to the embodiment.

Though explanation has been given on the AD converter applying the structure in FIG. 17 as the structure of the AD conversion stages 20, another structure, for example, shown in FIG. 29 may be also applied to the AD conversion stages 20.

FIG. 29 is a circuit diagram showing another structure example of a 1-bit AD conversion stage according to the embodiment.

An AD converter 10H according to a second embodiment is different from the AD converter 10D in FIG. 17 in a point where interpolation by an amplifier (amp) is applied for generation of a third analog signal (Vin−Vr/2) in a signal generation part 21H.

The signal generation part 21H applying the amp interpolation includes differential-type amplifiers AMP21, AMP22, and AMP23.

In the signal generation part 21H, a first capacitor C11, a second capacitor C12, and a third capacitor C13, excluding the fourth capacitor in FIG. 17, are arranged to have a capacity value 1C.

In the amplifier AMP21, a first analog signal Vin is supplied to two input terminals to amplify the first analog signal Vin with predetermined amplification ratio.

In the amplifier AMP21, an output terminal is connected to one end of the first capacitor C11. The other end of the first capacitor C11 is connected to the first output node ND11.

In the amplifier AMP22, a second analog signal (Vin−Vr) is supplied to two input terminals to amplify the second analog signal (Vin−Vr) with predetermined amplification ratio. In the amplifier AMP22, an output terminal is connected to one end of the second capacitor C12. The other end of the second capacitor C12 is connected to the second output node ND12.

In the amplifier AMP23, a first analog signal Vin is supplied to one of the input terminal and a second analog signal (Vin−Vr) is supplied to the other terminal to amplify intermediate voltage between the first analog signal Vin and the second analog signal (Vin−Vr). In the amplifier AMP23, an output terminal is connected to one end of the third capacitor C13. The other end of the third capacitor C13 is connected to the second output node ND13.

In the AD conversion stage 20H in FIG. 29, other parts of the structure are similar to those of the AD conversion stages 20 in FIG. 17, and actions and effects similar to those of the AD conversion stages in FIG. 17 mentioned above may be obtained.

As described above, the AD conversion stages 20 in the embodiment perform comparison on the basis of a comparison object value (threshold value) generated from two analog input voltages Vin and (Vin−Vr) themselves. Similarly, analog residual signals are also generated from the two analog input voltages themselves.

Therefore, as shown in FIG. 30(B), there is no part where an accurate absolute value is necessary when compared to a case where a closed-loop operation amplifier in related art is used in an AD converter as shown in FIG. 30(A).

The structure reduces the necessity of precisely controlling amplification ratio (gain) of the amplifiers AMP11 and AMP12, and the amplifiers may be structured with simple differential amplifiers, because capacitor operation is performed by open loop (closed loop is not used).

As described above, according to the embodiment, an AD converter may be realized not using a closed-loop operation amplifier with high accuracy (high gain).

That is, according to the embodiment, a pipeline-type AD converter (open-loop pipeline-type AD converter) based on an open-loop amplifier with low gain and capacitor operation by open loop may be realized.

Therefore, an AD converter according to the embodiment may realize low-voltage operation, low-power operation, and high-speed operation with a small area.

And gain of amplifiers in an output stage may be accurately controlled.

4. A Structure Example of a Signal Processing System

Figure 31:
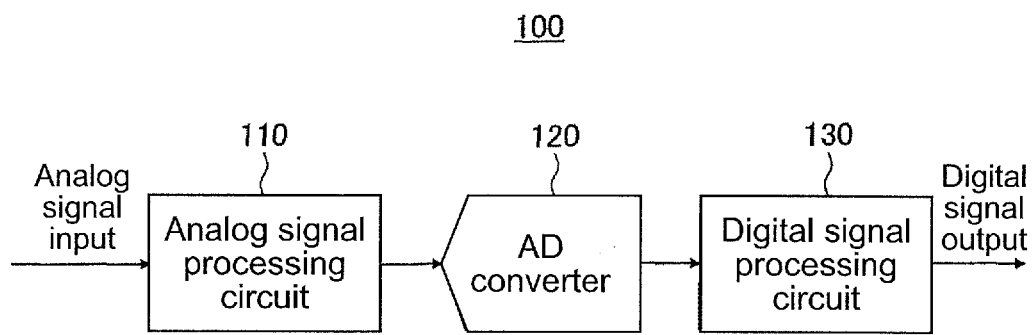
FIG. 31 is a block diagram showing a structure example of a signal processing system according to the embodiment.

FIG. 31 is a block diagram showing a structure example of a signal processing system according to the embodiment.

A signal processing system 100 is formed as a signal processing system applicable for the AD converters 10 to 10H mentioned above. As the signal processing system 100, for example, a camera signal processing system is illustrated.

The signal processing system 100 includes an analog signal processing circuit 110, an AD converter 120, and a digital signal processing circuit 130.

In the signal processing system 100, any one of the AD converters 10 to 10H mentioned above is applicable as the AD converter 120.

In the signal processing system 100 in FIG. 31, size reduction and high efficiency are expected by performing signal processing with the digital signal processing circuit 130 as much as possible to reduce a scale of the analog signal processing circuit 110.

In order to realize a system described above, which means to perform signal processing with the digital signal processing circuit 130 instead of the analog signal processing circuit 110 that performed the processing in the past, AD conversion should be performed with information loss of original signals as least as possible. Therefore, an AD converter having high SN ratio is necessary.

In order to realize high SN ratio, there are two conditions should be met: <1> increase resolution (the number of bits); and <2> reduce noise of a circuit. Also, an AD converter should perform conversion at high speed. It is because information amount to be handled has increased with the sophistication of a system.

As an example of the AD converter 120 that meets these conditions, the AD converters 10 to 10H are applicable that also function as pipeline-type AD converters.

In the embodiments mentioned above, explanation has been given with an example of single operation, but the present technology is applicable in either one of single operation and differential operation.

The present technology may also take the following structures.

(1) An analog-digital converter, including:
a plurality of cascade-connected analog-digital (AD) conversion stages configured to generate digital data having a value corresponding to a relationship between two analog signals being input and amplify two analog residual signals with a first amplifier and a second amplifier respectively with gain to be controlled to output the signals; and
a gain control part configured to monitor the output signals of the first amplifier and the second amplifier to control gain of the first amplifier and the second amplifier on the basis of a monitoring result, wherein
the first amplifier and the second amplifier are formed of open-loop amplifiers, and
the gain control part
takes out amplitude information of the output signals of the first amplifier and the second amplifier in at least one of the AD conversion stages and performs gain control so that amplitude of the analog signals being output from the stage converges on setting amplitude being set.

(2) The analog-digital converter according to Item (1), in which
the gain control part
takes out a difference between positive phase signals or reverse phase signals of the output signals of the first amplifier and the second amplifier and compares the difference information with setting amplitude information to perform gain control on the basis of a comparison result.

(3) The analog-digital converter according to Item (1), in which
the gain control part
takes out differential signal components of the output signals of the first amplifier and the second amplifier and compares a sum of differential amplitude being taken out with setting amplitude information to perform gain control on the basis of a comparison result.

(4) The analog-digital converter according to Item (1), in which
the gain control part
takes out a difference between positive phase signals and a difference between reverse phase signals of the output signals of the first amplifier and the second amplifier and compares an average of the difference between positive phase signals and the difference between reverse phase signals with setting amplitude information to perform gain control on the basis of a comparison result.

(5) The analog-digital converter according to any one of Items (1) to (4), in which
the gain control part
monitors the output signals of the first amplifier and the second amplifier in all the AD conversion stages to control gain of the first amplifier and the second amplifier in respective output stages on the basis of a monitoring result.

(6) The analog-digital converter according to any one of Items (1) to (4), in which
the gain control part
monitors the output signals of the first amplifier and the second amplifier at intervals of a plurality of stages to control gain of the first amplifier and the second amplifier in output stages on the basis of a monitoring result.

(7) The analog-digital converter according to any one of Items (1) to (4), further including:
an analog signal generation stage configured to generate two analog signals and amplify the signals with a third amplifier and a fourth amplifier respectively with gain to be controlled to output the signals to an initial-stage AD conversion stage, in which
the gain control part
monitors output of the first amplifier and the second amplifier in one of second and subsequent-stage AD conversion stages to control gain of the third amplifier and the fourth amplifier in the analog signal generation stage.

(8) The analog-digital converter according to any one of Items (1) to (7), in which
each of the AD conversion stages includes
a signal generation part configured to input a first analog signal having a voltage value corresponding to a difference between a voltage value between two voltages, first reference voltage and second reference voltage, and the second reference voltage, and a second analog signal having a voltage value corresponding to a difference between a voltage value of the first analog signal and difference voltage between the two voltages, the first reference voltage and the second reference voltage, and generate at least one third analog signal having an intermediate voltage value generated from the voltage value of the first analog signal and a voltage value of the second analog signal, to output the first analog signal, the second analog signal, and the third analog signal, a comparison part configured to input the first analog signal and the second analog signal and compare the voltage value of the first analog signal with the voltage value of the second analog signal to output digital data having a value based on a comparison result, a first output part that includes the first amplifier and is configured to amplify a first residual signal with predetermined gain to output the signal, a second output part that includes the second amplifier and is configured to amplify a second residual signal with predetermined gain to output the signal, and a switch part configured to switch input of the first analog signal, the second analog signal, and the third analog signal being output from the signal generation part to the first output part and the second output part on the basis of a comparison result of the comparison part, the comparison part
   outputs first digital data when a first comparison result is obtained where the voltage value of the first analog signal is lower than the voltage value of the second analog signal, and outputs second digital data when a second comparison result is obtained where the voltage value of the first analog signal is higher than the voltage value of the second analog signal, and the switch part
   inputs the first analog signal being output from the signal generation part to the first output part as the first residual signal and inputs the third analog signal to the second output part as the second residual signal, when the first comparison result is obtained in the comparison part, and
   inputs the third analog signal being output from the signal generation part to the first output part as the first residual signal and inputs the second analog signal to the second output part as the second residual signal, when the second comparison result is obtained in the comparison part.

(9) The analog-digital converter according to Item (8), in which
   each of the plurality of AD conversion stages includes
   a first analog signal input terminal configured to input the first analog signal,
   a second analog signal input terminal configured to input the second analog signal,
   a first analog signal output terminal,
   a second analog signal output terminal, and
   a digital data output terminal,
   the first analog signal input terminal in an AD conversion stage on a subsequent-stage side is connected to the first analog signal output terminal in an AD conversion stage on a preceding-stage side and inputs a first residual signal being output from a preceding stage as the first analog signal,
   the second analog signal input terminal in the AD conversion stage on the subsequent-stage side is connected to the second analog signal output terminal in the AD conversion stage on the preceding-stage side and inputs a second residual signal being output from a preceding stage as the second analog signal, and
   in a first-stage AD conversion stage
      the first analog signal input terminal inputs the first analog signal having a voltage value between the reference voltage and full range voltage, and
      the second analog signal input terminal inputs the second analog signal having a voltage value corresponding to a difference between the voltage value of the first analog signal to be input to the first analog signal input terminal and the full range voltage.

(10) The analog-digital converter according to Item (8) or (9), in which
   at least the first-stage AD conversion stage
   inputs the first analog signal (0<Vin<Vr) having voltage Vin and the second analog signal having voltage (Vin−Vr) calculated by subtracting full range voltage Vr from voltage Vin of the first analog signal,
   compares two analog input voltages |Vin| and |Vin−Vr| to each other by the comparison part, and when the first analog signal voltage is lower than the second analog signal voltage |Vin|<|Vin−Vr| and Vin<Vr/2, outputs digital data 0 from the digital data output terminal and outputs A*Vin and A*(Vin−Vr/2) being increased by A times with amplification ratio A from the first and second analog signal output terminals respectively, and
   outputs digital data 1 from the digital data output terminal and outputs A*(Vin−Vr/2) and A*(Vin−Vr) being increased by A times with amplification ratio A from the first and second analog signal output terminals respectively, when the first analog signal voltage is higher than the second analog signal voltage |Vin|>|Vin−Vr| and Vin>Vr/2.

(11) The analog-digital converter according to any one of Items (8) to (10), in which
   two of the AD conversion stages are cascade-connected to each other, and
   the first-stage AD conversion stage
   inputs the first analog signal (0<Vin<Vr) having voltage Vin and the second analog signal having voltage (Vin−Vr) calculated by subtracting full range voltage Vr from voltage Vin of the first analog signal,
   each of the AD conversion stages
   outputs digital data 00 from two of the digital data output terminals in the case of Vin<Vr/4,
   outputs digital data Φ1 from two of the digital data output terminals in the case of Vr/4<Vin<Vr/2,
   outputs digital data 10 from two of the digital data output terminals in the case of Vr/2<Vin<3Vr/4, and
   outputs digital data 11 from two of the digital data output terminals in the case of 3Vr/4<Vin<Vr, and
   from the first and second analog signal output terminals on the basis of a comparison result in the comparison part, the second-stage AD conversion stage
      amplifies residual signals A*Vin and A*(Vin−Vr/4) by A times to output the signals, or
      amplifies residual signals A*(Vin−Vr/4) and A*(Vin−Vr/2) by A times to output the signals, or
      amplifies residual signals A*(Vin−Vr/2) and A*(Vin−3Vr/4) by A times to output the signals, or
      amplifies residual signals A*(Vin−3Vr/4) and A*(Vin−Vr) by A times to output the signals.

(12) The analog-digital converter according to any one of Items (8) to (11), further including:
   a final-stage comparison part configured to input residual signals being output from the first analog signal output terminal and the second analog signal output terminal in a final-stage AD conversion stage as the first analog signal and the second analog signal, in which
the final-stage comparison part
inputs the first analog signal and the second analog signal and compares the voltage value of the first analog signal with the voltage value of the second analog signal to output digital data having a value corresponding to a comparison result.

(13) The analog-digital converter according to any one of Items (8) to (12), in which
the plurality of AD conversion stages
control respective timing of sampling of two analog input signals, comparison, and analog signal output, and digital data output, by synchronizing with a clock signal, and
perform processing of sampling of two analog input signals, comparison, and analog signal output and digital data output, by synchronizing with a clock signal in a pipeline system, with provision of a clock signal to be input in an adjacent AD conversion stage on a reverse phase.

(14) The analog-digital converter according to any one of Items (8) to (13), in which
the signal generation part includes at least each one of
a first capacitor having one end connected to an input line for the first analog signal and the other end connected to a first output node to output the first analog signal,
a second capacitor having one end connected to an input line for the second analog signal and the other end connected to a second output node to output the second analog signal,
a third capacitor having one end connected to an input line for the first analog signal and the other end connected to a third output node to output the third analog signal,
a fourth capacitor having one end connected to an input line for the second analog signal and the other end connected to the third output node to output the third analog signal,
a first switch connected between the first output node and fixed potential,
a second switch connected between the second output node and fixed potential, and
a third switch connected between the third output node and fixed potential,
the first capacitor
samples an input signal with the first switch being in a conductive state and outputs sampled voltage from the first output node in a non-conductive state,
the second capacitor
samples an input signal with the second switch being in a conductive state and outputs sampled voltage from the second output node in a non-conductive state, and
the third capacitor and the fourth capacitor
sample an input signal with the third switch being in a conductive state and outputs respective sampled voltages in a non-conductive state so that the respective voltages are synthesized to be output from the third output node.

(15) The analog-digital converter according to any one of Items (8) to (14), in which
the comparison part includes at least each one of
a comparator configured to compare input voltage with the reference voltage,
a fifth capacitor having one end connected to an input line for the first analog signal and the other end connected to an input node of the comparator,
a sixth capacitor having one end connected to an input line for the second analog signal and the other end connected to the input node of the comparator, and
a fourth switch connected between the input node of the comparator and fixed potential, and
the fifth capacitor and the sixth capacitor
sample an input signal with the fourth switch being in a conductive state and output respective sampled voltages in a non-conductive state so that the respective voltages are synthesized to be input to the comparator.

(16) The analog-digital converter according to any one of Items (8) to (15), in which
the switch part includes at least each of
a fifth switch connected between the first output node of the signal generation part and a first input node configured to input the first residual signal to the first output part,
a sixth switch connected between the second output node of the signal generation part and a second input node configured to input the second residual signal to the second output part,
a seventh switch connected between the third output node of the signal generation part and the first input node configured to input the first residual signal to the first output part, and
an eighth switch connected between the third output node of the signal generation part and the second input node configured to input the second residual signal to the second output part,
when the first comparison result is obtained in the comparison part, the fifth switch and the eighth switch are held in a conductive state and the sixth switch and the seventh switch are held in a non-conductive state, and
when the second comparison result is obtained in the comparison part, the fifth switch and the eighth switch are held in a non-conductive state and the sixth switch and the seventh switch are held in a conductive state.

(17) The analog-digital converter according to any one of Items (8) to (16), in which
the first output part includes
a ninth switch connected between the first input node and fixed potential, and
a first amplifier configured to amplify a first residual signal to be input to the first input node with predetermined amplification ratio, and
the second output part includes
a tenth switch connected between the second input node and fixed potential, and
a second amplifier configured to amplify a second residual signal to be input to the second input node with predetermined amplification ratio.

(18) A signal processing system, including:
an analog-digital (AD) converter configured to convert analog signals from an analog signal processing system into digital signals, in which
the AD converter includes
a plurality of cascade-connected analog-digital (AD) conversion stages configured to generate digital data having a value corresponding to a relationship between two analog signals being input and amplify two analog residual signals with a first amplifier and a second amplifier respectively with gain to be controlled to output the signals, and
a gain control part configured to monitor the output signals of the first amplifier and the second amplifier to control gain of the first amplifier and the second amplifier on the basis of a monitoring result,
the first amplifier and the second amplifier
are formed of open-loop amplifiers, and
the gain control part takes out amplitude information of the output signals of the first amplifier and the second amplifier in at least one of the AD conversion stages and performs gain control so that amplitude of the analog signals being output from the stage converges on setting amplitude being set.

The present technology contains subject matter related to that disclosed in Japanese Priority Patent Application JP 2011-094210 filed in the Japan Patent Office on Apr. 20, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An analog-digital converter, comprising:
a plurality of cascade-connected analog-digital (AD) conversion stages configured to generate digital data having a value corresponding to a relationship between two analog signals being input and amplify two analog residual signals with a first amplifier and a second amplifier respectively with gain to be controlled to output the signals; and
a gain control part configured to monitor the output signals of the first amplifier and the second amplifier to control gain of the first amplifier and the second amplifier on the basis of a monitoring result, wherein
the first amplifier and the second amplifier
are formed of open-loop amplifiers, and
the gain control part
takes out amplitude information of the output signals of the first amplifier and the second amplifier in at least one of the AD conversion stages and performs gain control so that amplitude of the analog signals being output from the stage converges on setting amplitude being set.

2. The analog-digital converter according to claim 1, wherein
the gain control part
takes out a difference between positive phase signals or reverse phase signals of the output signals of the first amplifier and the second amplifier and compares the difference information with setting amplitude information to perform gain control on the basis of a comparison result.

3. The analog-digital converter according to claim 1, wherein
the gain control part
takes out differential signal components of the output signals of the first amplifier and the second amplifier and compares a sum of differential amplitude being taken out with setting amplitude information to perform gain control on the basis of a comparison result.

4. The analog-digital converter according to claim 1, wherein
the gain control part
takes out a difference between positive phase signals and a difference between reverse phase signals of the output signals of the first amplifier and the second amplifier and compares an average of the difference between positive phase signals and the difference between reverse phase signals with setting amplitude information to perform gain control on the basis of a comparison result.

5. The analog-digital converter according to claim 1, wherein
the gain control part
monitors the output signals of the first amplifier and the second amplifier in all the AD conversion stages to control gain of the first amplifier and the second amplifier in respective output stages on the basis of a monitoring result.

6. The analog-digital converter according to claim 1, wherein
the gain control part
monitors the output signals of the first amplifier and the second amplifier at intervals of a plurality of stages to control gain of the first amplifier and the second amplifier in output stages on the basis of a monitoring result.

7. The analog-digital converter according to claim 1, further comprising:
an analog signal generation stage configured to generate two analog signals and amplify the signals with a third amplifier and a fourth amplifier respectively with gain to be controlled to output the signals to an initial-stage AD conversion stage, wherein
the gain control part
monitors output of the first amplifier and the second amplifier in one of second and subsequent-stage AD conversion stages to control gain of the third amplifier and the fourth amplifier in the analog signal generation stage.

8. The analog-digital converter according to claim 1, wherein
each of the AD conversion stages includes
a signal generation part configured to input a first analog signal having a voltage value corresponding to a difference between a voltage value between two voltages, first reference voltage and second reference voltage, and the second reference voltage, and a second analog signal having a voltage value corresponding to a difference between a voltage value of the first analog signal and difference voltage between the two voltages, the first reference voltage and the second reference voltage, and generate at least one third analog signal having an intermediate voltage value generated from the voltage value of the first analog signal and a voltage value of the second analog signal, to output the first analog signal, the second analog signal, and the third analog signal,
a comparison part configured to input the first analog signal and the second analog signal and compare the voltage value of the first analog signal with the voltage value of the second analog signal to output digital data having a value based on a comparison result,
a first output part that includes the first amplifier and is configured to amplify a first residual signal with predetermined gain to output the signal,
a second output part that includes the second amplifier and is configured to amplify a second residual signal with predetermined gain to output the signal, and
a switch part configured to switch input of the first analog signal, the second analog signal, and the third analog signal being output from the signal generation part to the first output part and the second output part on the basis of a comparison result of the comparison part,
the comparison part
outputs first digital data when a first comparison result is obtained where the voltage value of the first analog signal is lower than the voltage value of the second analog signal, and outputs second digital data when a second comparison result is obtained where the voltage value of the first analog signal is higher than the voltage value of the second analog signal, and the switch part inputs the first analog signal being output from the signal generation part to the first output part as the first residual signal and inputs the third analog signal to the second output part as the second residual signal, when the first comparison result is obtained in the comparison part, and inputs the third analog signal being output from the signal generation part to the first output part as the first residual signal and inputs the second analog signal to the second output part as the second residual signal, when the second comparison result is obtained in the comparison part.

9. The analog-digital converter according to claim 8, wherein each of the plurality of AD conversion stages includes
a first analog signal input terminal configured to input the first analog signal,
a second analog signal input terminal configured to input the second analog signal,
a first analog signal output terminal,
a second analog signal output terminal, and
a digital data output terminal,
the first analog signal input terminal in an AD conversion stage on a subsequent-stage side is connected to the first analog signal output terminal in an AD conversion stage on a preceding-stage side and inputs a first residual signal being output from a preceding stage as the first analog signal,
the second analog signal input terminal in the AD conversion stage on the subsequent-stage side is connected to the second analog signal output terminal in the AD conversion stage on the preceding-stage side and inputs a second residual signal being output from a preceding stage as the second analog signal, and
in a first-stage AD conversion stage
the first analog signal input terminal inputs the first analog signal having a voltage value between the reference voltage and full range voltage, and
the second analog signal input terminal inputs the second analog signal having a voltage value corresponding to a difference between the voltage value of the first analog signal to be input to the first analog signal input terminal and the full range voltage.

10. The analog-digital converter according to claim 8, wherein at least the first-stage AD conversion stage
inputs the first analog signal (0<Vin<Vr) having voltage Vin and the second analog signal having voltage (Vin−Vr) calculated by subtracting full range voltage Vr from voltage Vin of the first analog signal,
compares two analog input voltages |Vin| and |Vin−Vr| to each other by the comparison part, and when the first analog signal voltage is lower than the second analog signal voltage |Vin|<|Vin−Vr| and Vin<Vr/2, outputs digital data 0 from the digital data output terminal and outputs A*Vin and A*(Vin−Vr/2) being increased by A times with amplification ratio A from the first and second analog signal output terminals respectively, and outputs digital data 1 from the digital data output terminal and outputs A*(Vin−Vr/2) and A*(Vin−Vr) being increased by A times with amplification ratio A from the first and second analog signal output terminals respectively, when the first analog signal voltage is higher than the second analog signal voltage |Vin|>|Vin−Vr| and Vin>Vr/2.

11. The analog-digital converter according to claim 8, wherein two of the AD conversion stages are cascade-connected to each other, and
the first-stage AD conversion stage
inputs the first analog signal (0<Vin<Vr) having voltage Vin and the second analog signal having voltage (Vin−Vr) calculated by subtracting full range voltage Vr from voltage Vin of the first analog signal,
each of the AD conversion stages
outputs digital data 00 from two of the digital data output terminals in the case of Vin<Vr/4,
outputs digital data Φ1 from two of the digital data output terminals in the case of Vr/4<Vin<Vr/2,
outputs digital data 10 from two of the digital data output terminals in the case of Vr/2<Vin<3Vr/4, and
outputs digital data 11 from two of the digital data output terminals in the case of 3Vr/4<Vin<Vr, and
from the first and second analog signal output terminals on the basis of a comparison result in the comparison part, the second-stage AD conversion stage
amplifies residual signals A*Vin and A*(Vin−Vr/4) by A times to output the signals, or
amplifies residual signals A*(Vin−Vr/4) and A*(Vin−Vr/2) by A times to output the signals, or
amplifies residual signals A*(Vin−Vr/2) and A*(Vin−3Vr/4) by A times to output the signals, or
amplifies residual signals A*(Vin−3Vr/4) and A*(Vin−Vr) by A times to output the signals.

12. The analog-digital converter according to claim 8, further comprising:

a final-stage comparison part configured to input residual signals being output from the first analog signal output terminal and the second analog signal output terminal in a final-stage AD conversion stage as the first analog signal and the second analog signal, wherein
the final-stage comparison part
inputs the first analog signal and the second analog signal and compares the voltage value of the first analog signal with the voltage value of the second analog signal to output digital data having a value corresponding to a comparison result.

13. The analog-digital converter according to claim 8, wherein the plurality of AD conversion stages
control respective timing of sampling of two analog input signals, comparison, and analog signal output, and digital data output, by synchronizing with a clock signal, and
perform processing of sampling of two analog input signals, comparison, and analog signal output and digital data output, by synchronizing with a clock signal in a pipeline system, with provision of a clock signal to be input in an adjacent AD conversion stage on a reverse phase.

14. The analog-digital converter according to claim 8, wherein
the signal generation part includes at least each one of
a first capacitor having one end connected to an input line for the first analog signal and the other end connected to a first output node to output the first analog signal,
a second capacitor having one end connected to an input line for the second analog signal and the other end connected to a second output node to output the second analog signal,
a third capacitor having one end connected to an input line for the first analog signal and the other end connected to a third output node to output the third analog signal,
a fourth capacitor having one end connected to an input line for the second analog signal and the other end connected to the third output node to output the third analog signal,
a first switch connected between the first output node and fixed potential,
a second switch connected between the second output node and fixed potential, and
a third switch connected between the third output node and fixed potential,
the first capacitor
samples an input signal with the first switch being in a conductive state and outputs sampled voltage from the first output node in a non-conductive state,
the second capacitor
samples an input signal with the second switch being in a conductive state and outputs sampled voltage from the second output node in a non-conductive state, and
the third capacitor and the fourth capacitor
sample an input signal with the third switch being in a conductive state and outputs respective sampled voltages in a non-conductive state so that the respective voltages are synthesized to be output from the third output node.

15. The analog-digital converter according to claim 8, wherein
the comparison part includes at least each one of
a comparator configured to compare input voltage with the reference voltage,
a fifth capacitor having one end connected to an input line for the first analog signal and the other end connected to an input node of the comparator,
a sixth capacitor having one end connected to an input line for the second analog signal and the other end connected to the input node of the comparator, and
a fourth switch connected between the input node of the comparator and fixed potential, and
the fifth capacitor and the sixth capacitor
sample an input signal with the fourth switch being in a conductive state and output respective sampled voltages in a non-conductive state so that the respective voltages are synthesized to be input to the comparator.

16. The analog-digital converter according to claim 8, wherein
the switch part includes at least each of
a fifth switch connected between the first output node of the signal generation part and a first input node configured to input the first residual signal to the first output part,
a sixth switch connected between the second output node of the signal generation part and a second input node configured to input the second residual signal to the second output part,
a seventh switch connected between the third output node of the signal generation part and the first input node configured to input the first residual signal to the first output part, and
an eighth switch connected between the third output node of the signal generation part and the second input node configured to input the second residual signal to the second output part,
when the first comparison result is obtained in the comparison part, the fifth switch and the eighth switch are held in a conductive state and the sixth switch and the seventh switch are held in a non-conductive state, and
when the second comparison result is obtained in the comparison part, the fifth switch and the eighth switch are held in a non-conductive state and the sixth switch and the seventh switch are held in a conductive state.

17. The analog-digital converter according to claim 8, wherein
the first output part includes
a ninth switch connected between the first input node and fixed potential, and
a first amplifier configured to amplify a first residual signal to be input to the first input node with predetermined amplification ratio, and
the second output part includes
a tenth switch connected between the second input node and fixed potential, and
a second amplifier configured to amplify a second residual signal to be input to the second input node with predetermined amplification ratio.

18. A signal processing system, comprising:
an analog-digital (AD) converter configured to convert analog signals from an analog signal processing system into digital signals, wherein
the AD converter includes
a plurality of cascade-connected analog-digital (AD) conversion stages configured to generate digital data having a value corresponding to a relationship between two analog signals being input and amplify two analog residual signals with a first amplifier and a second amplifier respectively with gain to be controlled to output the signals, and
a gain control part configured to monitor the output signals of the first amplifier and the second amplifier to control gain of the first amplifier and the second amplifier on the basis of a monitoring result,
the first amplifier and the second amplifier
are formed of open-loop amplifiers, and
the gain control part
takes out amplitude information of the output signals of the first amplifier and the second amplifier in at least one of the AD conversion stages and performs gain control so that amplitude of the analog signals being output from the stage converges on setting amplitude being set.

* * * * *